United States Patent
Goodman (12)

(10) Patent No.: US 6,243,315 B1
(45) Date of Patent: Jun. 5, 2001

(54) COMPUTER MEMORY SYSTEM WITH A LOW POWER DOWN MODE

(76) Inventor: James B. Goodman, 4750 Pear Ridge Dr., Apt 9301, Dallas, TX (US) 75287

( * ) Notice: Subject to any disclaimer, the term of this patent is extended or adjusted under 35 U.S.C. 154(b) by 0 days.

(21) Appl. No.: 09/477,920

(22) Filed: Dec. 31, 1999

(51) Int. Cl.[7] .................................................. G11C 7/00
(52) U.S. Cl. .................... 365/222; 365/230.03; 365/229; 365/52
(58) Field of Search ............................... 365/222, 51, 63, 365/52, 230.03, 229

(56) References Cited

U.S. PATENT DOCUMENTS

| | | |
|---|---|---|
| 4,656,605 | 4/1987 | Clayton . |
| 4,710,903 * | 12/1987 | Hereth et al. ........................ 365/222 |
| 4,901,283 | 2/1990 | Hanbury . |
| 5,089,993 | 2/1992 | Neal . |
| 5,222,044 | 6/1993 | Tsujimoto . |
| 5,262,998 | 11/1993 | Mnich . |
| 5,784,628 | 7/1998 | Reneris . |
| 5,798,961 | 8/1998 | Heyden . |
| 5,818,299 | 10/1998 | Tran . |
| 5,920,885 | 7/1999 | Rao . |

\* cited by examiner

*Primary Examiner*—Huan Hoang
(74) *Attorney, Agent, or Firm*—David Fink

(57) ABSTRACT

A memory system for use in a computer system, includes a plurality of volatile solid state memory devices that retain information when an electrical power source is applied to the memory devices within a predetermined voltage range, and are capable of being placed in a self refresh mode. The memory devices have respective address and control lines, and a control device for selectively electrically isolating the memory devices from respective address lines and respective control lines so that when the memory devices are electrically isolated, any signals received on the respective address lines and respective control lines do not reach the memory devices. The memory system includes a memory access enable control device coupled to the control device and to the control lines for determining when the memory system is not being accessed, and for initiating a low power mode for the memory system wherein the control device electrically isolates the memory devices and places the memory devices in the self refresh mode.

20 Claims, 59 Drawing Sheets

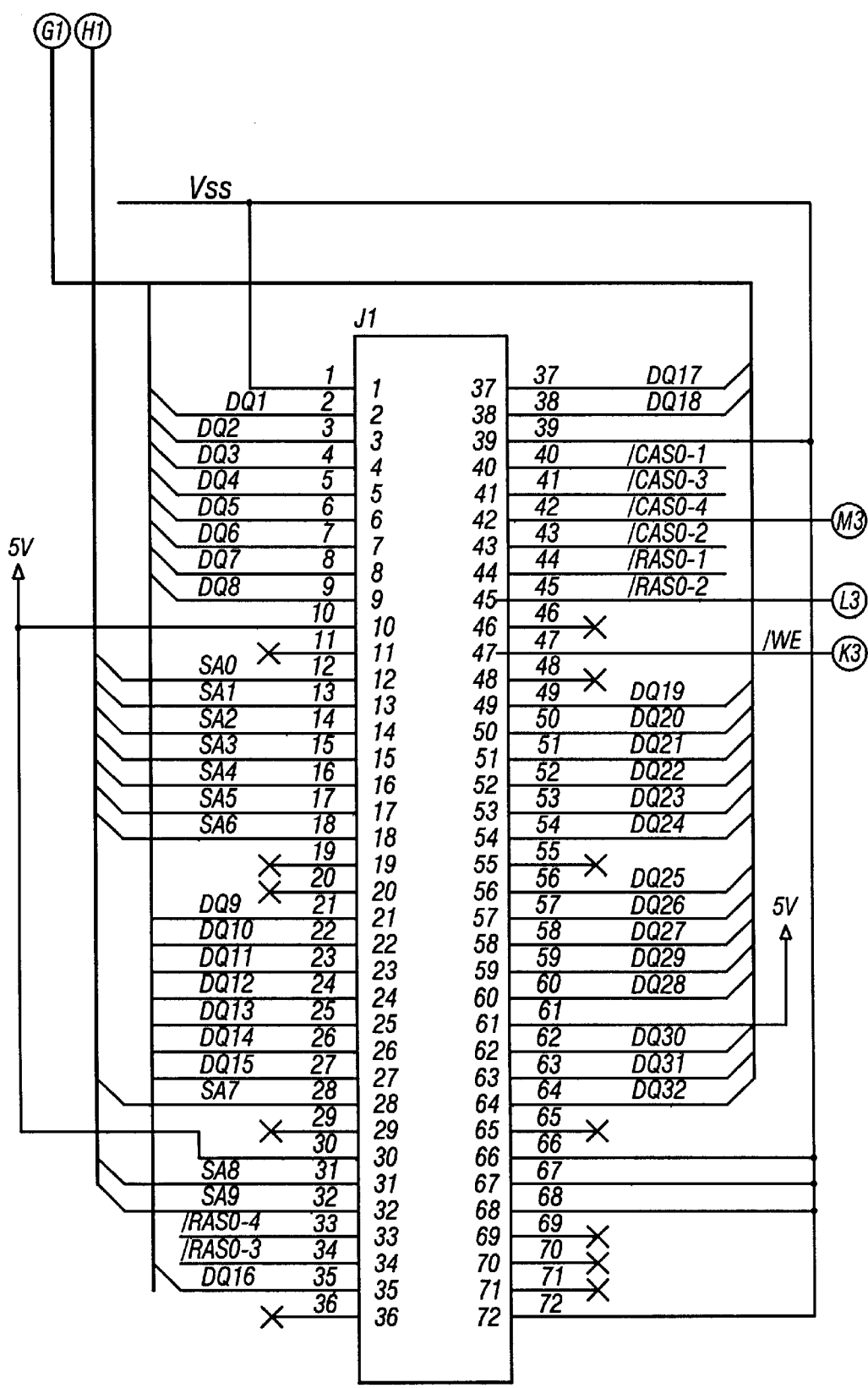
FIG. 5L    CONNECTOR SIMM72

COMPUTER MEMORY SYSTEM WITH A LOW POWER DOWN MODE

STATEMENT RELATED TO GOVERNMENT FUNDED RESEARCH AND DEVELOPMENT

Not Applicable

BACKGROUND

1. Field of the Invention

This invention relates to a computer system including a central processing unit (CPU) memory system to retain data and to conserve electrical power by utilizing volatile solid state memory devices, such as DRAM (Dynamic Random Access Memory) semiconductor memory chips capable of retaining data, in a low power, self refresh mode whenever the memory system is not being accessed by the CPU.

In addition, the invention relates to a CPU and a memory system wherein the retention of data within a volatile solid state memory device is maintained in a self refresh mode by an internal power supply during times when an external power supply voltage falls below a predetermined level.

2. Prior Art

Current computer systems consume relatively large amounts of electrical energy to power the components comprising the computer system, thereby making demands on batteries used in portable computer systems. Sources of this energy consumption are the microprocessor computer chip, the volatile memory modules that retain information as long as a voltage is applied to them, and usually a hard disk drive and CD-ROM drive. The increase in computer chip speeds and increase memory module sizes each also increase demand for electrical energy. Hard disk drives and CD drives which continuously spin whenever the computer system is "powered on" are a substantial and constant source of battery energy. Successive generations of portable, laptop or notebook computers contain computer chips which perform at higher operating speeds, or contain more memory, or larger hard disk drive capacity. Each of these additions to the computer system increases the demand on the electrical power source and shorten the use of battery operation.

The batteries contain a limited amount of electrical energy to supply the electrical demands of the portable, laptop or notebook computer system. Larger batteries contain the capacity to provide electrical energy for a longer time than smaller batteries. However, as battery size increases to compensate for the increased electrical demands the weight of the portable, laptop or notebook computer also increases. Computer designers must continually trade off electrical power capacity against overall computer system weight.

Power Management methods and tools are designed in current portable, laptop and notebook computers to conserve battery power. Such methods and tools include, operating the computer chips on lower voltage than the standard 5 volt logic (operation on a reduced voltage also reduces the heat generated in portable, laptop or notebook computer systems), placing the computer chip in suspended or deep sleep mode when the computer chip detects no activity for a predetermined period of time, and powering down the hard disk drive after a user defined time period.

These methods and tools, while increasing battery life also have disadvantages. The methods and tools are essentially time based. Under such a time based system access to the peripheral devices, such as hard disk drives, could be denied as the peripheral device could itself be in a power down, or power savings mode. Further, setting the disk drive power down time period to too small a value can actually decrease battery life as the need to access the disk drive requires the disk drive be returned to a fully spinning condition. This return to a fully spinning condition can sometimes require more power than would be required to maintain the disk drive in the full spin operational mode.

Computer systems contain different forms of semiconductor memory used to store programs and data. The most common of these memories are Programmable Read-Only Memory (PROM), EPROM (Erasable PROM), EEPROM (Electrically Erasable PROM), FLASH and volatile solid state memory devices which maintain information only when a predetermined voltage is applied to them typically used for Random Access Memory (RAM). PROM memory is a memory where the contents, stored as a series of logical highs and lows(1 and 0) are permanently stored and unchangeable. When power is removed from the computer system, PROM memory retain the series of logical highs and lows stored within it. Similarly, EPROMs and EEPROMs, permanently retain the data stored with their memory, but have the capability to erase the logical highs and lows and replace the memory contents with new and different data patterns. Typically the EPROMs use Ultra-violet light as an eraser means, and EEPROMs uses electrical means as the eraser.

FLASH memory is similar to EEPROM memory. In each of these memory types, the storage of the data or programs in these memories is permanent, whether power is applied to the computer system or not. Such memory is referred to as non-volatile memory. As an example, Computer BIOS (Basic Input/Output Sequence) programs are stored in some form of PROM; where the older computer systems had BIOS program stored in EPROM, more current computer systems retain the BIOS in FLASH to allow for reprogrammability. When power is applied, the program stored in the BIOS begins the sequence to load the full operational program (such as Windows 3.11 or Windows95/NT) into the computer memory. PROM memory is used when size and power consumption are not critical factors, the program instructions do not change often and the program instructions are required to remain independent of the input power state.

Unlike PROM, Random Access Memory, for example DRAM or any solid state volatile memory device that maintains information when a voltage is applied to it, is used in a computer system when the program instruction changes often and the need for data retention is generally for a short period of time. Application programs, such as WORDPERFECT (TRADEMARK), Microsoft Word (TRADEMARK), and Lotus 123 (TRADEMARK) are programs loaded into computer RAM when they are to be executed and remain in RAM through the period of execution. Examples commonly used RAM memory include devices Static (SRAM) and Dynamic (DRAM). Both SRAM and DRAM retain the contents of their memory states when electrical power is provided and maintained on the devices. Whenever electrical power is removed from the devices, the memory contents of the device is lost and irretrievable. Memory systems that lose their data when electrical power is removed are called "volatile memories" in the art. When electrical power is intentionally removed, such as in an orderly shutdown of the computer system, there is no intent to retain RAM contents. But when the electrical power is unintentionally and unexpectedly removed, such as in cases of power outages, the lose of the contents of the RAM could be devastating.

To protect the contents of the RAM memory under such unexpected conditions, it has become a common practice to use an external Uninterrupted Power Supply(UPS) to maintain electrical power to the computer system during the such unexpected power outages. The UPS is positioned between the source of the input electrical power and the computer system. The UPS provides sufficient power to enable a user to save the contents of a program in operation and complete the current application program. When main electrical power is restored, the user can restart the application program and begin program operation again. Without the protection of UPS, the data entered and application program in RAM would be irretrievably lost.

One embodiment of the present invention is a memory system including solid state volatile memory devices capable of maintaining information when a voltage is applied to the devices, for example DRAM or the like. The invention prevents the loss of data due to unexpected power outages and also prevents errant control and address signals to the memory devices by monitoring the input electrical power source to the memory devices for acceptable conditions, and electrically isolating the memory devices from signals received on the control lines and address lines and switching to an alternate internal electrical power source, typically a battery, whenever the input power source is unacceptable.

The memory system maintains the integrity of the data retained by the memory devices by isolating the devices from the external power source, control lines and address lines and placing the memory devices into a power down self-refresh mode which will maintain the data using a minimum of electrical power.

The prior art U.S. Pat. No. 5,798,961 discloses a SIMM non-volatile memory module having a volatile memory array, a battery circuit, a charging circuit and a control circuit. The control circuit in connection with the battery circuit monitors the external power supply from the SIMM_ VCC line. If the external power source falls below a predetermined voltage then the battery circuit maintains the integrity of the data by supplying power to the volatile memory array. The data retained by the memory module is susceptible to errant control signals and address signals that may appear on the control and address lines during times of unstable power in the system.

SUMMARY OF THE INVENTION

In accordance with the present invention, a memory system for use in a computer system including a solid state volatile memory device that is capable of retaining information when a voltage is applied to it and capable of being placed in a self refresh mode is placed in a low power standby mode when the memory system is not receiving requests for access. The low power mode utilizes significantly less electrical current than when the memory device is in the operating mode or powered up mode. According to the present invention a control device is interposed electrically between the memory devices and a CPU. The control device senses CPU accesses of the memory devices and conditions the memory devices to an operating mode condition prior to the allowing access to the information contained therein. Whenever the control device senses the termination of a memory cycle, the control device places the solid state memory devices in a low power standby mode.

The present invention further provides for reducing the overall electrical power requirement of portable, laptop or notebook computers by utilizing another embodiment of memory system in a hard disk emulation mode, thereby removing the need to maintain electrical power to the hard disk drive of the computer system during those periods when the hard disk is not needed for computer program operation. Such reduced electrical power usage substantially increases the effective time the battery for the computer system can provide electrical power to maintain operations. By using a hard disk simulation for memory accesses instead of accessing the hard drive for the portable or laptop computer, significant savings in electrical power are achieved and it is possible to use smaller main batteries to reduce the over weight of the computer.

In yet another embodiment according to the invention, a memory system for use in a computer system the memory system comprising a plurality of volatile solid state memory devices that retain information when an electrical power source is applied to the memory devices within a predetermined voltage range. The memory devices having address lines and control lines and a control device for monitoring an electrical power source to determine when the electrical voltage reaches a predetermined threshold and for selectively electrically isolating the memory devices from respective address lines and respective control lines so that when the memory devices are electrically isolated, any signals received on said respective address lines and respective control lines do not reach the memory devices.

BRIEF DESCRIPTIONS OF THE FIGURES

In order that the present invention may be more clearly understood, embodiments of the invention will now be described in more detail by way of example only with reference to the accompanying drawings in which:

FIGS. 5A,B,C,D can be assembled to form a single large circuit diagram by aligning A1 with A2, B1 with B2, C1 with C2, and D1 with D2.

FIGS. 6A-1 to 6A-11 are a schematic drawn to current industry standards and practices of another embodiment of a 32 MB low power down 144 PIN SIMM according to the invention.

FIGS. 6B-1 to 6B-5 are a schematic drawn to current industry standards and practices of the programming logic of one component used in the embodiment shown in FIG. 6a.

Figures 1, 6A:
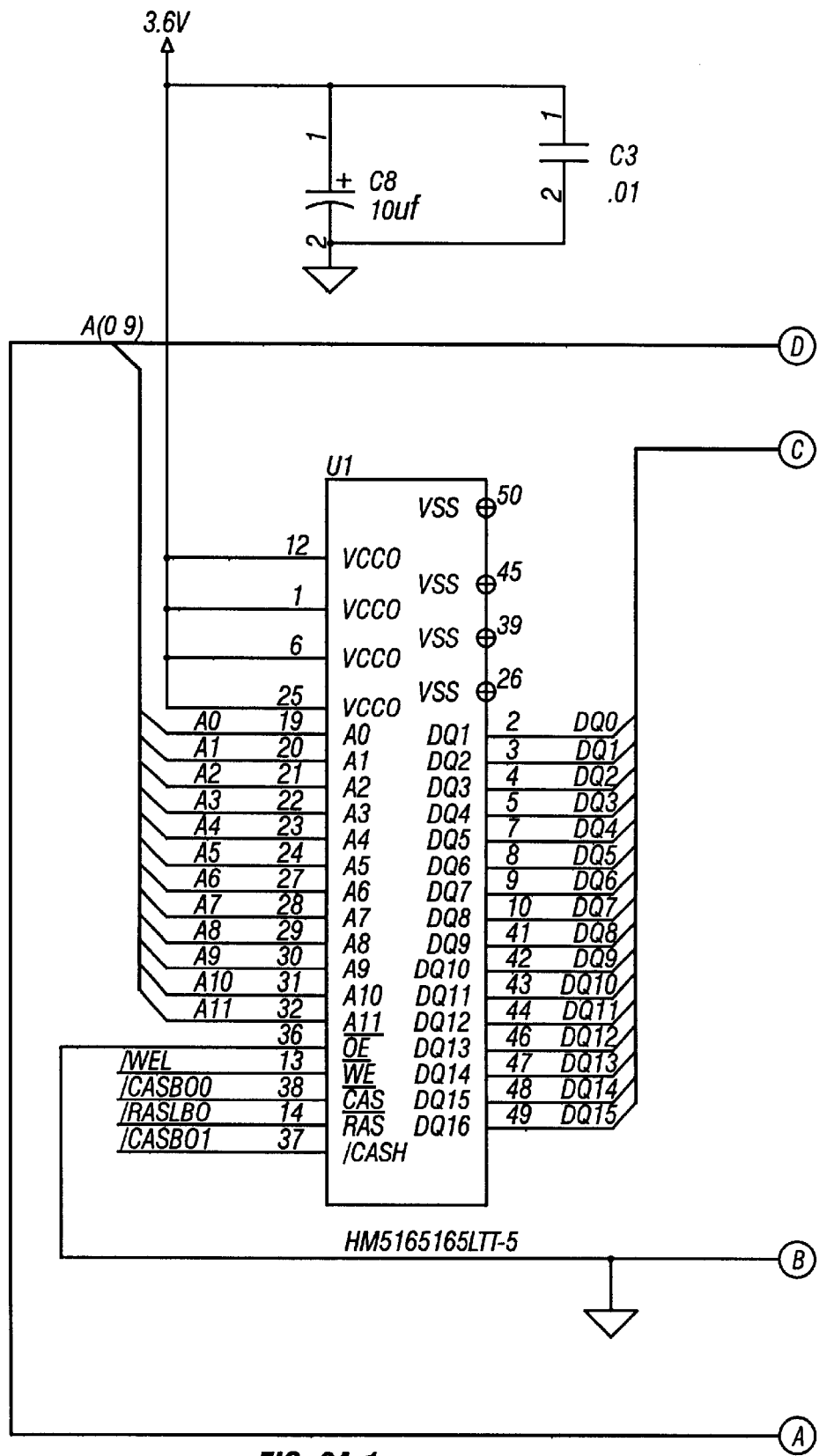
Figures 2, 6A:
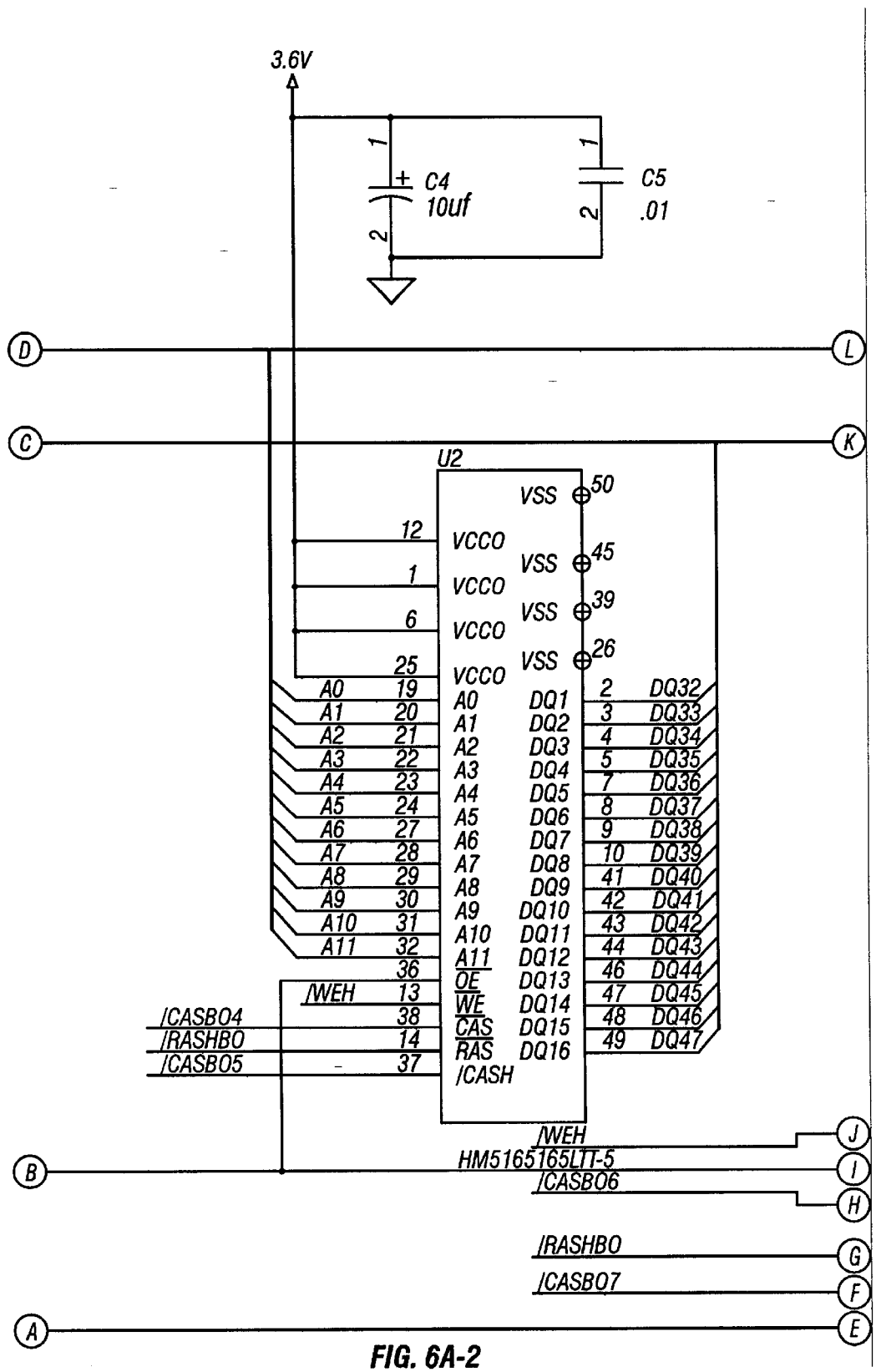
Figures 3, 6A:
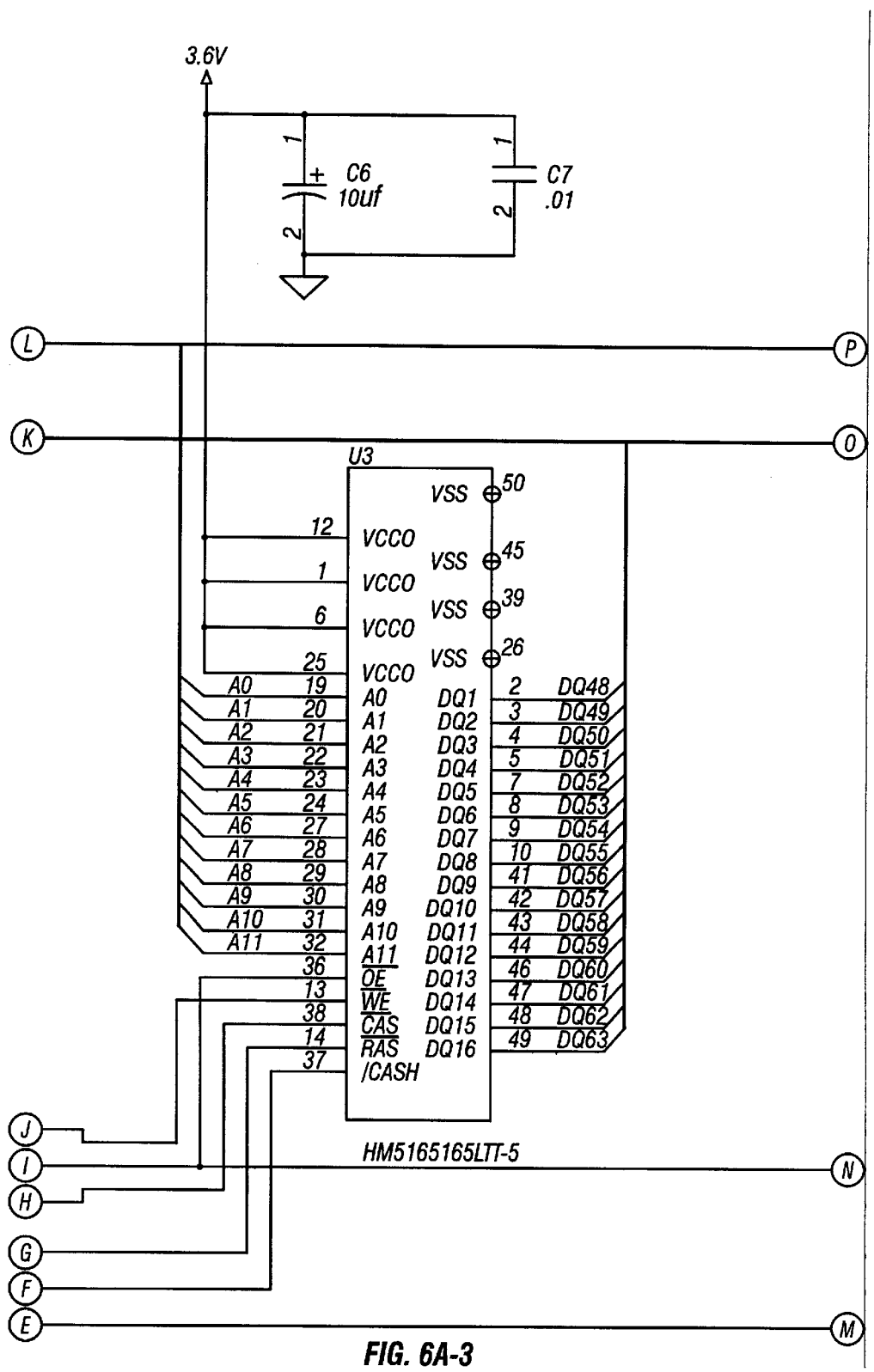
Figures 4, 6A:
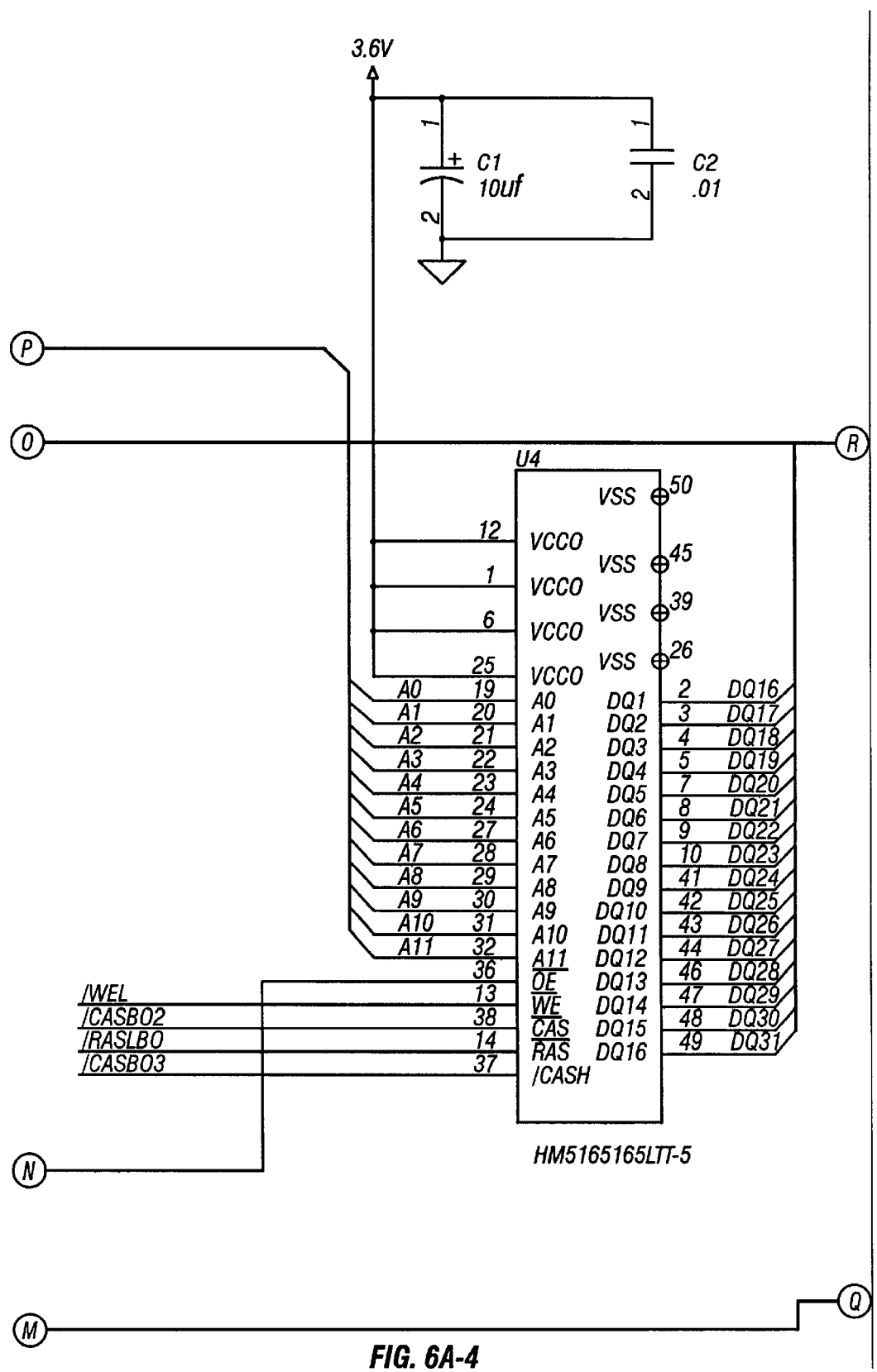
Figure 7A:
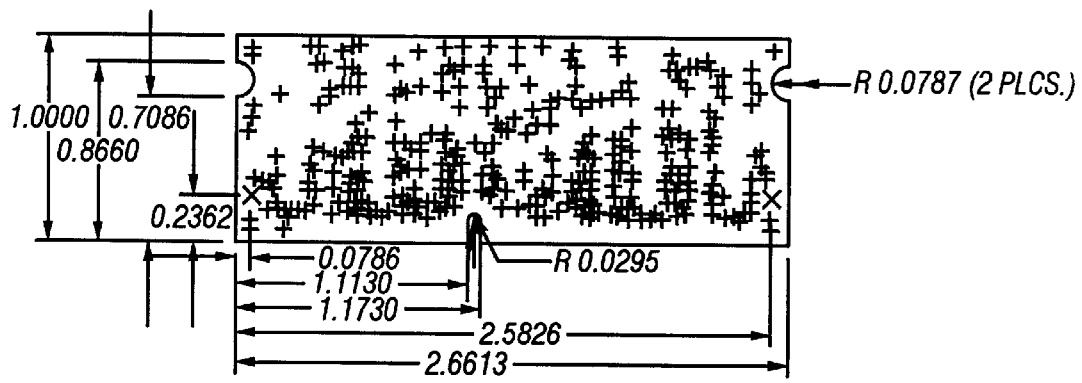

FIGS. 7A,B,C,D,E,F,,H,I,J,K,L,M,N,O,P,Q are the different layers of the artwork for reproducing the PCB of the schematic shown in FIG. 3.

DETAILED DESCRIPTION OF PREFERRED EMBODIMENTS

As used herein in the context of solid state memory devices the term "volatile" describes a state wherein the memory device retains information while an electrical power source, having a predetermined voltage range, is applied to the memory device. When the voltage reaches a predetermined threshold outside of that range, the memory device will no longer retain its current state of information.

Figures 5, 6A:
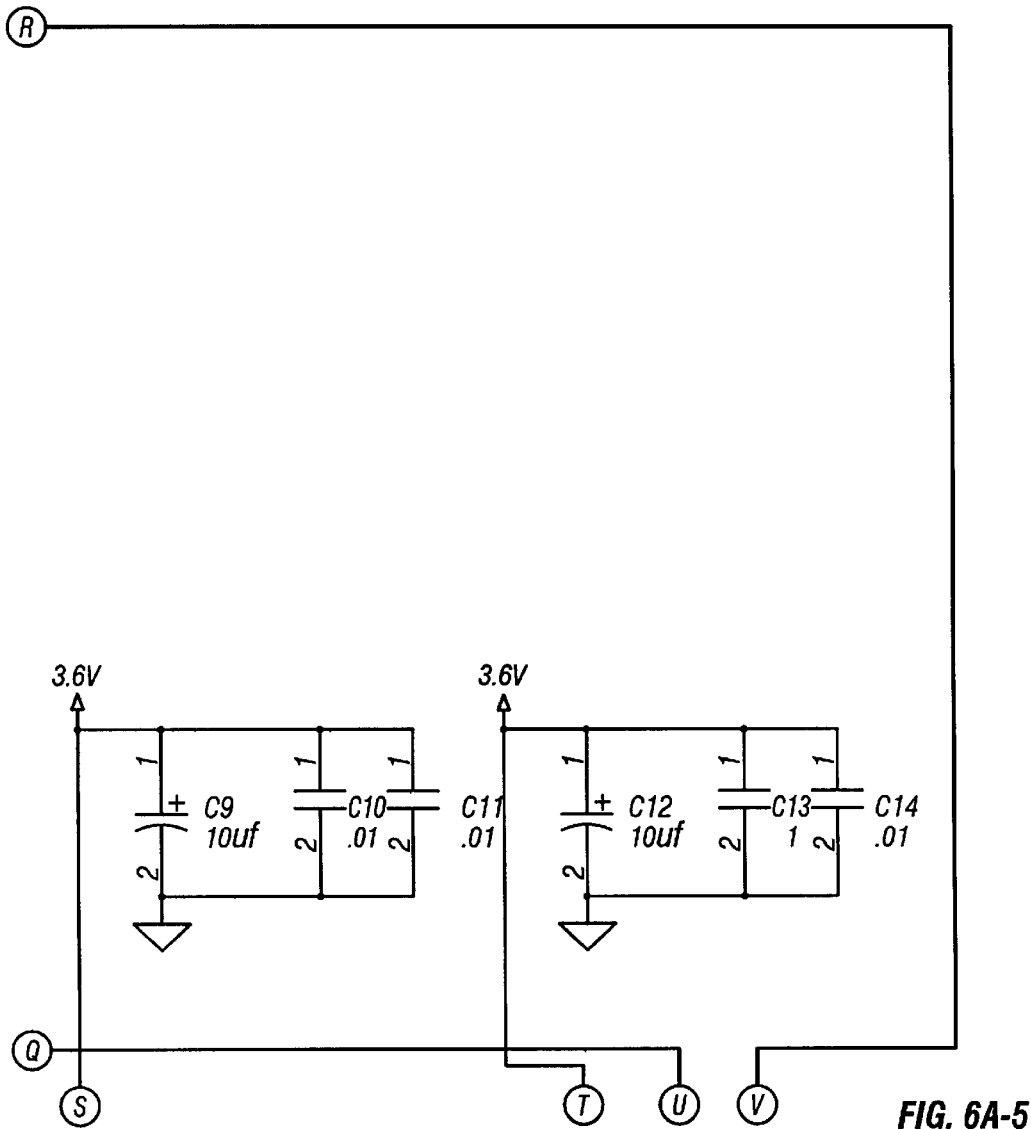
Figures 6, 6A:
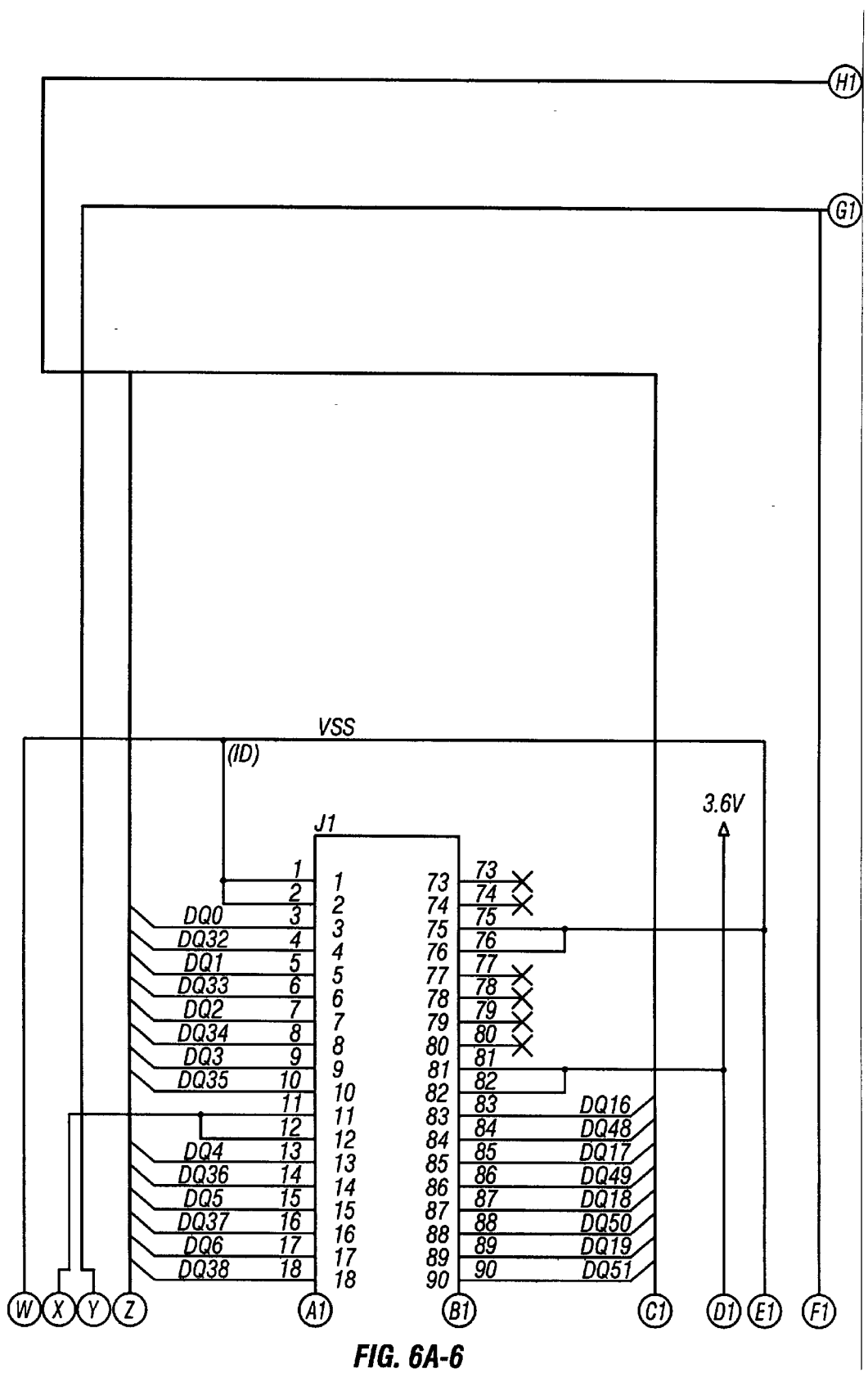
Figures 6, 6A, 7:
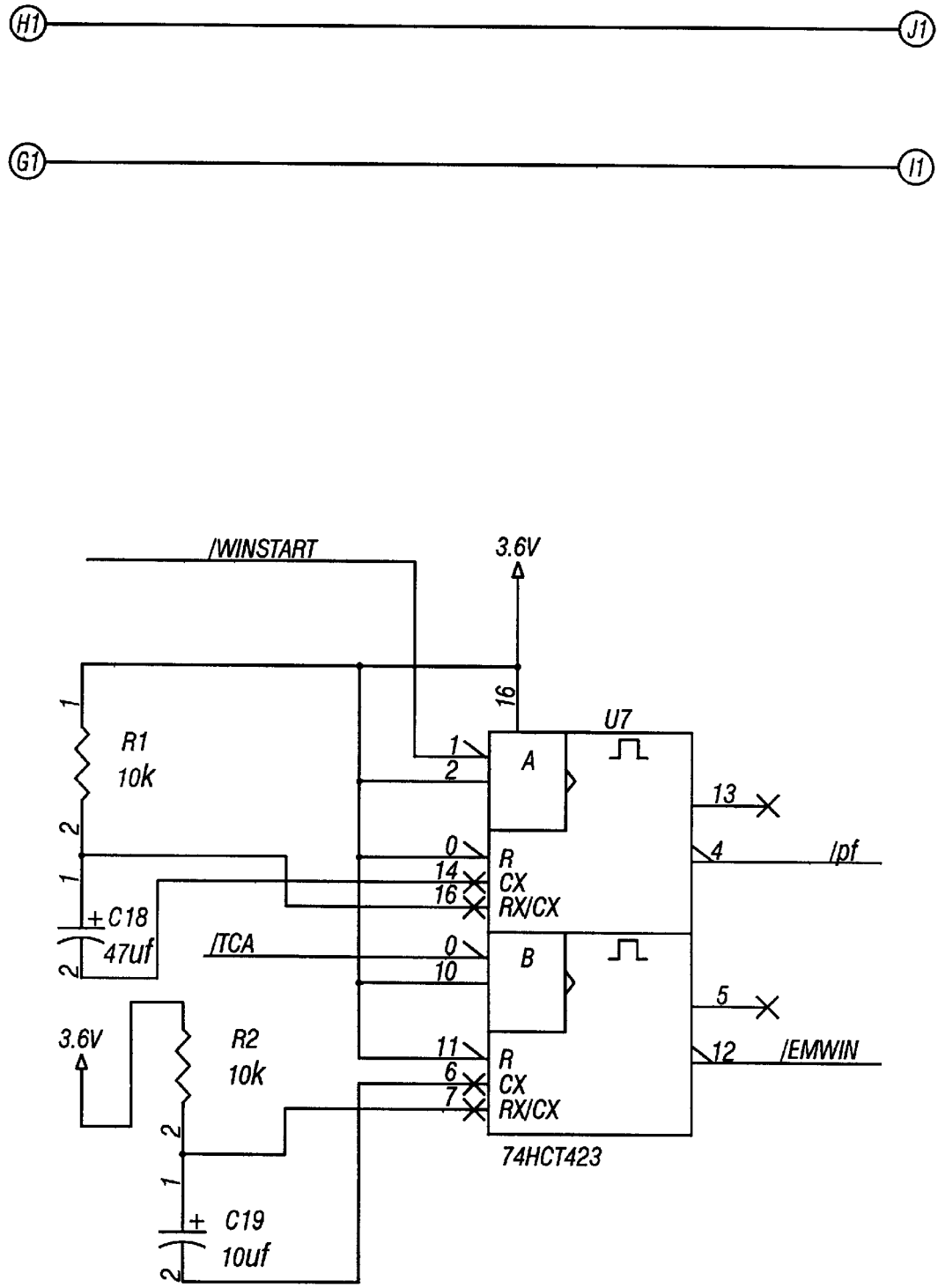
Figures 6, 6A, 7, 8:
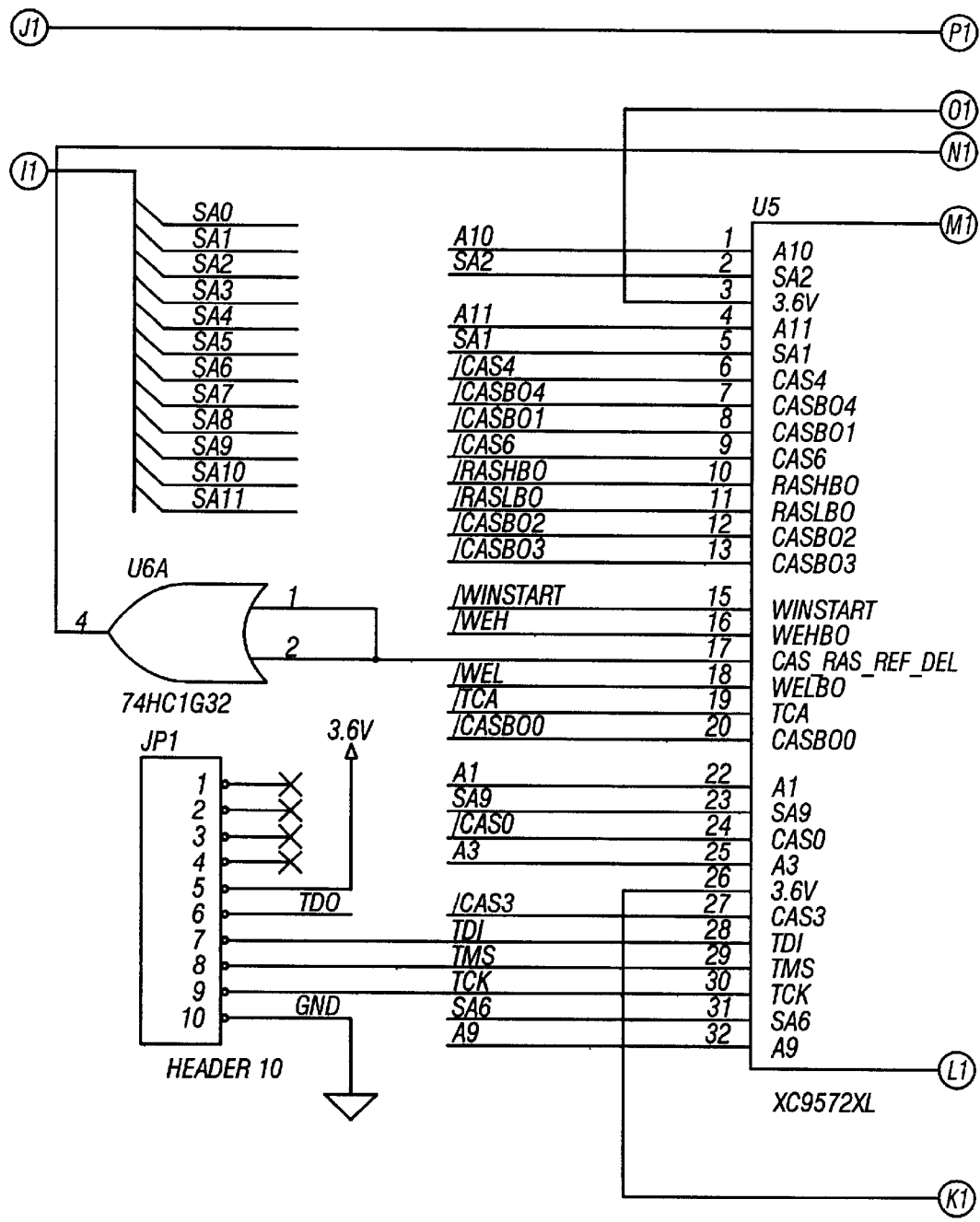
Figures 6, 6A, 7, 8, 9:
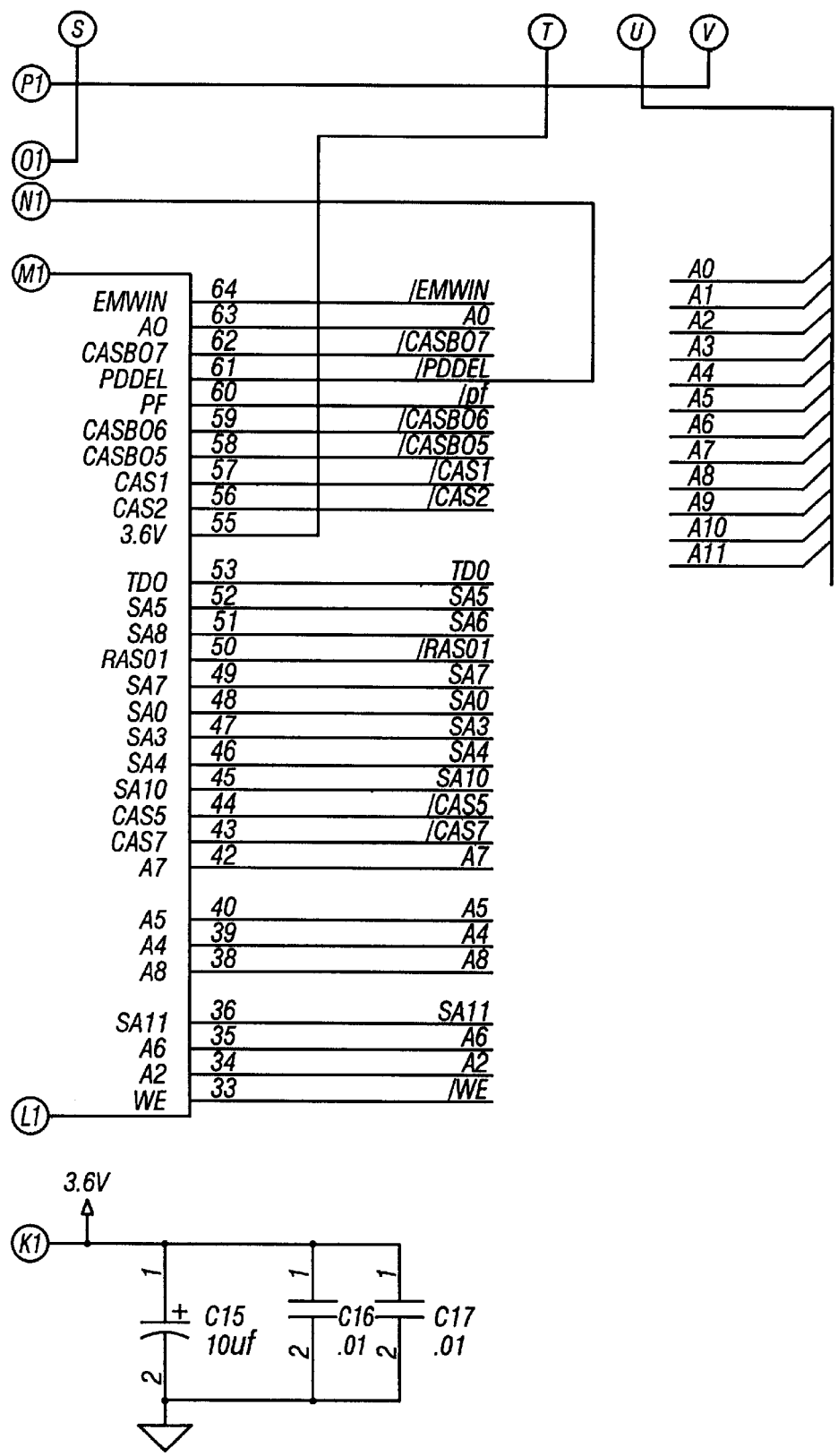
Figures 6, 6A, 7, 8, 9, 10:
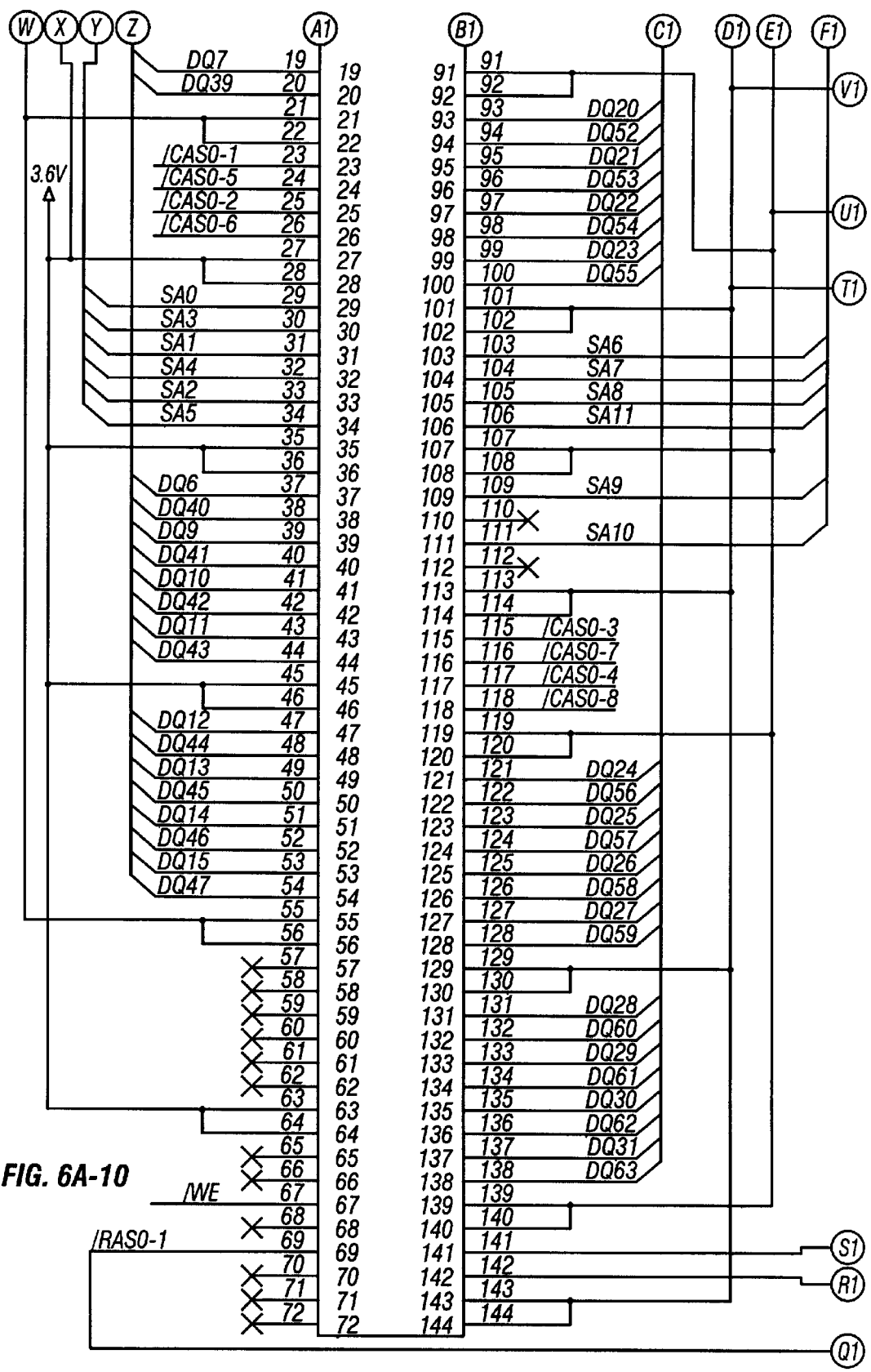
Figures 6, 6A, 7, 8, 9, 10, 11:
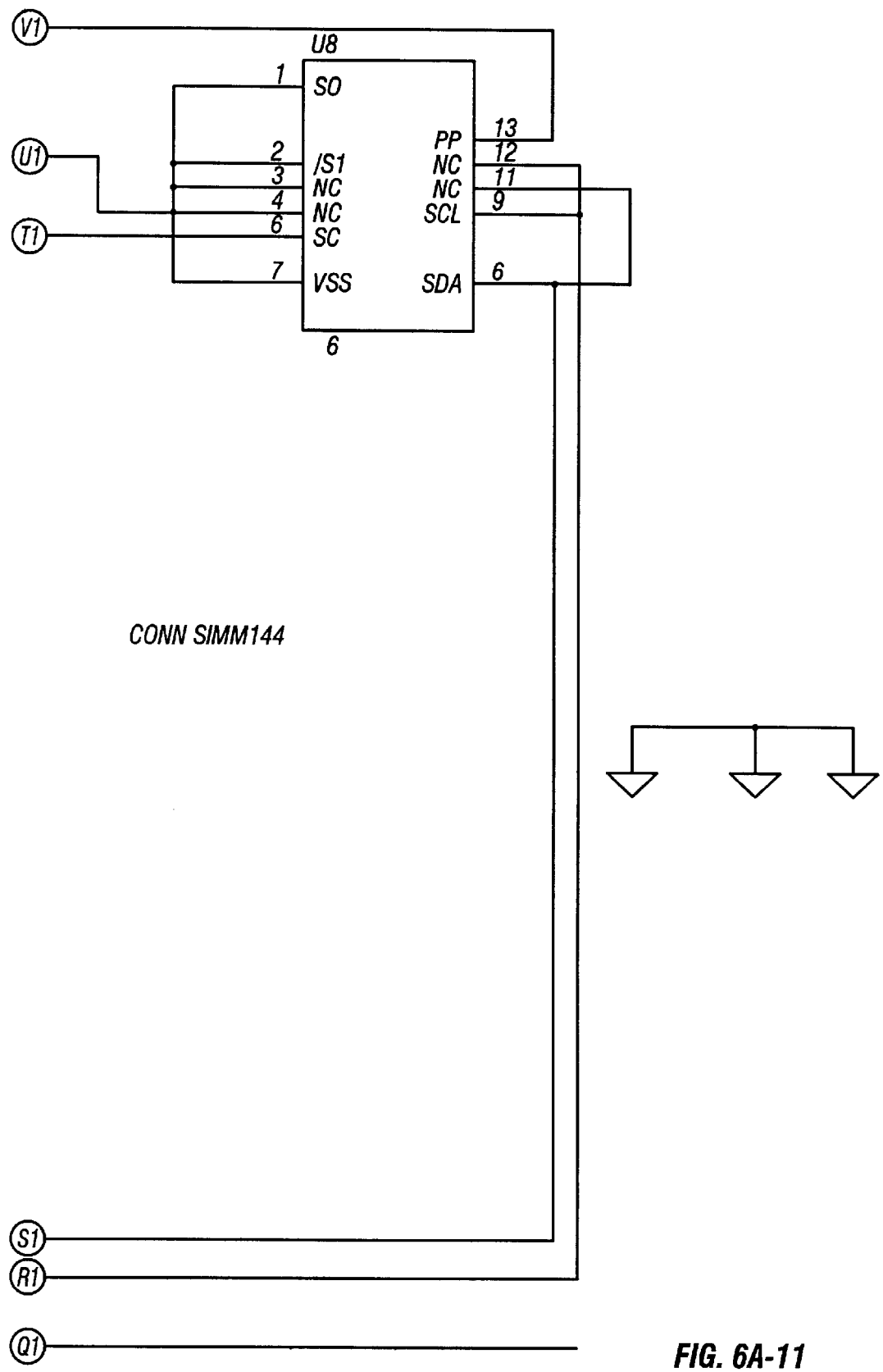
Figures 1, 6B:
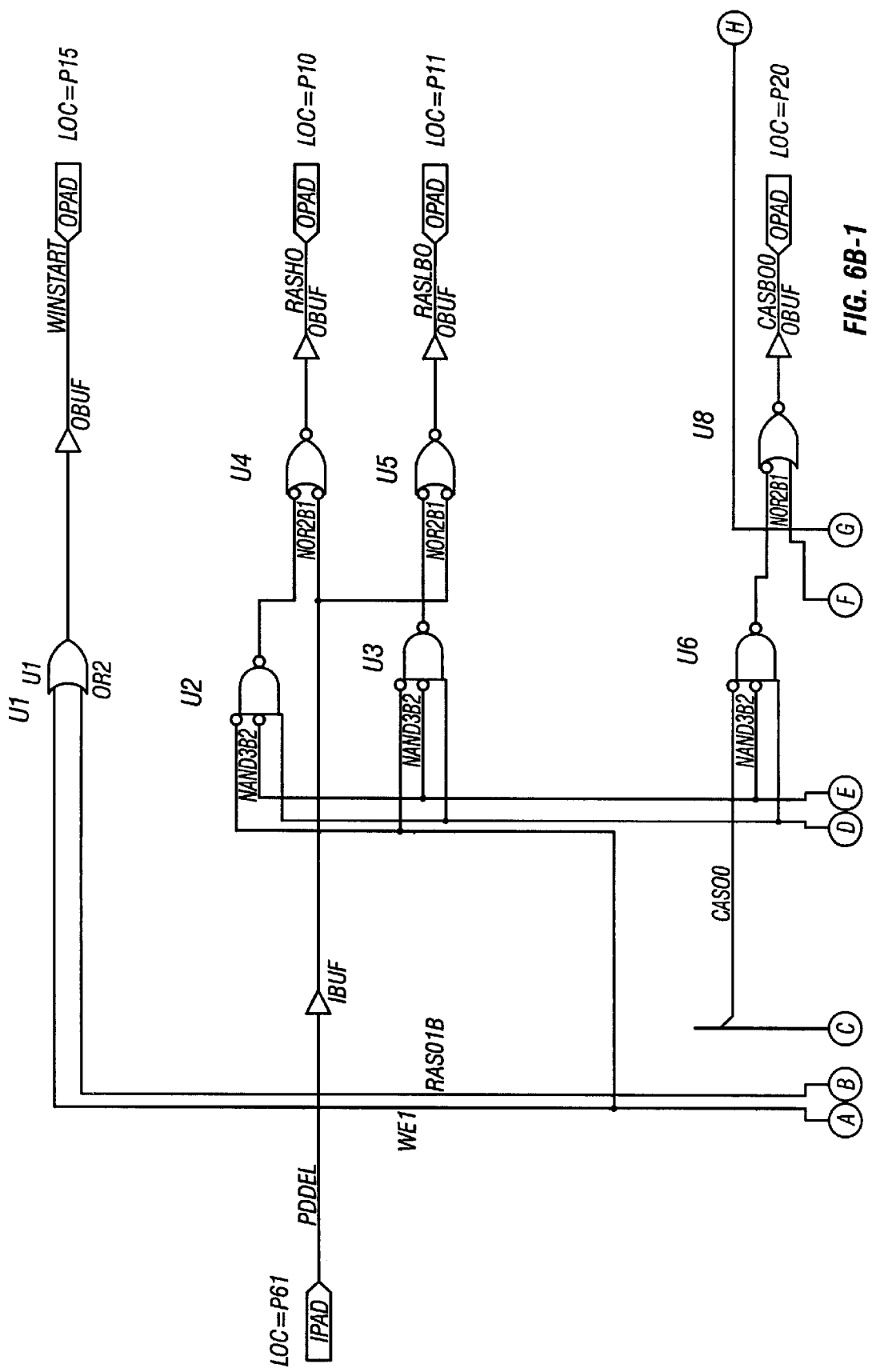
Figures 2, 6B:
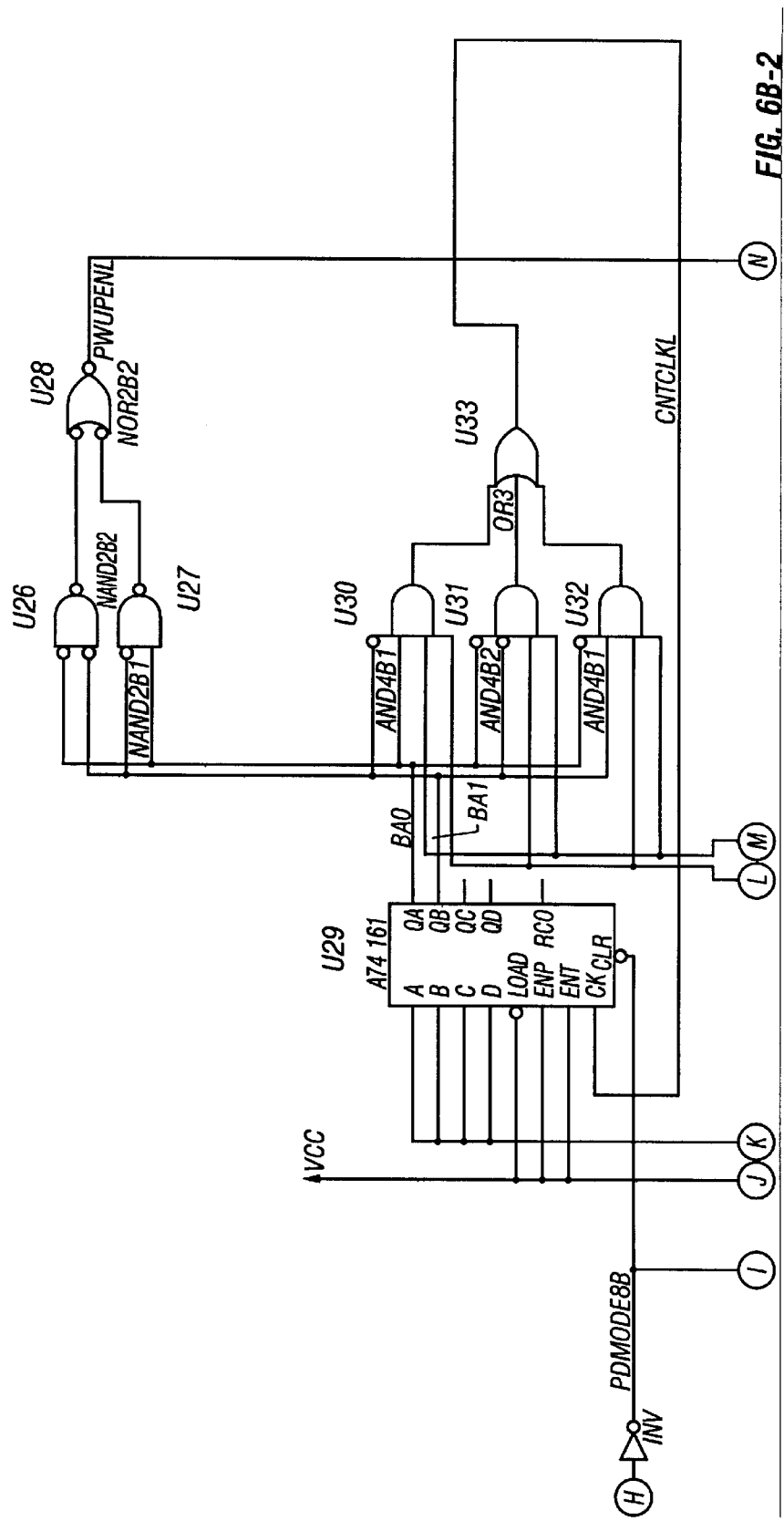
Figures 3, 6B:
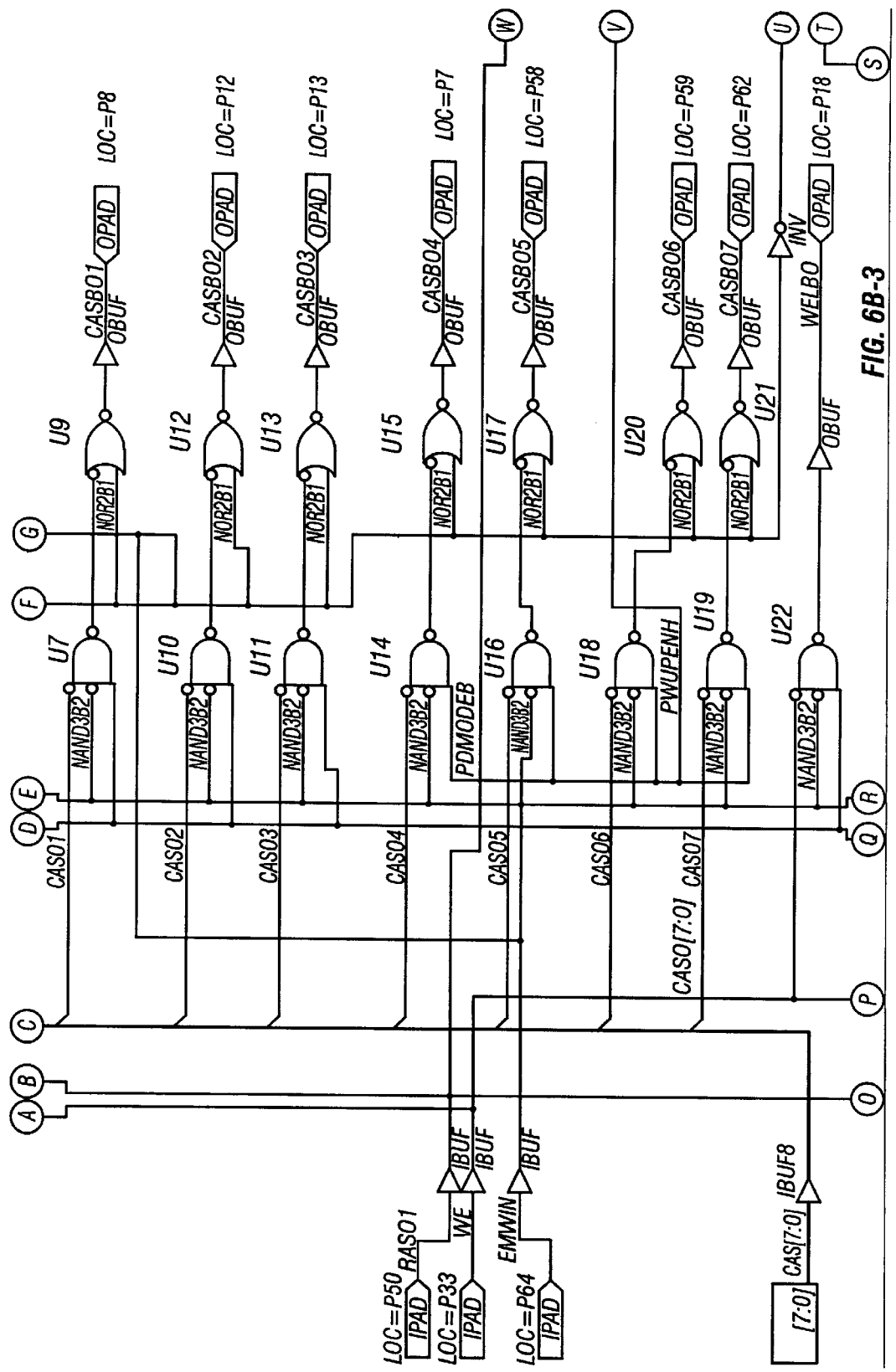
Figures 4, 6B:
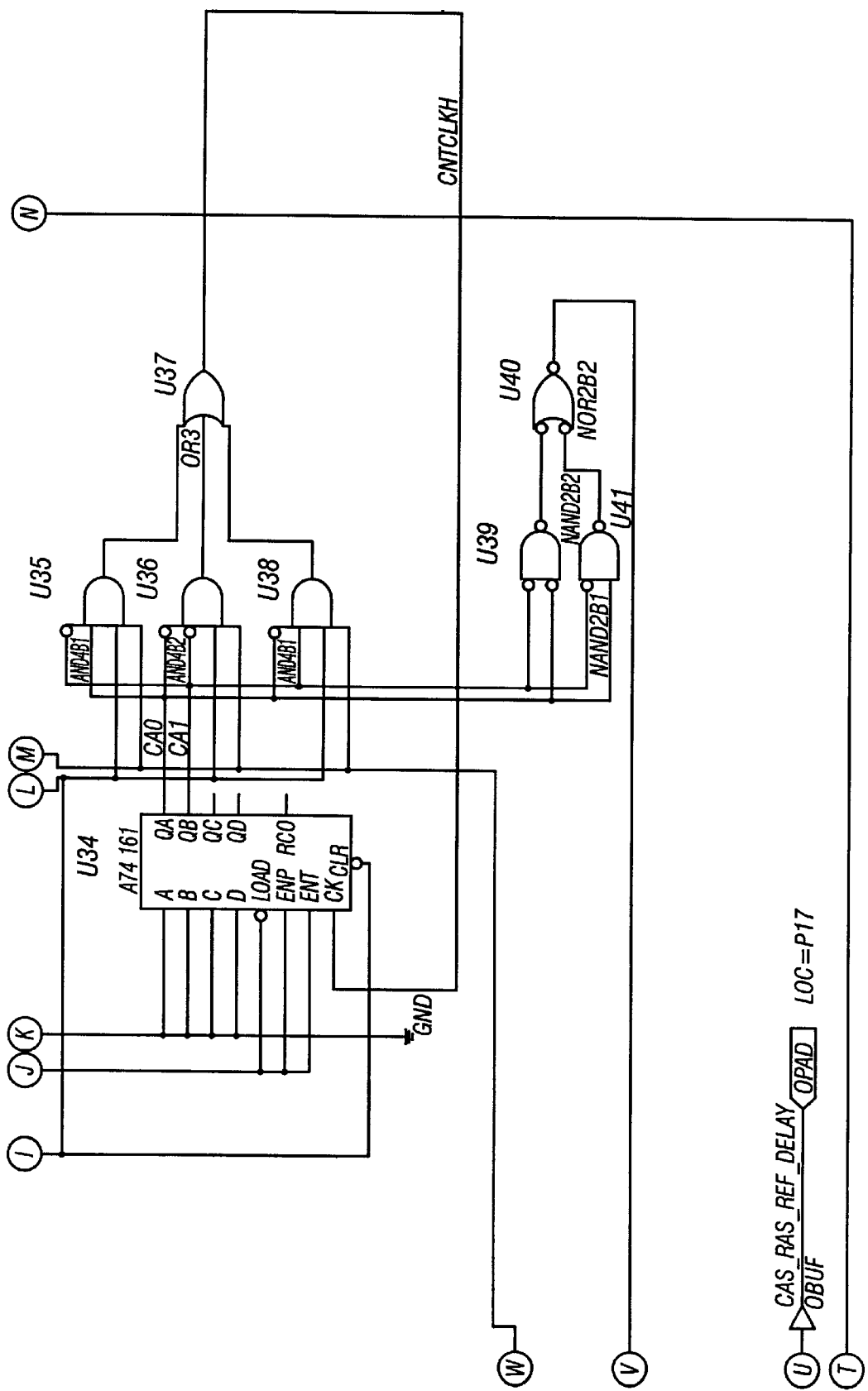
Figures 5, 6B:
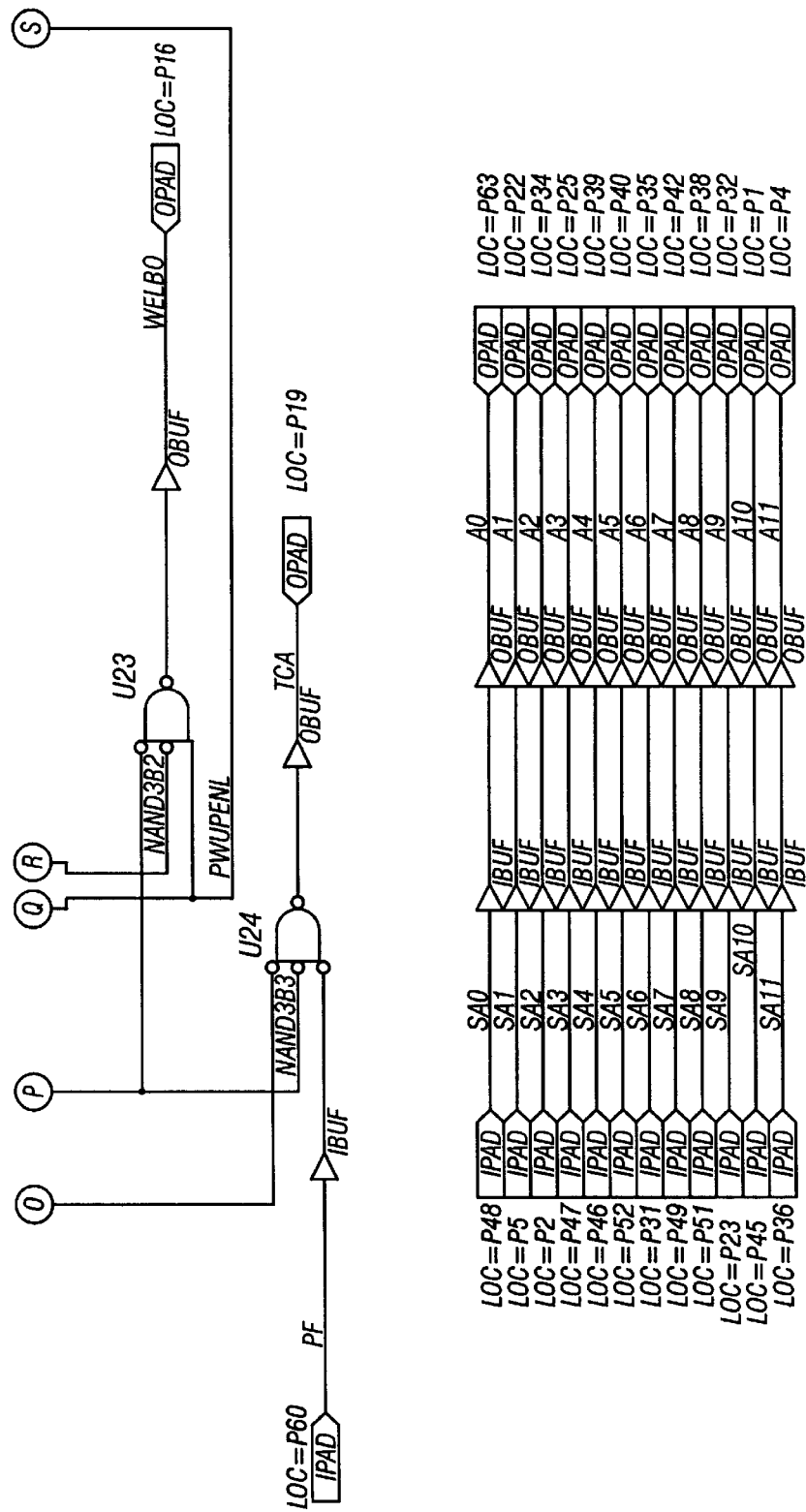

As used herein, the term "non-volatile" as used in the context of memory devices means that information retained by the memory device remains intact even when no electrical power is being applied to the The logic for the Xilinx XC9572XL-7-VQ64 is shown in FIG. 6b. memory device.

As used herein, the term "self refresh" as used in the context of volatile solid state memory devices means that the volatile solid state memory device is capable maintaining the state of the data retained by it by generating signals that refresh the date within its memory array.

As used herein, the term "errant control signals" means signals received on the control lines of the memory that were not intended and that may cause a result in the memory device that was not intended.

As used herein, the term "errant address signals" means signals received on the address lines of the memory system that were not intended and that may cause a result in the memory device that was not intended.

As used herein, the term "low power standby mode" in the context of a volatile solid state memory device means that the memory device is in a state whereby it is in self refresh mode and is unable to respond to memory requests including read and write requests. The power drain of the memory devices is lower than when the memory devices are in a normal operational mode and ready to respond to memory requests.

As used herein, the term "power down mode" in the context of a volatile solid state memory device is synonymous with "low power standby mode".

As used herein, the term "power up mode" or "operation mode" as used in the context of a volatile solid state memory device means that the memory device is operating within the normal operating electrical power parameters for which it was rated and is ready to accept read or write requests for information.

As used herein the term "accessed" means that there are pending requests to retrieve or save information from or to the device, respectively.

Figure 1:
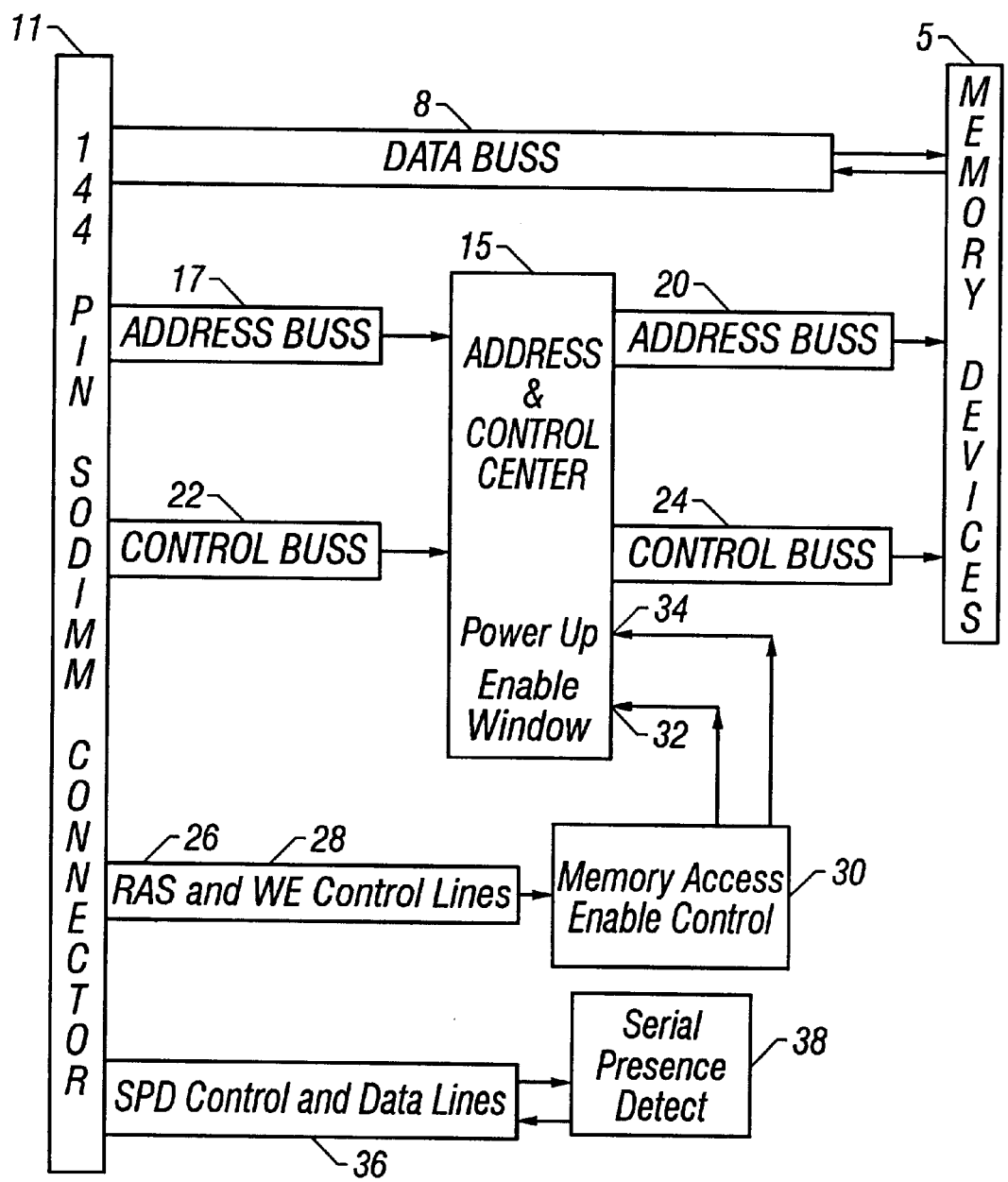
FIG. 1 is a block diagram of the low power down memory system showing the interposition of the access and control module between the memory module connector and the DRAM memory devices.

FIG. 1 is a block diagram of a preferred embodiment of the low power down memory system. FIG. 1 shows volatile solid state memory devices 5 in two way communications with a data buss 8 that is coupled to a CPU (not shown) via an industry standard memory slot connector 11 for example 144 pin SODIMM memory connector or 168 PIN DIMM memory connector both in accordance with the JEDEC industry standard. The data buss 8 has lines for communicating electrical signals representing data to the memory devices 5. A control device 15 is interdisposed between an address buss 17 connected to memory connector 11 and an address buss 20 in direct communication with memory devices 5 via the address pins of the memory devices 5. Control device 15 is also interdisposed between a control buss 22 coupled to memory connector 11 and a control bus 24 in direct communication with memory devices 5. The control device 15 accepts input signals from the memory access enable control 30 that indicate when the memory devices 5 are to placed in a power down mode or in a powered up mode. The control device 15 also isolates the address buss 17 and control buss 22 from the memory devices 5 during the time period when the memory devices 5 are in a power down self refresh mode. By isolating the memory devices from the control buss 22 and address buss 17 the control device 15 prevents errant signals from erroneously changing or affecting the data being retained by the memory devices 5.

FIG. 1 also shows RAS, row address select lines, 26 and WE, write enable, line 28 connected to a memory access enable control device 30. The memory access enable control 30 receives signals from the CPU that indicate a memory access is pending. The memory access enable control 30 then signals the control device 15 to bring the memory devices 5 to a normal operating mode by raising power up line 34 to a true or high state. The memory access enable control 30 determines when a memory access is appropriate in terms of timing and raises the enable window line 32 in the control device 15 to indicate that a memory access is appropriate. The serial presence detect control and data lines 36 and the serial presence detect EEPROM 38 are used in accordance with the JEDEC industry standard.

An example of the memory devices 5 is four 64M EDO DRAM (4-Mword×16) 4k refresh 3.3 V 50 ns access time self refresh mode L-version memory devices. See the timing diagram in FIG. 2 and the schematic in FIGS. 3A to 3O for an embodiment using the aforementioned memory devices.

The memory devices are placed into low power down mode by memory access enable control 30 when no memory accesses are detected. When the power up input 34 becomes not true the address and control center 15 will begin a predetermined set of steps as defined by the Power down mode of the specification for model ATF16LV8C an ATMEL industry standard programmable logic device. During power down mode all input signals from the address buss 17 and control buss 22 are isolated from the memory devices 5.

Once the memory devices 5 are placed in self refresh mode according to the specifications of the memory devices, the power drain on the external power source is reduced and the computer system experiences an increased efficiency in power usage.

A further method for reducing the power drain of the external power source can be utilized by using the memory system as a RamDisk in accordance with industry standards as described in the prior art. Applications could then be temporarily stored on the RamDisk and the hard disk could then be allowed to settle into is power down mode in which the platen does not spend thereby not drawing power from the external power source. Just as previously described when the RamDisk is not being accessed the memory devices 5 are placed into self refresh mode and when an access is made, the memory devices 5 are powered up and accessed. The time to power up the memory devices 5 and retrieve the requested data is much shorter and more efficient than starting the hard drive and accessing the data stored thereon.

Figure 3A:
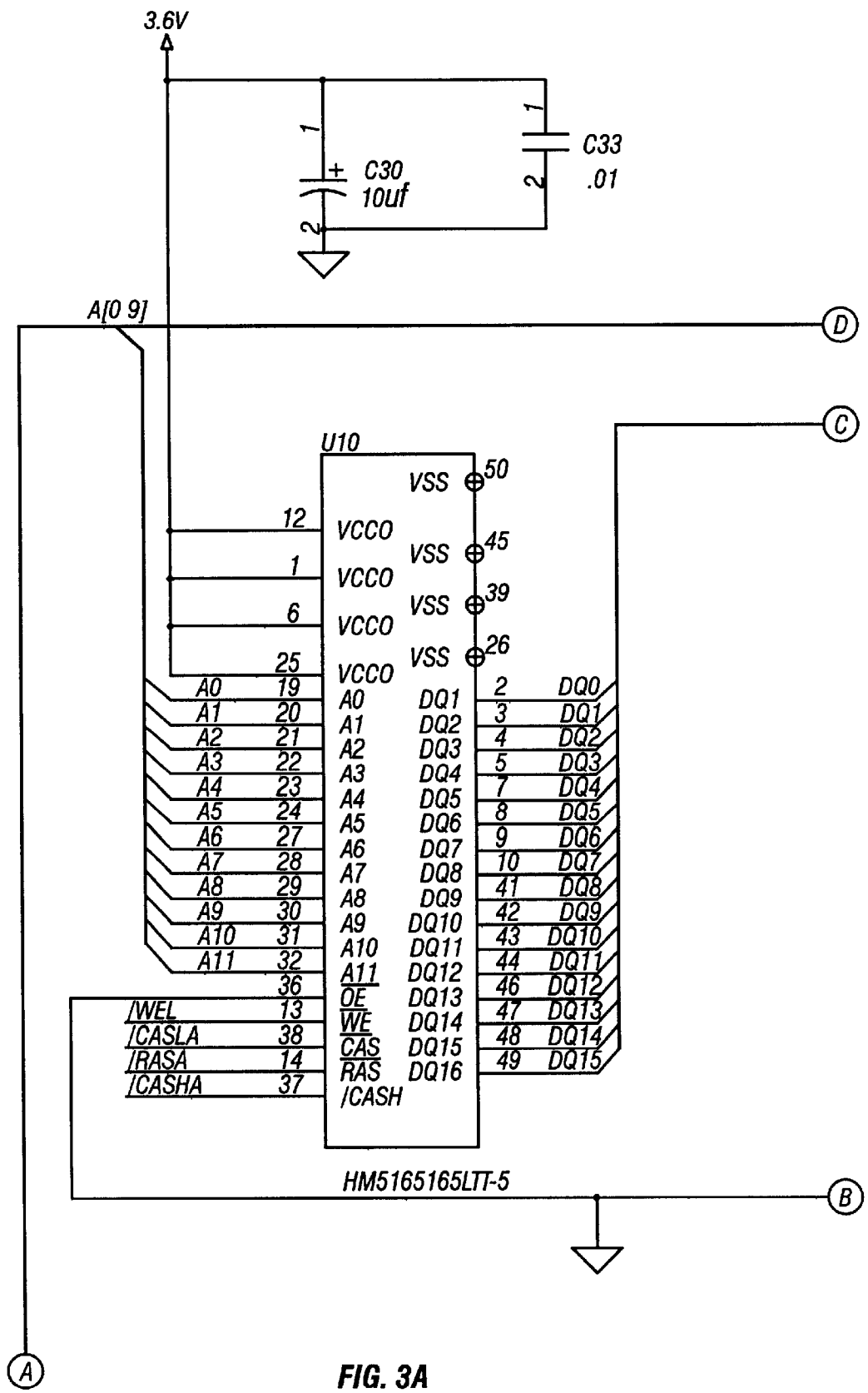
FIGS. 3A to 3O are a schematic drawn to current industry standards and practices of a 32 MB low power down 144 PIN SODIMM according to the invention.
Figure 3B:
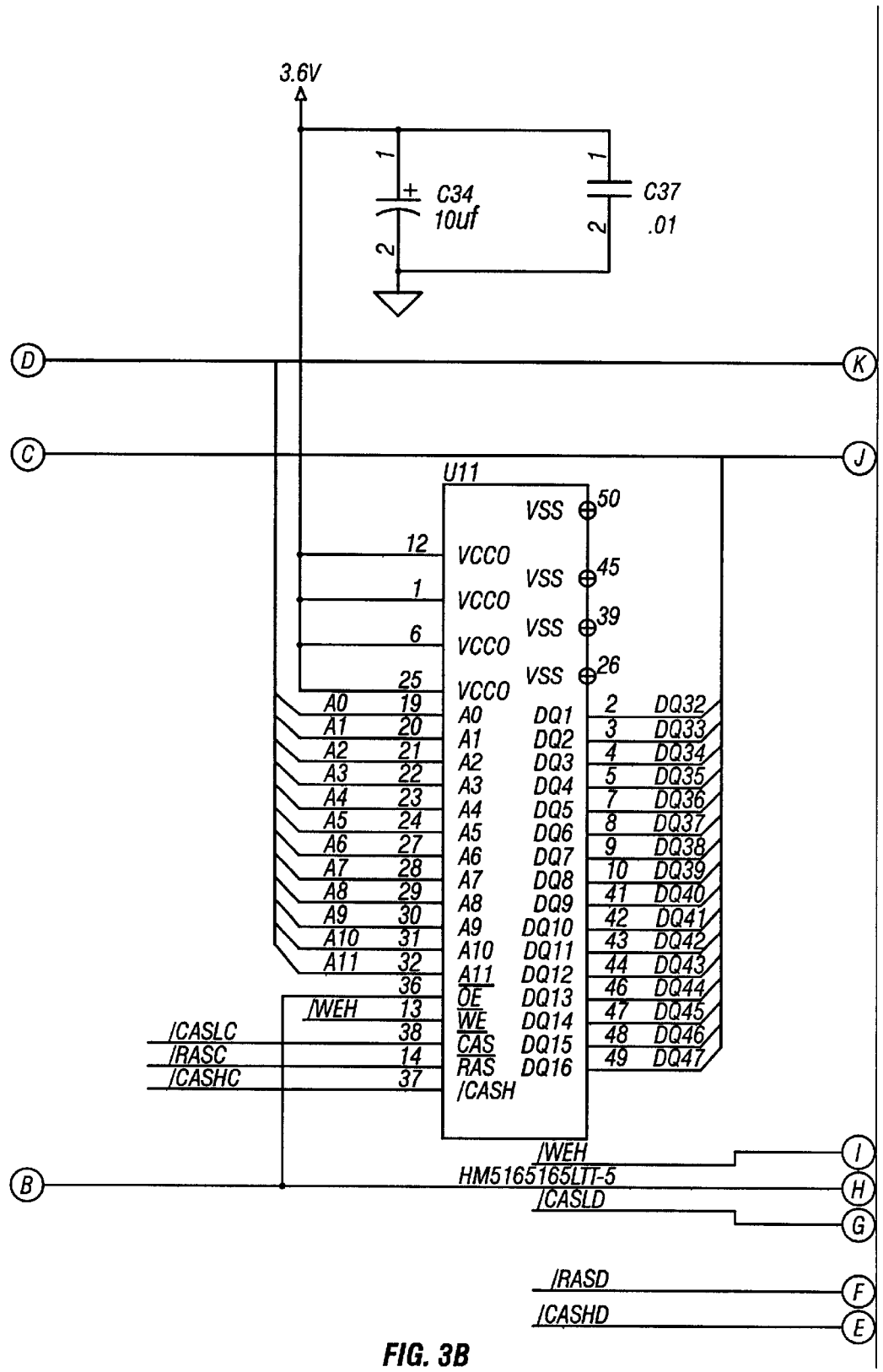
Figure 3C:
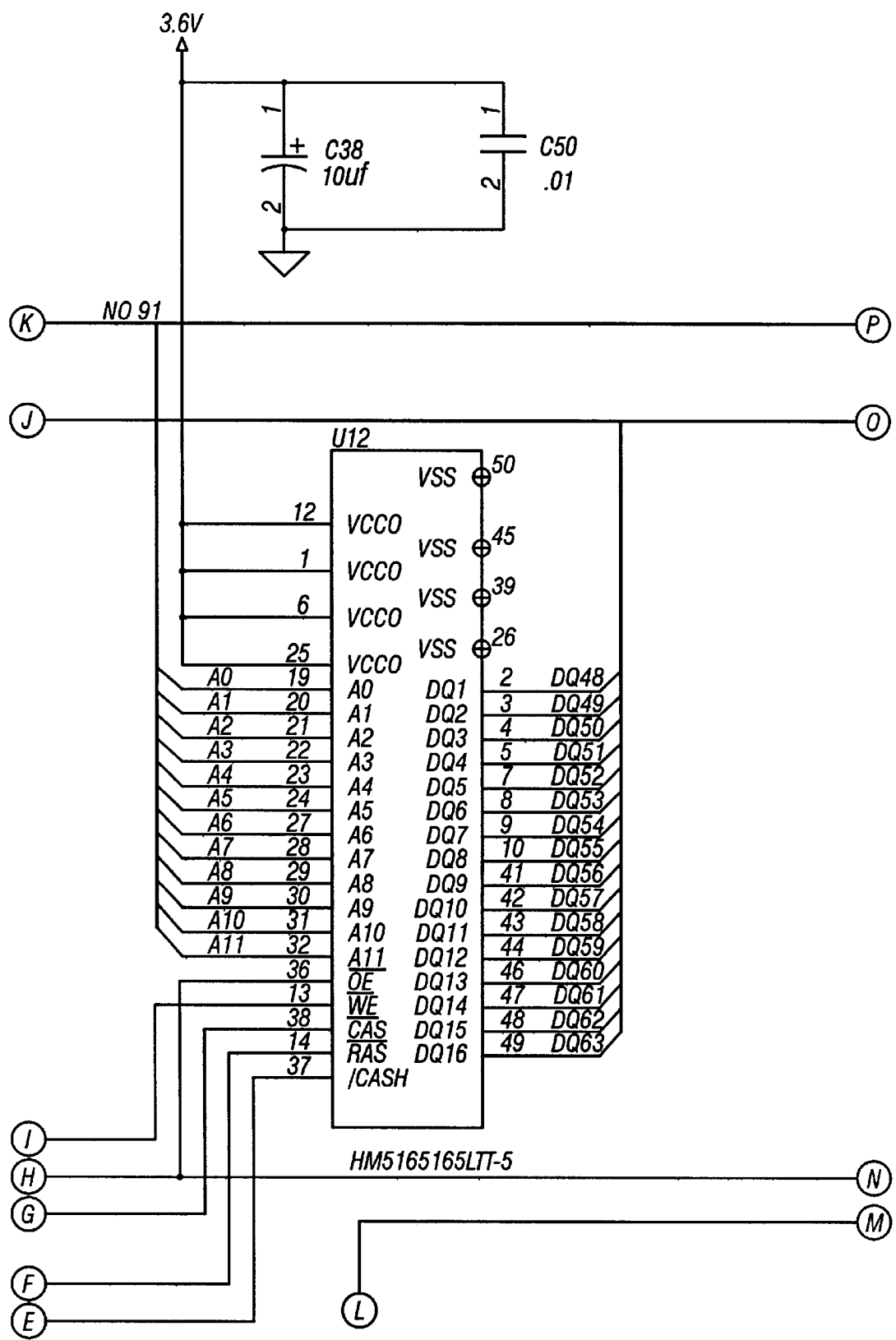
Figure 3D:
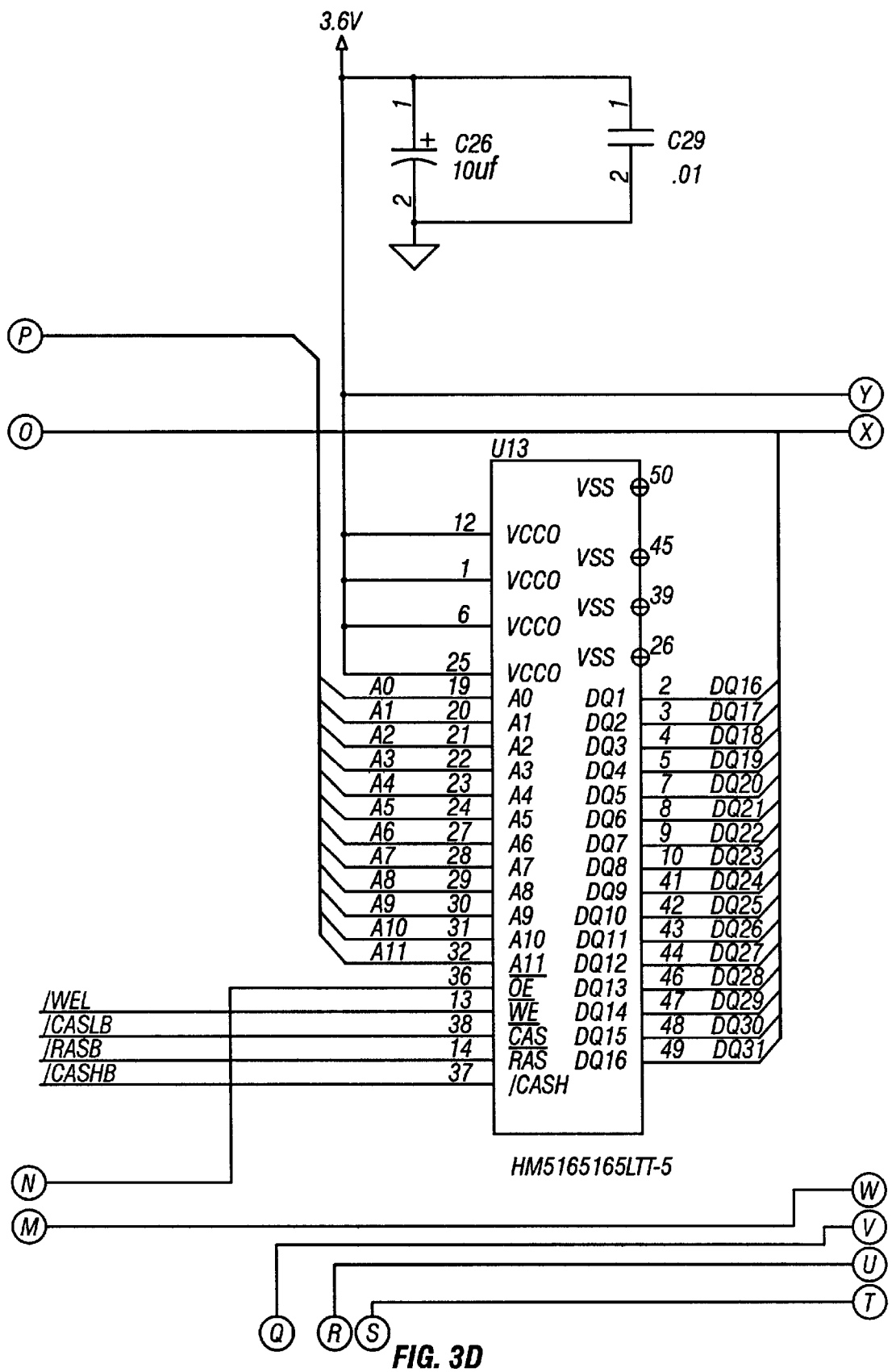
Figure 3E:
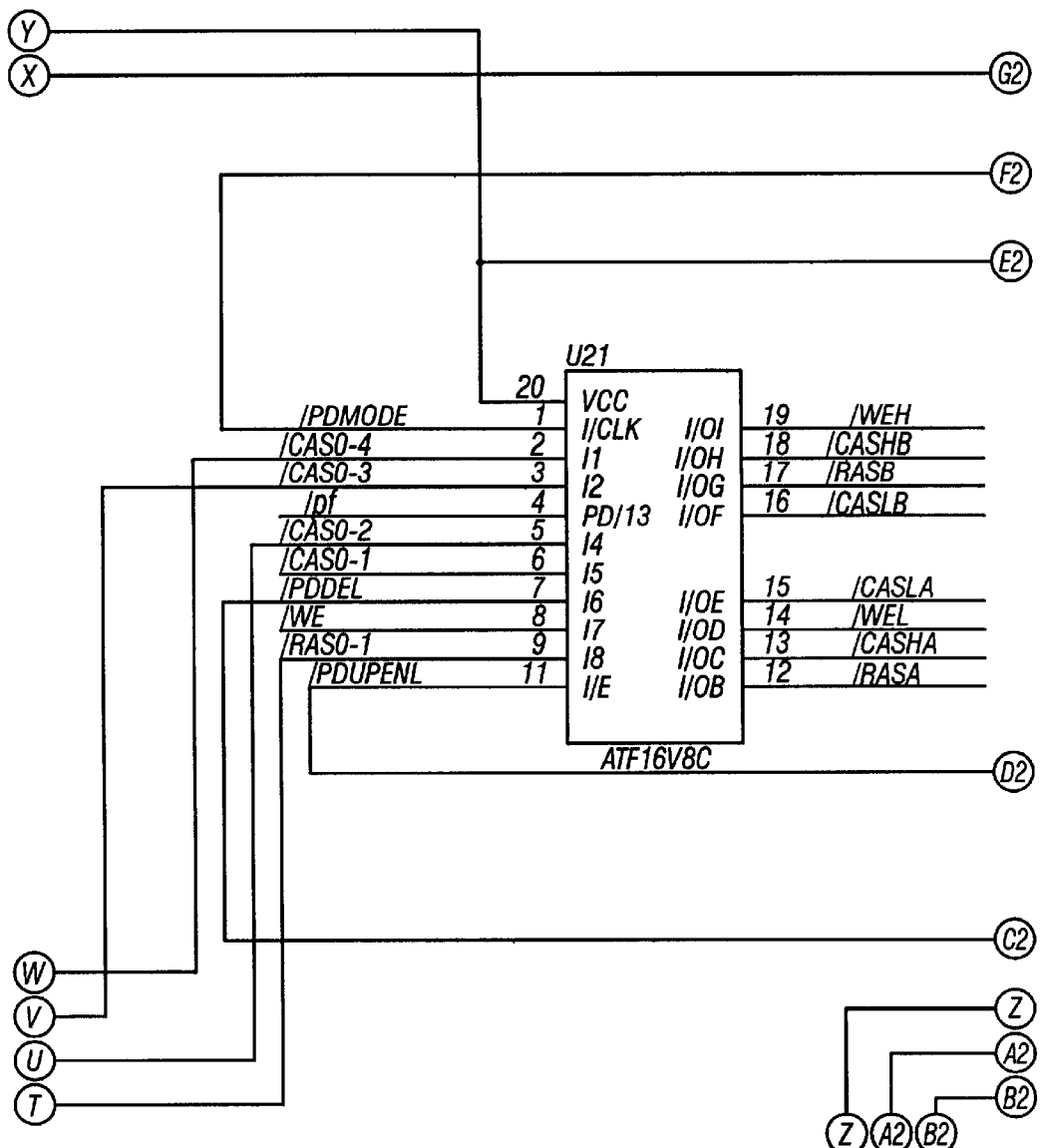
Figure 3F:
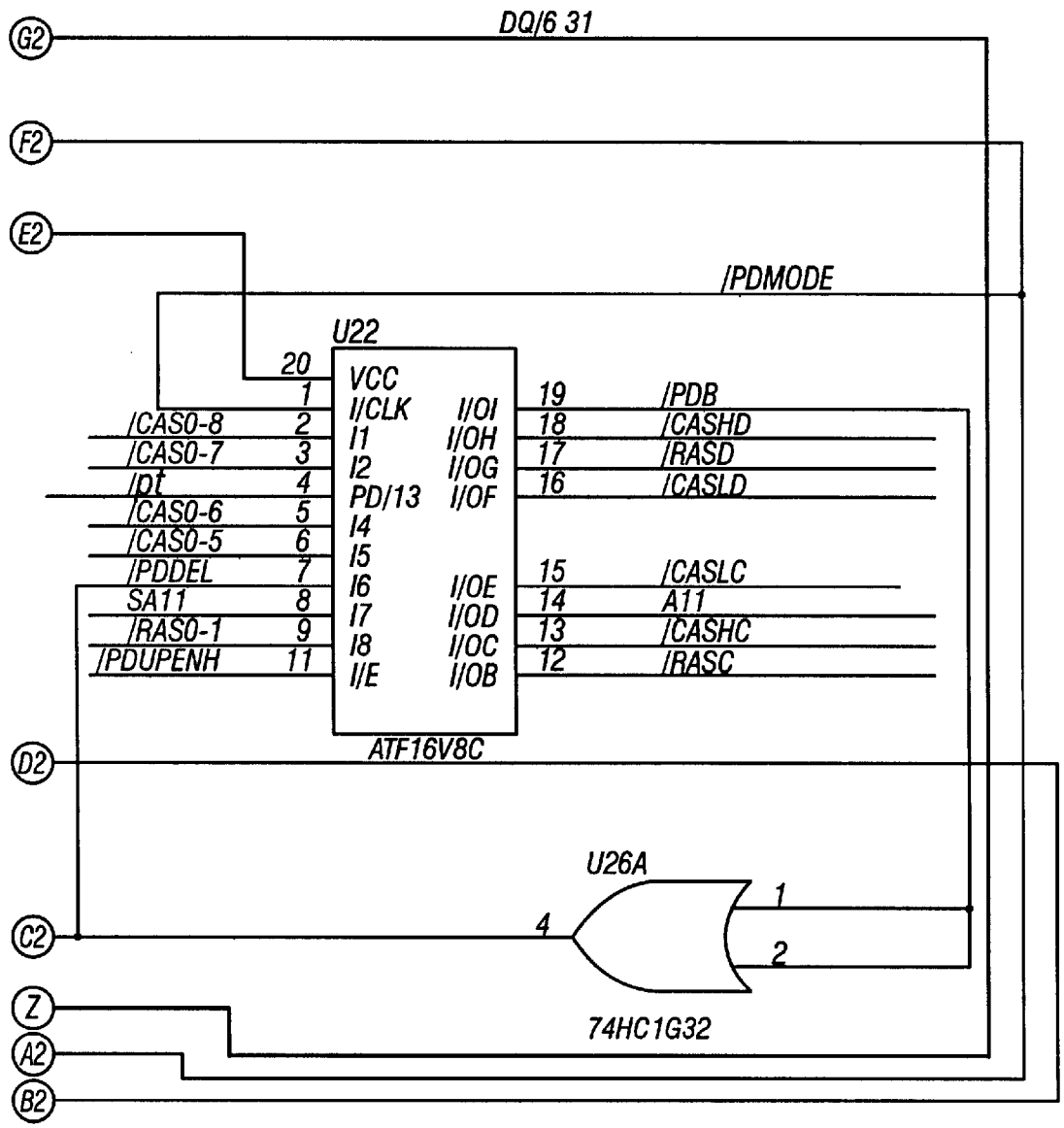
Figure 3G:
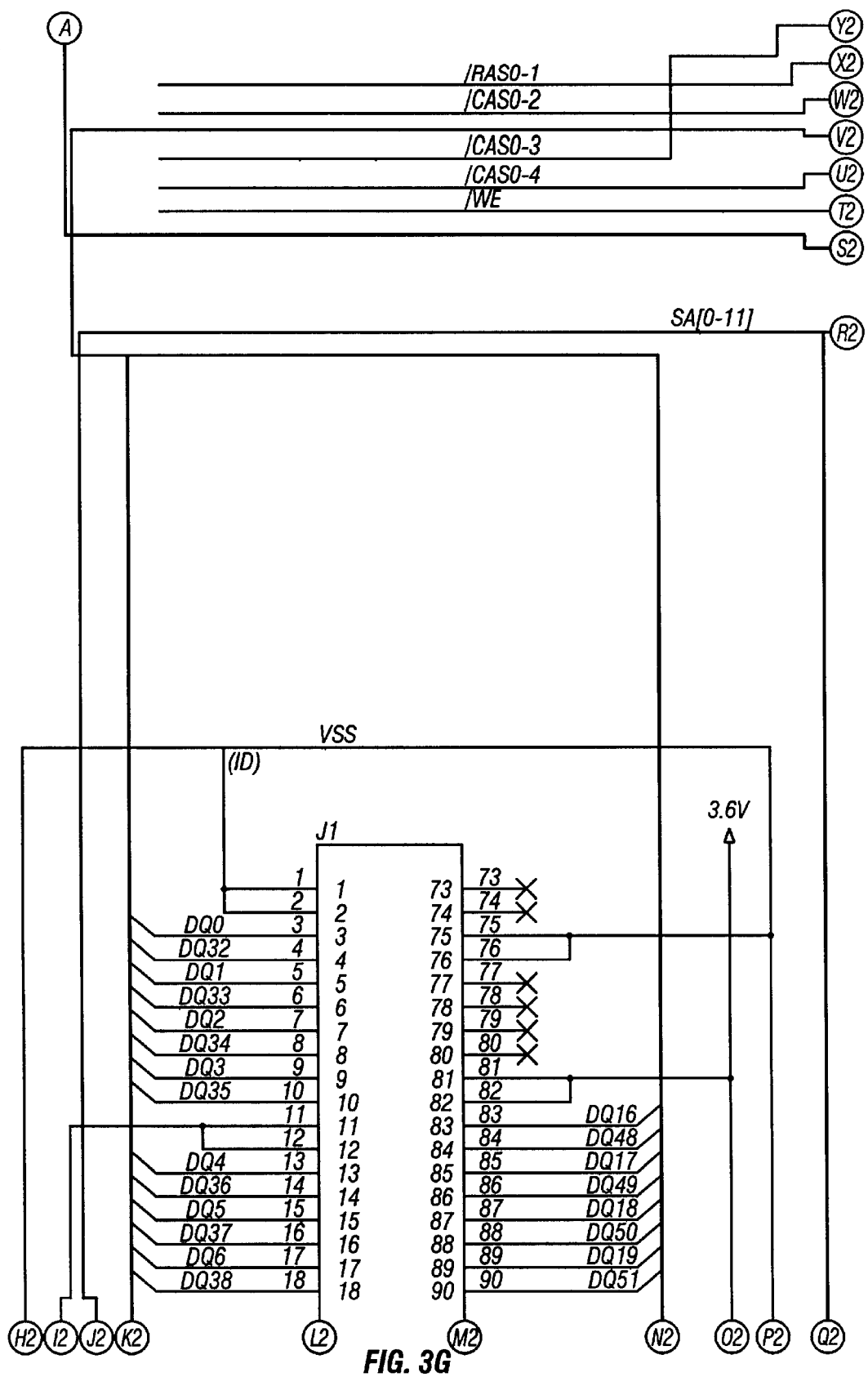
Figure 3H:
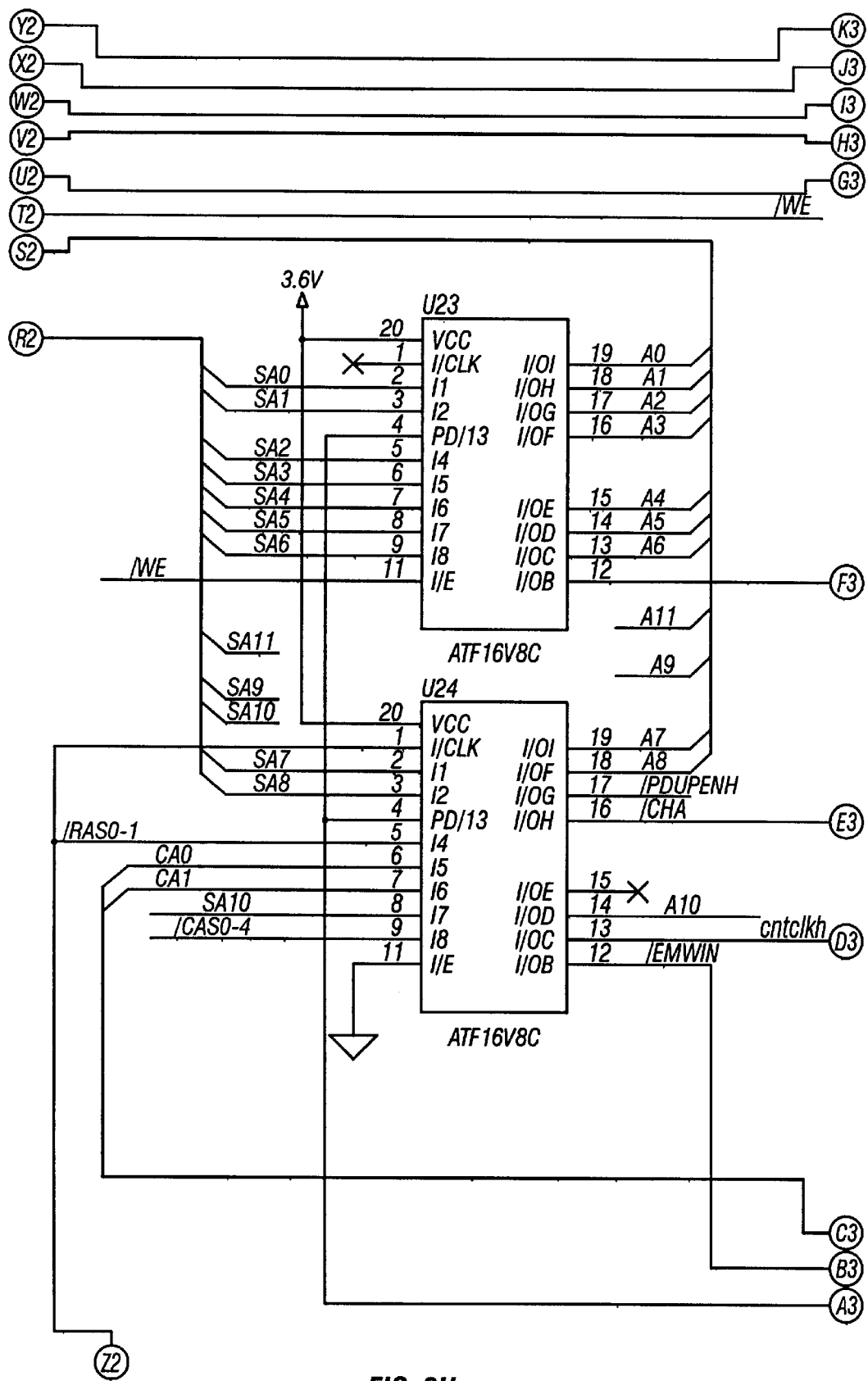
Figure 3I:
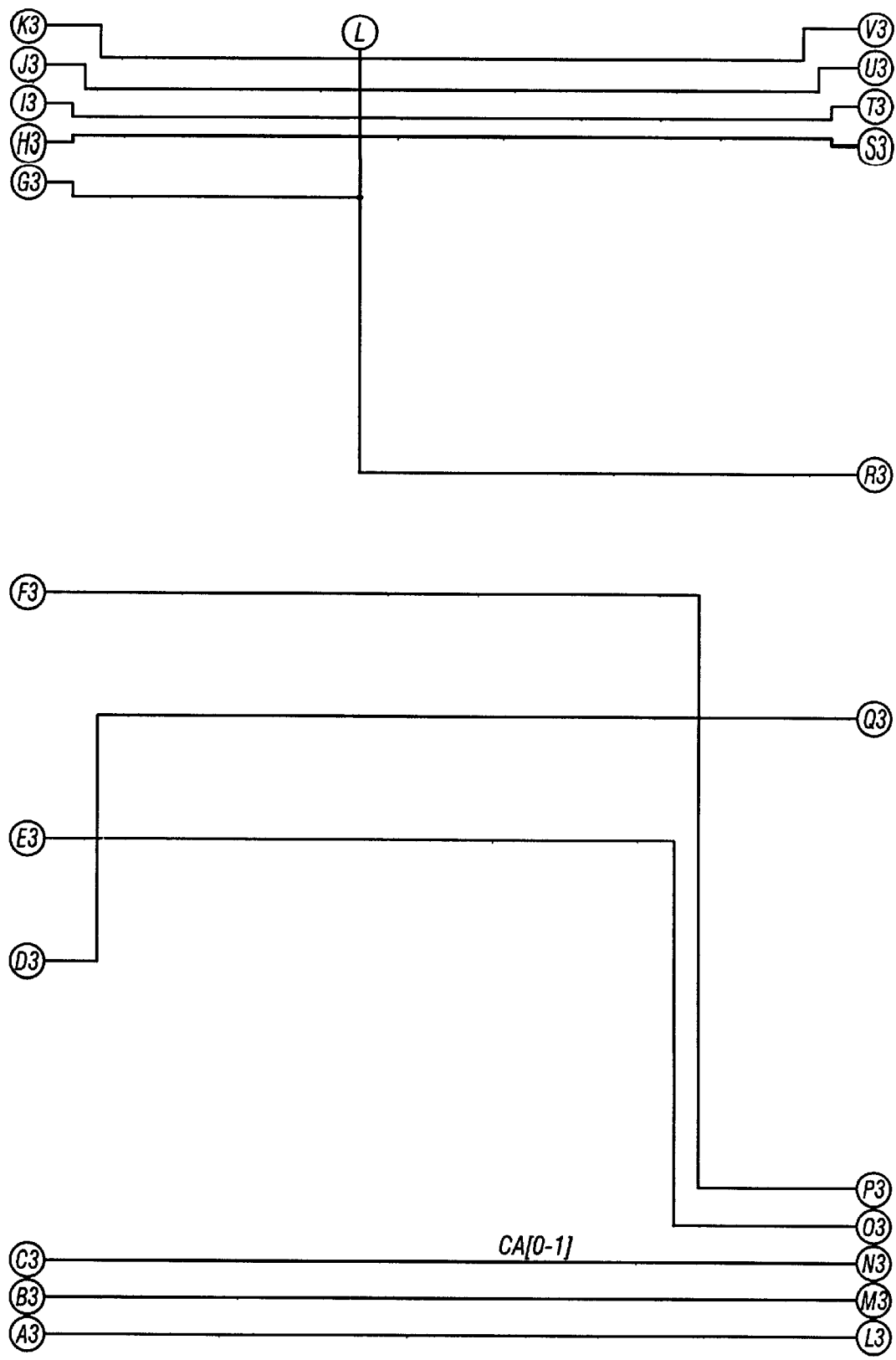
Figure 3J:
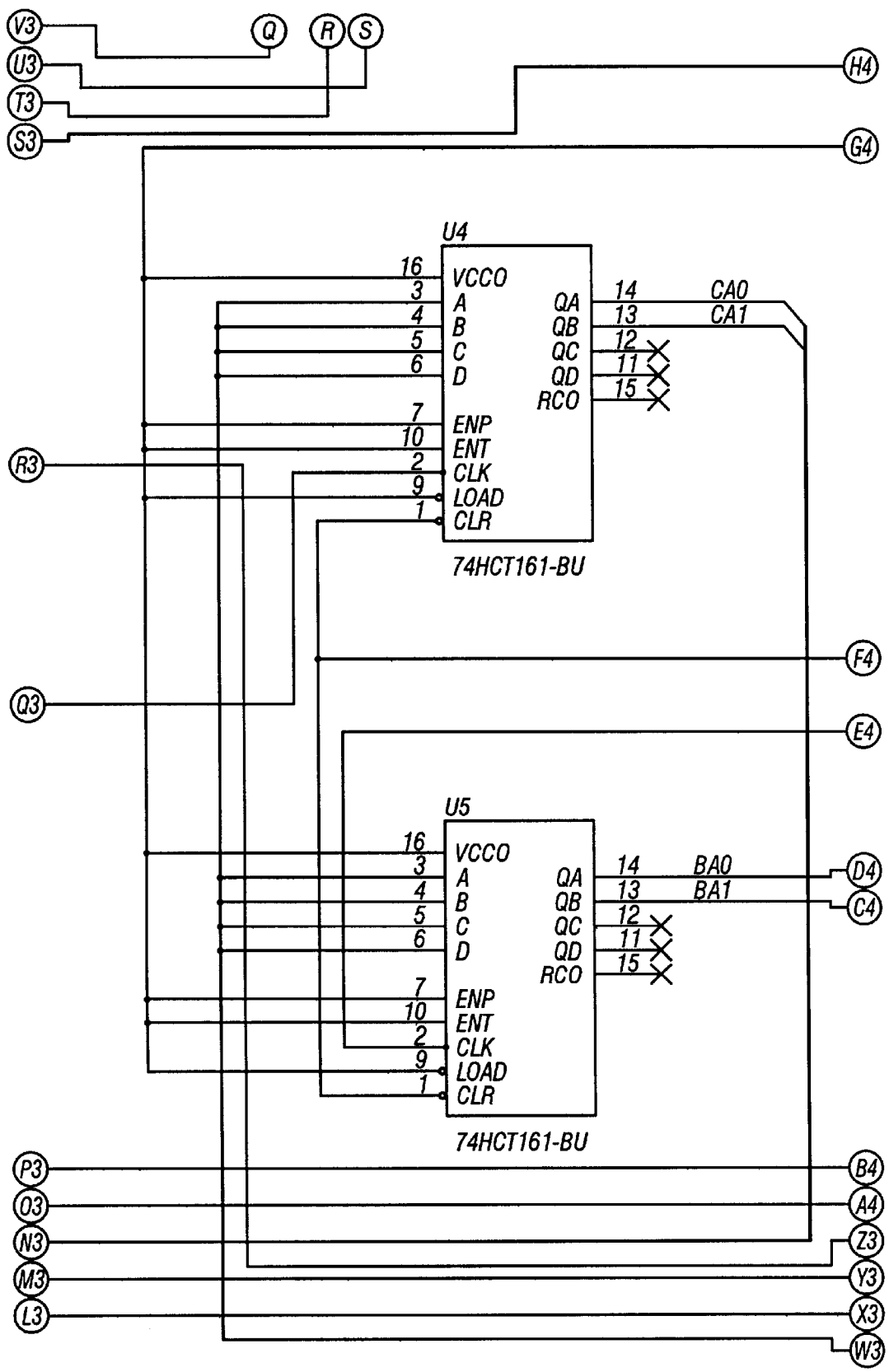
Figure 3K:
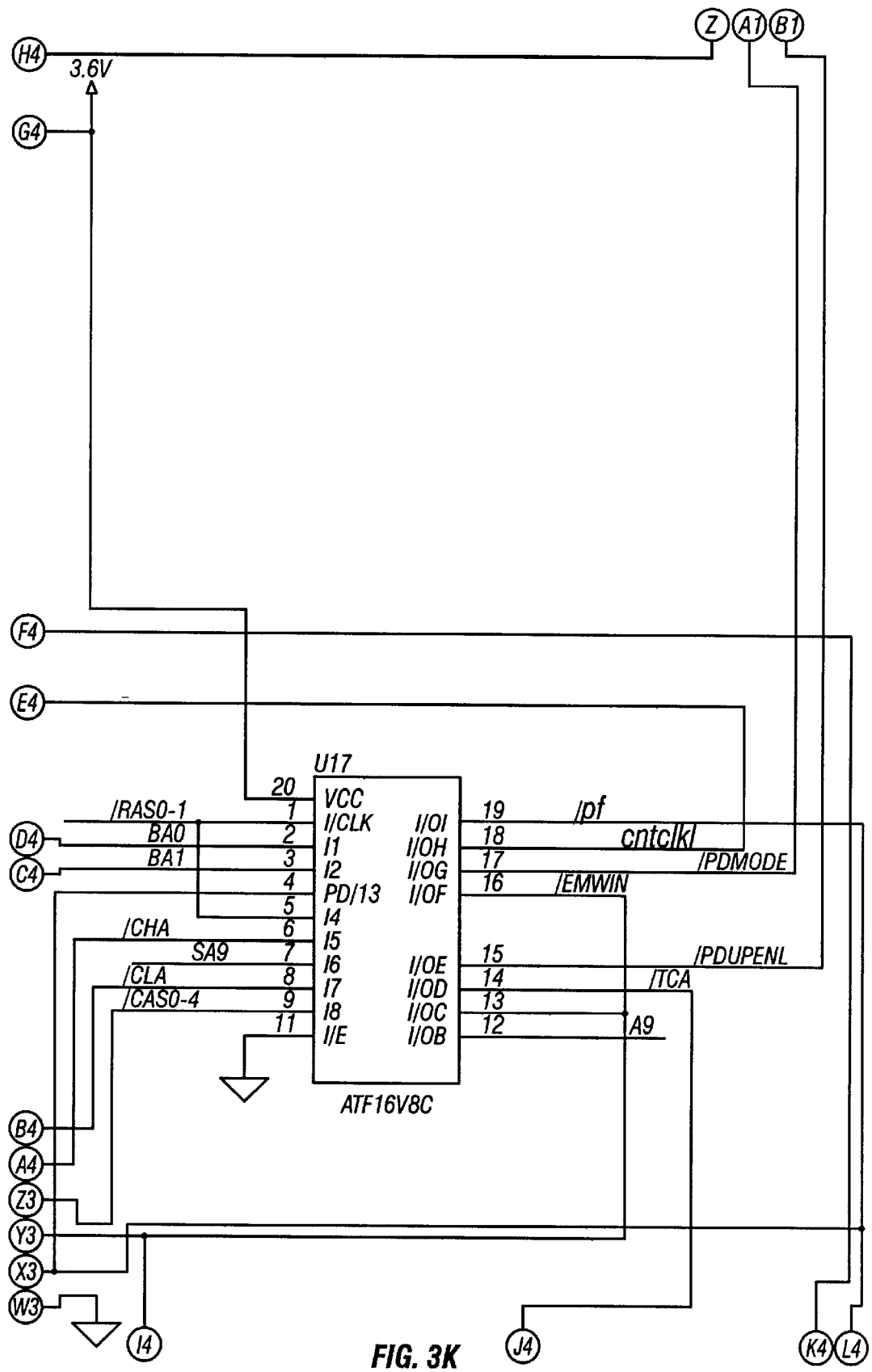
Figure 3L:
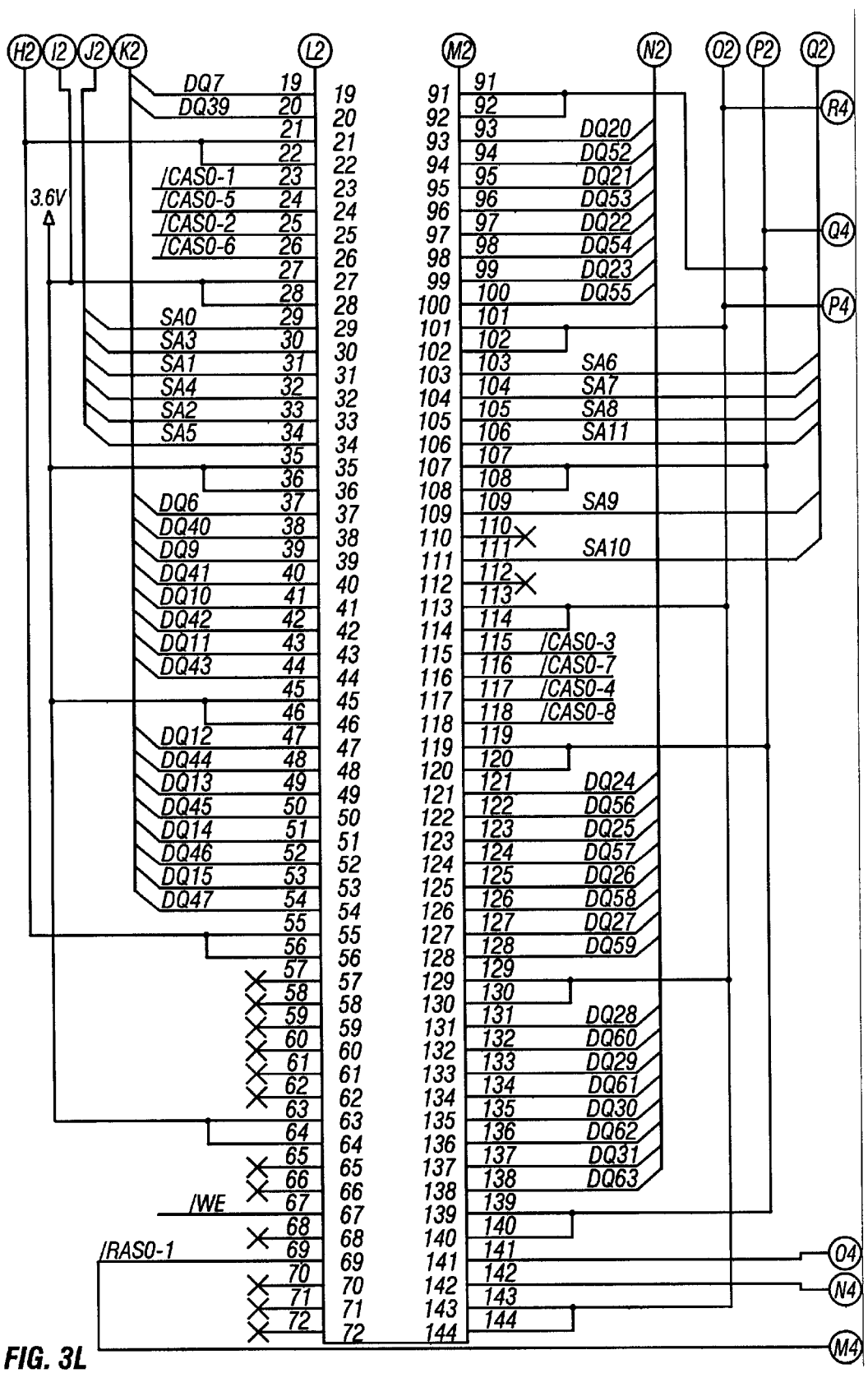
Figure 3M:
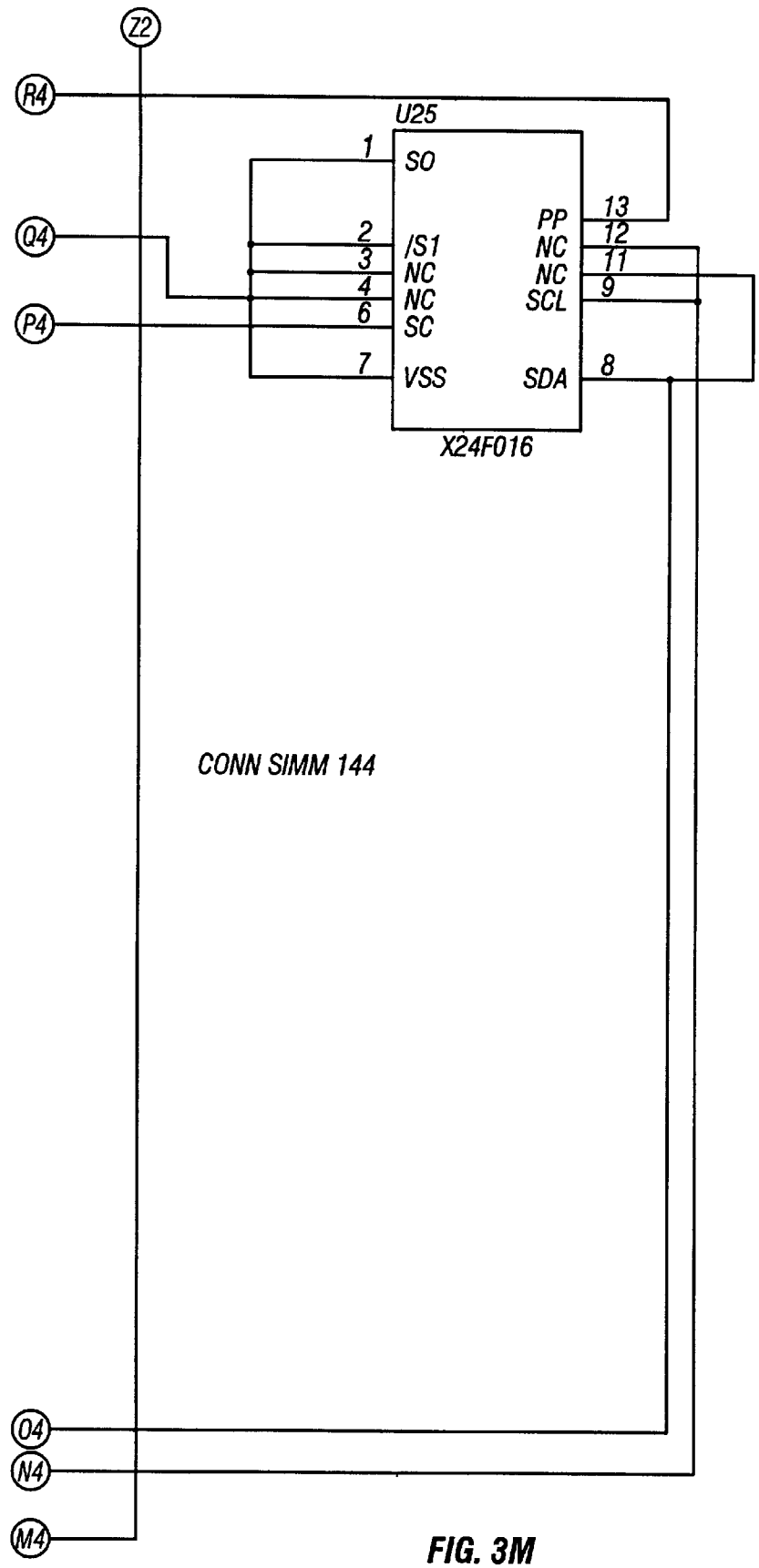
Figure 3N:
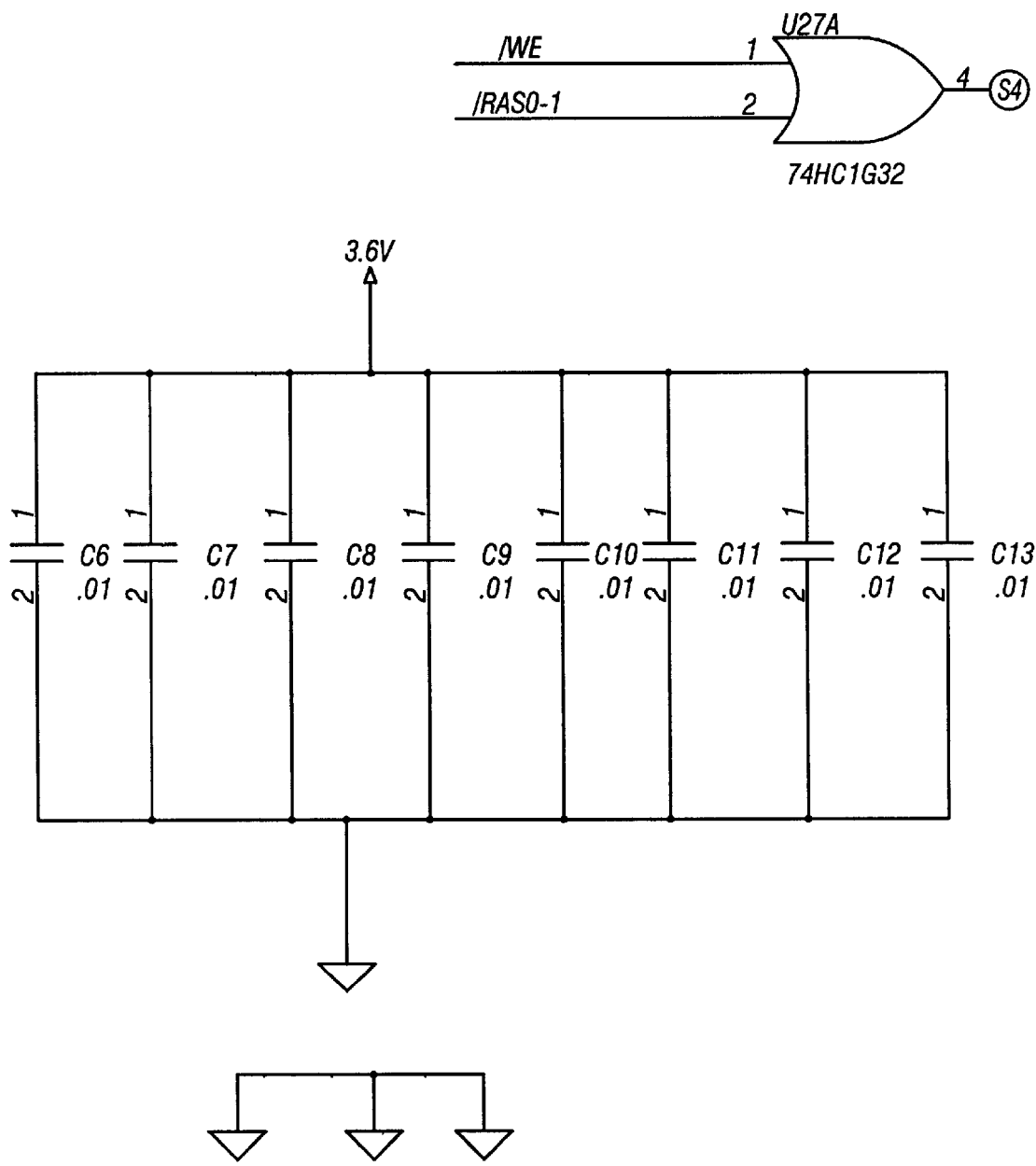
Figure 30:
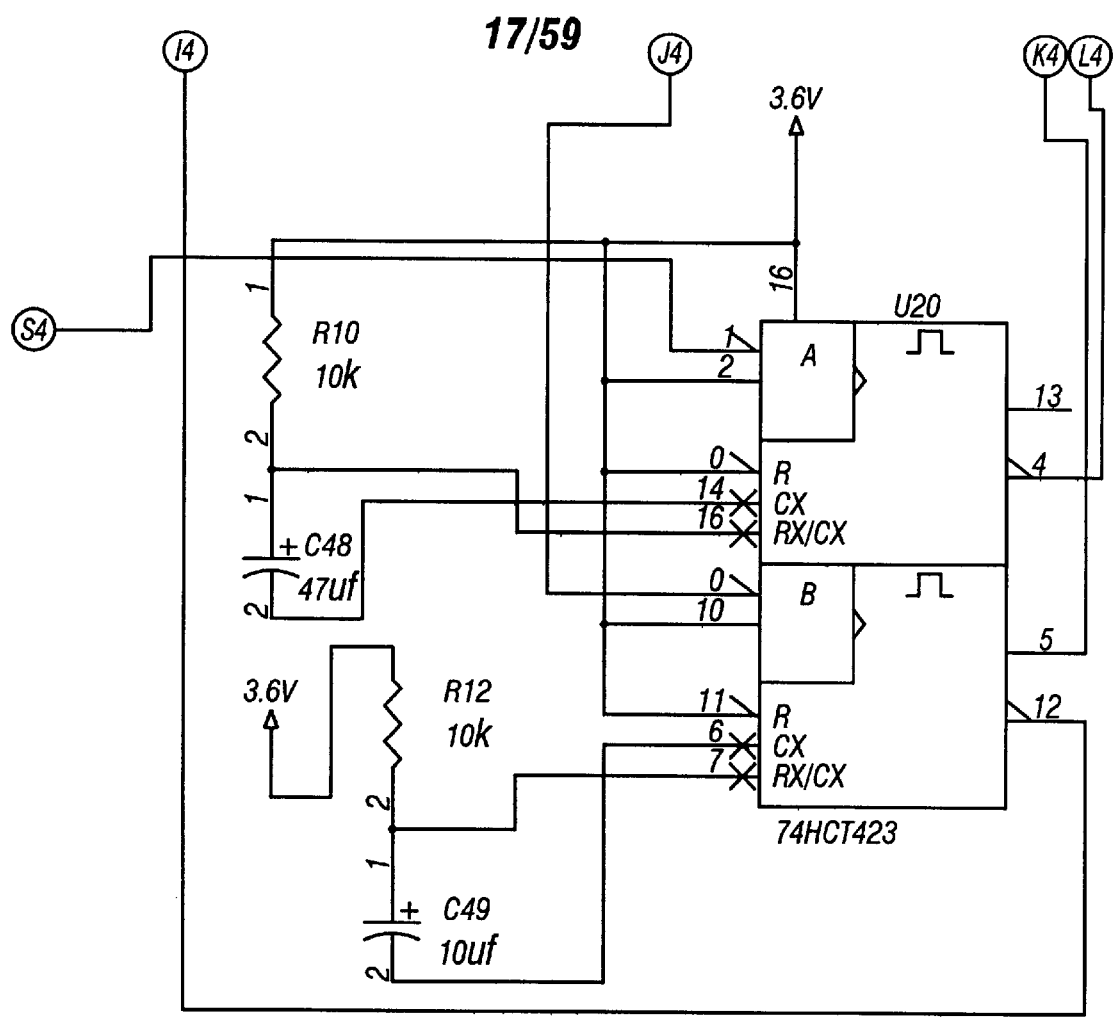

A typical configuration of an embodiment according to the invention is shown in the schematic in FIGS. 3A to 3O, where a control device is interposed between the CPU and the volatile solid state memory devices. The schematics is drawn to current industry standards and practices. The memory system in the current presentation, but not limited to, uses four 64M EDO (Extended Data Out) DRAM (Dynamic Random Access Memory). Typical memory chips used are the Hitachi HM5165165, 64M EDO DRAM (4-Mword×16-bit) 4 k refresh 3.6 V 50 ns access time self-refresh mode (L-version) memory devices. See the HM5165165 specification which is hereby incorporated by reference.

Page 33 of the Hitachi HM5165165 specification shows the required timing constraints for self-refresh cycle (L-version). At tRASS>100 us, self-refresh mode is activated, and not activated at tRASS<10 us. It is undefined within the range of 10 us<=tRASS<=100 us. For tRASS>=

10 us, it is necessary to satisfy tRPS. The timing diagram is reproduced as FIG. 2.

To place the memory module into deep sleep mode when not being accessed putting pin 4 of U17,U21,U22,U23,U24, the programmable power down option of the ATF16LV8C, to a true state (Active High). U20, Pin 4 (74LV123) is tied to pin 4 of U17,U21,U22,U23,U24. When Pin 4 of U20 becomes not true (1), Pin 4 of U20 will drive pin 4 of U17,U21,U22,U23,U24 into a Power Down Mode, supply current drops to less than 5 uA per device (U17,U21,U22, U23,U24) and during power down, all input signals except for the power down pin 4 are blocked. The input and I/O pin keeper circuits remain active within the ATF16LV8C to U17, U21, U22, U23, and U24 to insure that the pins do not float to indeterminate levels. This further reduces system power and increases the life of the computer power supply which is normally a battery on a laptop or notebook computer.

To power up the SODIMM memory module from a deep sleep mode, pin 4 of U17, U21, U22, U23, U24 must be driven active low. U27 (74HCT1G32) is an OR gate that OR's /we and /ras0–1 together to trigger U20 Pin 1. This will cause pin 4 of U20 to go active true low and thus cause pin 4 of U17, U21, U22, U23 and U24 to go active true low and thus allow PD (Pin 4) low to valid output to occur in 30 ns by spec. PD low to valid input occurs minimum 10 ns.

U20 (retriggerable one shot) uses C48 (22 uf) and R11 (10 k) for defining the output pulse width on pin 4. This will cause the output pulse on pin 4 to be wider than the output pulse on U20 pin 12 (EMWIN). U20 (retriggerable one shot) uses C49 (10 uf) and R12 (10 k) for defining the output pulse width on pin 12. EMWIN can be trigger while tw is active k)w true. Long window for powering up U17, U21, U22, U23, and U24 and a shorter window inside of the longer window for accessing memory.

U23 Provides cla to U17 pin 8 and U24 provides cha to U17 from pin 6 which are used with tw input of U17 pin 19 to create the trigger signal called tca which comes out of U17 pin 14 that goes to U20 pin 8 that causes the retriggerable one shot to fire that creates/EMWIN (The memory access window)

After all programmable logic devices, PLD's, (U17,U21, U22,U23,U24) have powered up properly and maximum pin to pin delay can now be observed, describing the memory access and power up and power down features are as follows:

U23 Address Bits sa0, sa1, sa2, sa3, sa4, sa5, sa6 and /we are provided by J1 connector pin 29, pin 30, pin 31, pin 32, pin 33, pin 34 and pin 103 respectively. U23 provides buffering for address lines and a write enable line a0, sa1, sa2, sa3, sa4, saS, sa6 and /cla (/we). U23 a6, a5, a4, a3, a2, a1 and a0 come out of U23 pins 13, 14, 15, 16, 17, 18 and 19 respectively and go to memory devices U10, U11, U12 and U13 as shown in the schematic pictured in FIG. 3. U17 Address Bit sa9 is provided by J1 connector pin 109 and a9 goes from U17 pin 12 to memory devices U10, U11, U12 and U13 as shown in FIG. 3. U24 Address Bits sa7, sa8 and sa10 are provided by J1 connector pin 104, pin 105, and pin 111 respectively. U24 provides buffering for address lines sa7, sa8 and sa10. U24 a7, a8 and a10 come out of U24 pins 2, 3 and 8 respectively and goes to memory devices U10, U11, U12 and U13. U4 provides /ca0 and /ca1 to pins 6 and 7 respectively on U24. U5 provides /ba0 and /ba1 to pins 2 and 3 respectively on U17.

The following sequence causes the memory module to come out of self refresh mode: Emwin is provided by U20 Pin 12 and goes to U24 Pin 12. Rasl is provided by J1 connector pin 69, and is buffer out of U24 pin 18 as /cha and is provided as an input to U17 pin 6. Pwupenh is generated by a counter that provides the required TRPS coming out of self-refresh mode as shown in FIG. 3. The counter increments and creates the output signals /ca, /ca1 and /ca, /ca1 for two memory cycles. Cntclkh is generated by cycling /rasl, emwin being true and ca0 and ca1 being true for three cycles. After the third cycle cntclkh will stop counting. Pwupenh goes to 11 of U22.

Pwupenh will slay true for two memory accesses before going not true (see U24 equation for pwupenh and cntclkh) thus allowing caslc, cashc, casld, cashd, rasc and rasd to be driven high (not true high (1)) allowing the memory device to come out of self-refresh mode. If pdmode is true and pwupenh is not true, caslc, cashc, casld, cashd, rasa, rasb and write enable (we) are driven individually low when driven by the bus allowing memory accesses to occur while emwin is true.

Figure 2:
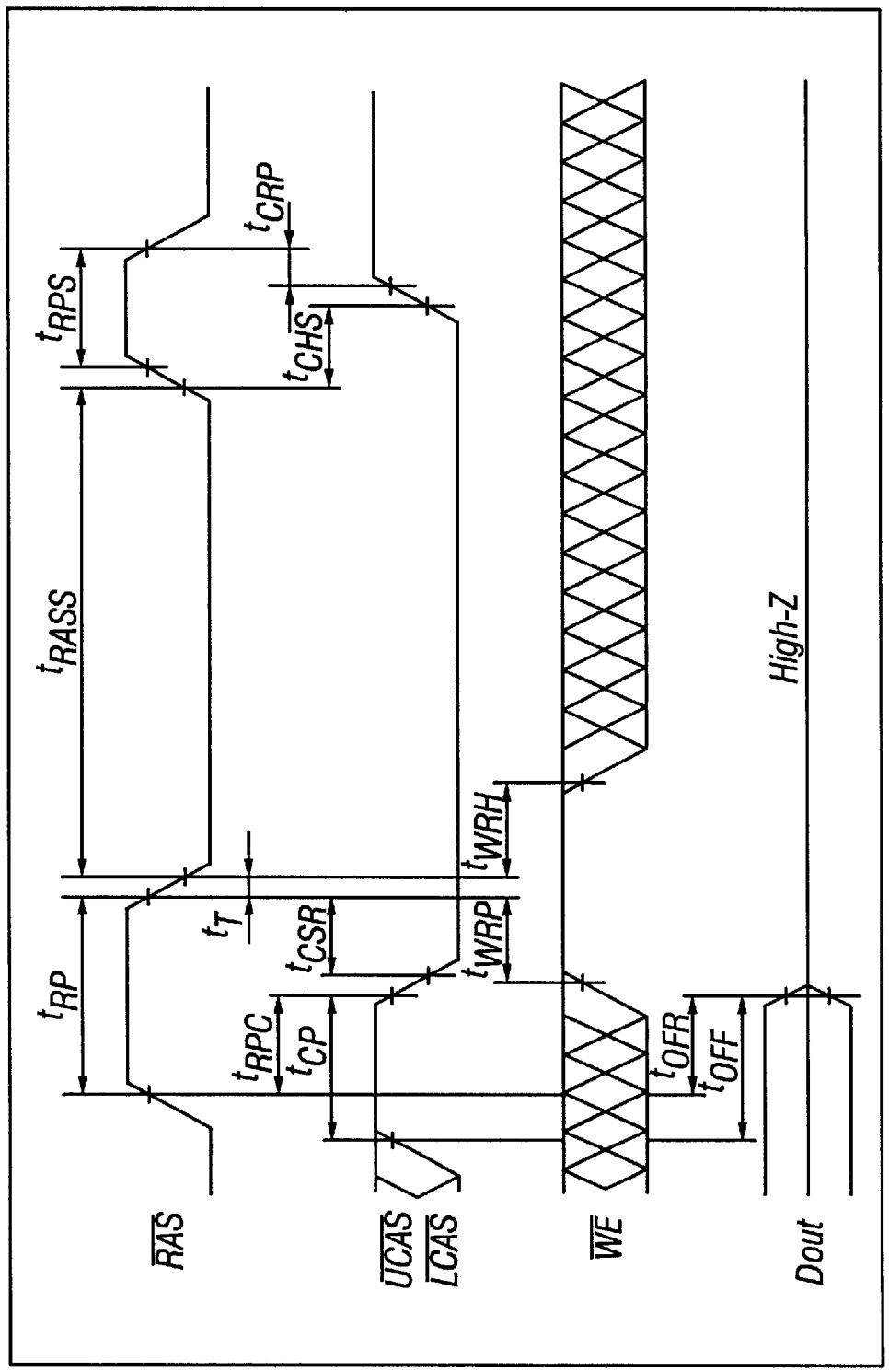
FIG. 2 is the self-refresh mode timing diagram of the Hitachi HM5165165 DRAM chips.

Emwin is provided by U20 Pin 12 and goes to U17 Pin 16. Rasl is provided by J1 connector pin 69. Pwupenl is generated by a counter that provides the required TRPS coming out of self-refresh mode as shown in FIG. 2. The counter increments and creates the output signals /ba, /ba1 and ba, /bal for two memory cycles. Cntclkl is generated by cycling /rasl, emwin being true and ba0 and ba1 being true for three cycles. After the third cycle cntclkl will stop counting. Pwupenl goes to pin 11 of U21.

Pwupenl will stay true for two memory accesses before going not true (see U17 equation for pwupenl and cntclkl) allowing casla casha, caslb, cashb, rasa and rasb to be driven (not true high (1)) allowing the memory device to come out of self refresh mode. U21 receives pwupenl on pin 11 and if pdmode is true and pwupenl is not true, casla, casha, caslb, cash, rasa, rasb and write enable (we) are driven individually low when driven by the bus allowing memory accesses to occur while emwin is true.

The following sequence causes the self refresh mode to occur:

After memory accesses have ceased, the emwin will go false high which is used by U17 to create the pdmode signal. If pdmode is not true, casla, casha, caslb, cashb, caslc, cashc, casld, cashd are driven low by U21 and U22 and pdmode is driven out of U22 pin 19 (pdb) and through U26 (or gate) to U22 pin 7 PDDEL and U21 pin 7 PDDEL. The or gate adds delay prior to rasa, rasb, rasc and rasd being driven low. Casla, casha, caslb, cashb, caslc, cashc, casld, cashd, rasa, rasb, rasc and rasd will remain low until a valid memory cycle is created.

U25 provides the serial presence detect as describe in section 4.1.2.3-Appendix C: JEDEC Standard No. 21-C. Page 4.1.2.3-1 which is incorporated herein by reference.

If the module is be used as direct memory without power down feature, then U17, U21, U22, U23 and U25 can be programmed to allow addresses to be fed through to their respective locations. The datasheet for the ATMEL High Performance $E^2$ Programmable Logic Device model ATF16V8C is hereby incorporated by reference.

U23 Address Bits sa0, sa1, sa2, sa3, sa4, sa5, and sa6 are provided by J1 connector pin 29, pin 30, pin 31, pin 32, pin 33 and pin 34 respectively. U23 provides buffering for address lines sa0, sa1, sa2, sa3, sa4, sa5, and sa6. U23 a6, a5, a4, a3, a2, a1 and a0 come out of U23 pins 13, 14, 15, 16, 17, 18 and 19 respectively and go to memory devices U10, U11, U12 and U13 as shown in FIG. 3. U17 address bit sa9 is provided by J1 connector pin 109 and a9 goes from U17 pin 12 to memory devices U10, U11, U12 and U13. U24 address bits sa7, sa8 and sa10 are provided by J1 connector pin 104, pin 105, and pin 111 respectively. U24 provides buffering for address lines sa7, sa8 and sa10. U24 a7, a8 and a10 comes out of U24 pins 2, 3 and 8 respectively and goes to memory devices U10, U11, U12 and U13.

Figure 4:
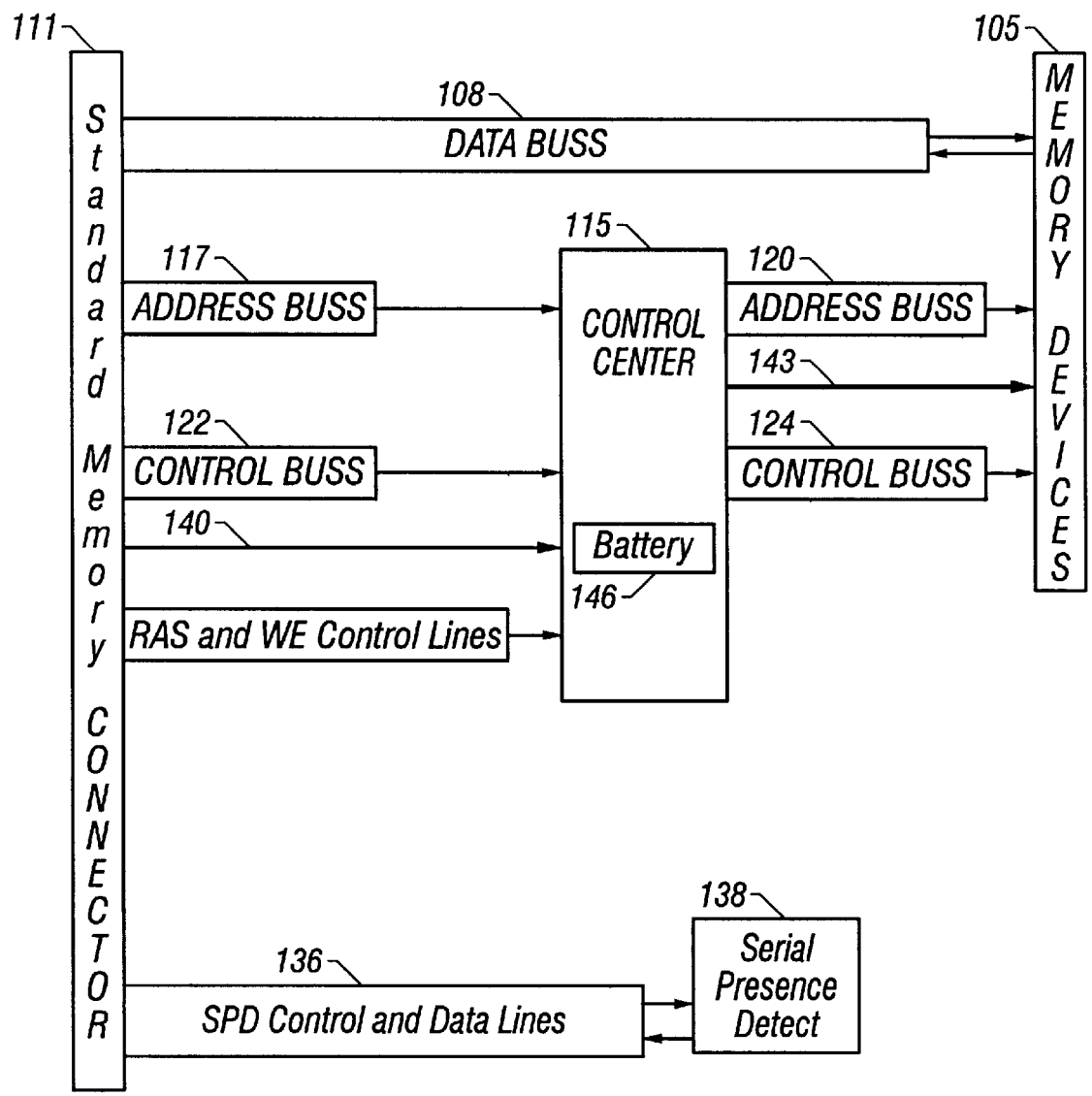
FIG. 4 is a block diagram of a non-volatile memory system according to the invention.

FIG. 4 is a block diagram of the preferred embodiment of a non-volatile memory system using volatile solid state memory devices. FIG. 4 shows solid state memory devices 105 in two way communications with a data buss 108 that is connected to a standard memory connector 111 such as a 72 PIN SIMM, 144 PIN SODIMM, or 168 PIN DIMM connector, all three in accordance with the JEDEC industry standards. The data buss 108 has lines for communicating electrical signals representing data to the memory devices 105. There is a control device 115 that is interdisposed between an address buss 117 connected to memory connector 111 and address buss 120 in direct communication with memory devices 105 via the address pins of the memory devices 105. Control device 115 is interdisposed between a control buss 122 connected to connector 111 and control bus 124 which is in direct communication with memory devices 105.

FIG. 4 also shows RAS, row address select lines, 126 and WE, write enable, 128 control lines connected to the control device 115.

The serial presence detect control and data lines 136 and the serial presence detect EEPROM 138 are in accordance with the JEDEC industry standard.

The system input electrical power source line 140 and control lines 122 and address lines 117 are inputs into the control device 115. The outputs from the control device 115 are the address lines 120 control lines 124 and voltage line 143. These outputs are inputs to the solid state memory devices 105. The voltage line 143 supplies electrical power at a predetermined voltage level to the memory devices. The control device 115 monitors the input voltage level by comparing the input voltage on line 140 against a fixed reference voltage which would be the electrical voltage set by the manufacturer of the memory device. When the input voltage level is less than the fixed reference voltage the output electrical voltage source is switched from the system electrical source input on line 140 to the battery 146. The control center 115 then electrically isolates the memory devices 105 from the control lines 122 and address lines 117. Such electrical isolation is necessary to prevent errant signals. If the state of the system is such that the system voltage has reached a predetermined threshold that can no longer support the electrical power needs of the memory devices 105, then the stability of the whole system is in jeopardy and the probability that errant signals may adversely influence the state of the data held by the memory devices is higher than normal. This added security feature will create confidence in the integrity of the data especially when the memory system is being used in mission critical systems where fail safes are a necessary part of the system.

Figure 5A:
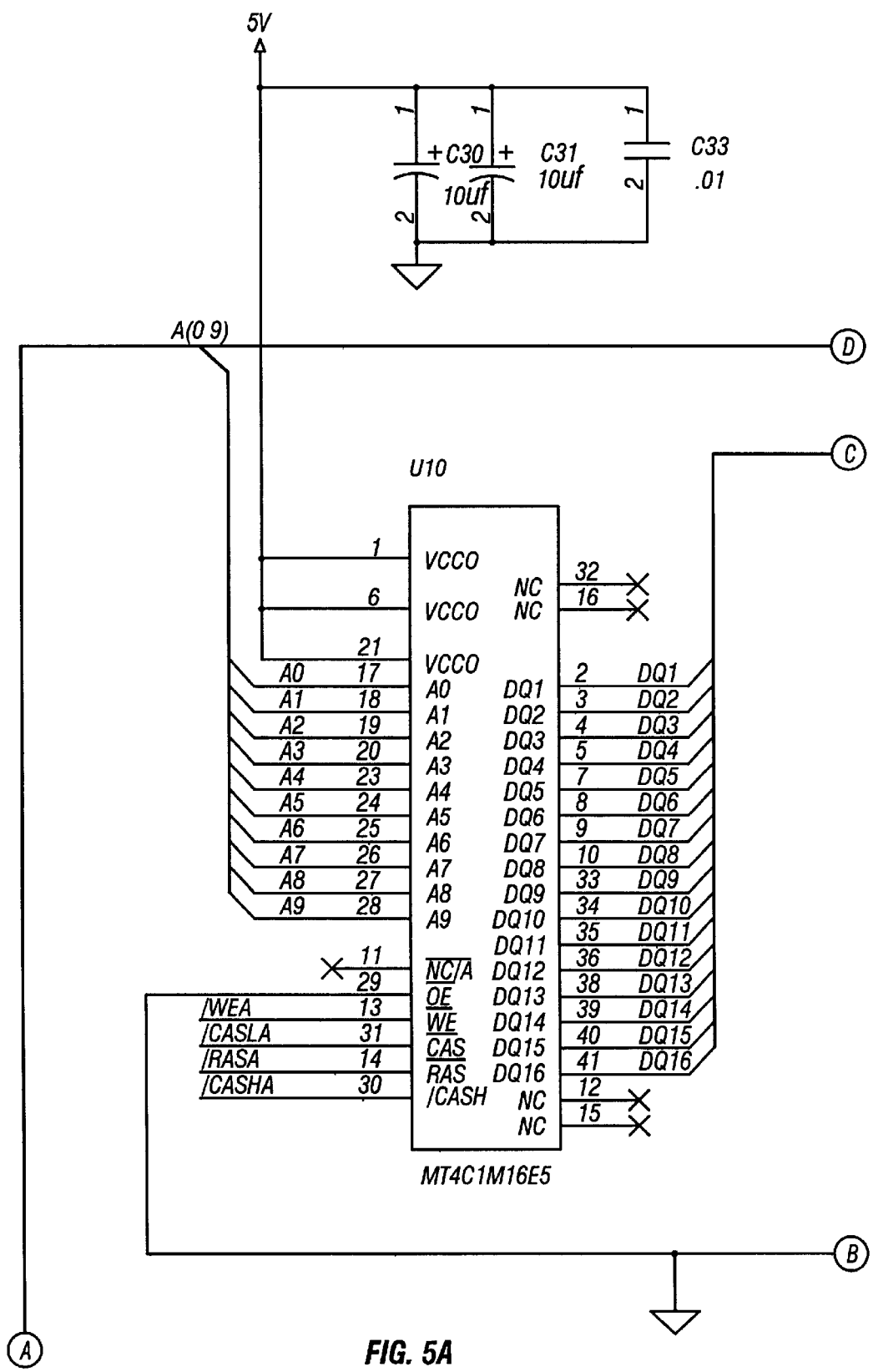
FIGS. 5A to 5P are is a schematic drawn in accordance with current industry standards and practices of one embodiment of a non-volatile memory system according to the invention.
Figure 5B:
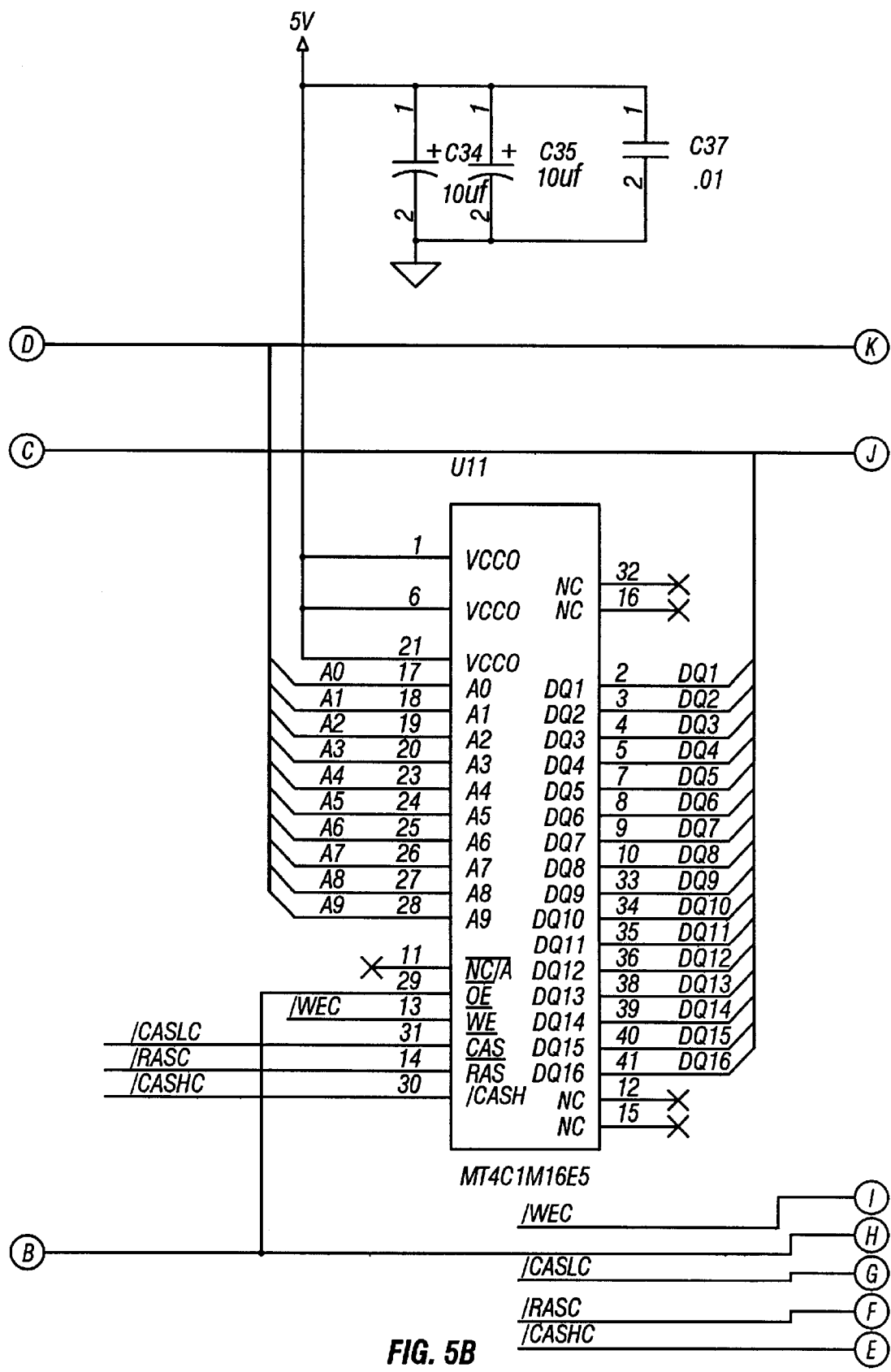
Figure 5C:
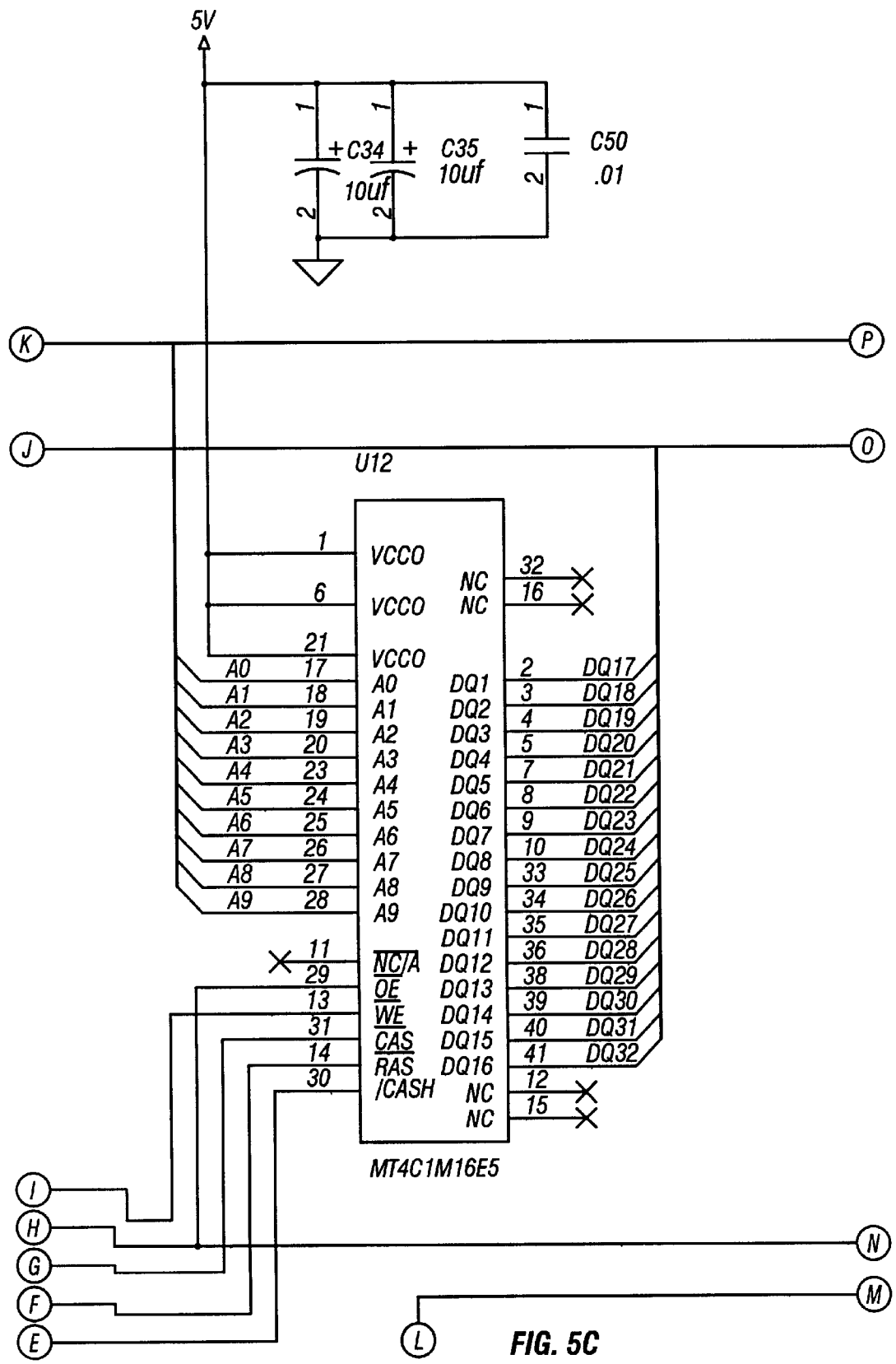
Figure 5D:
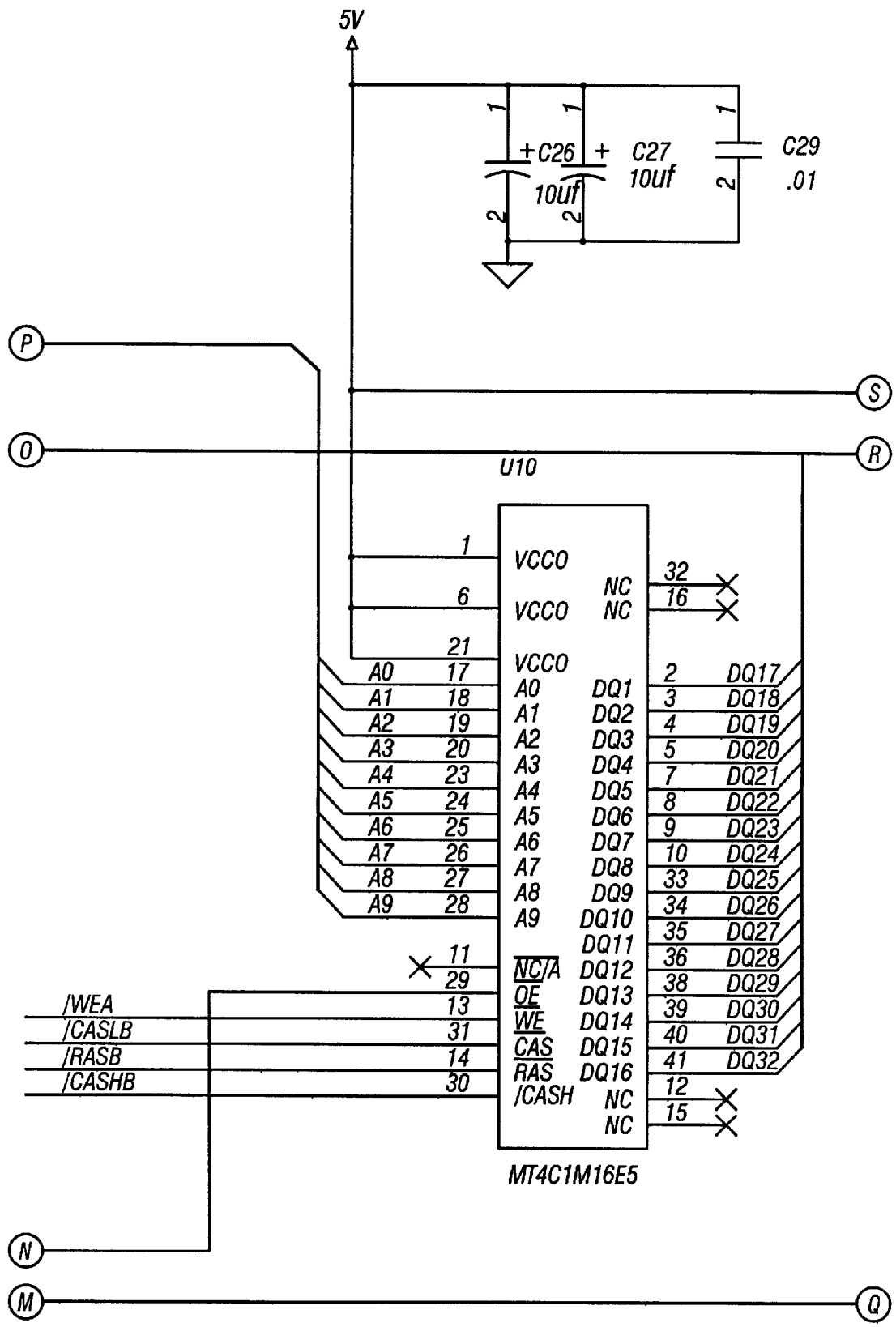
Figure 5E:
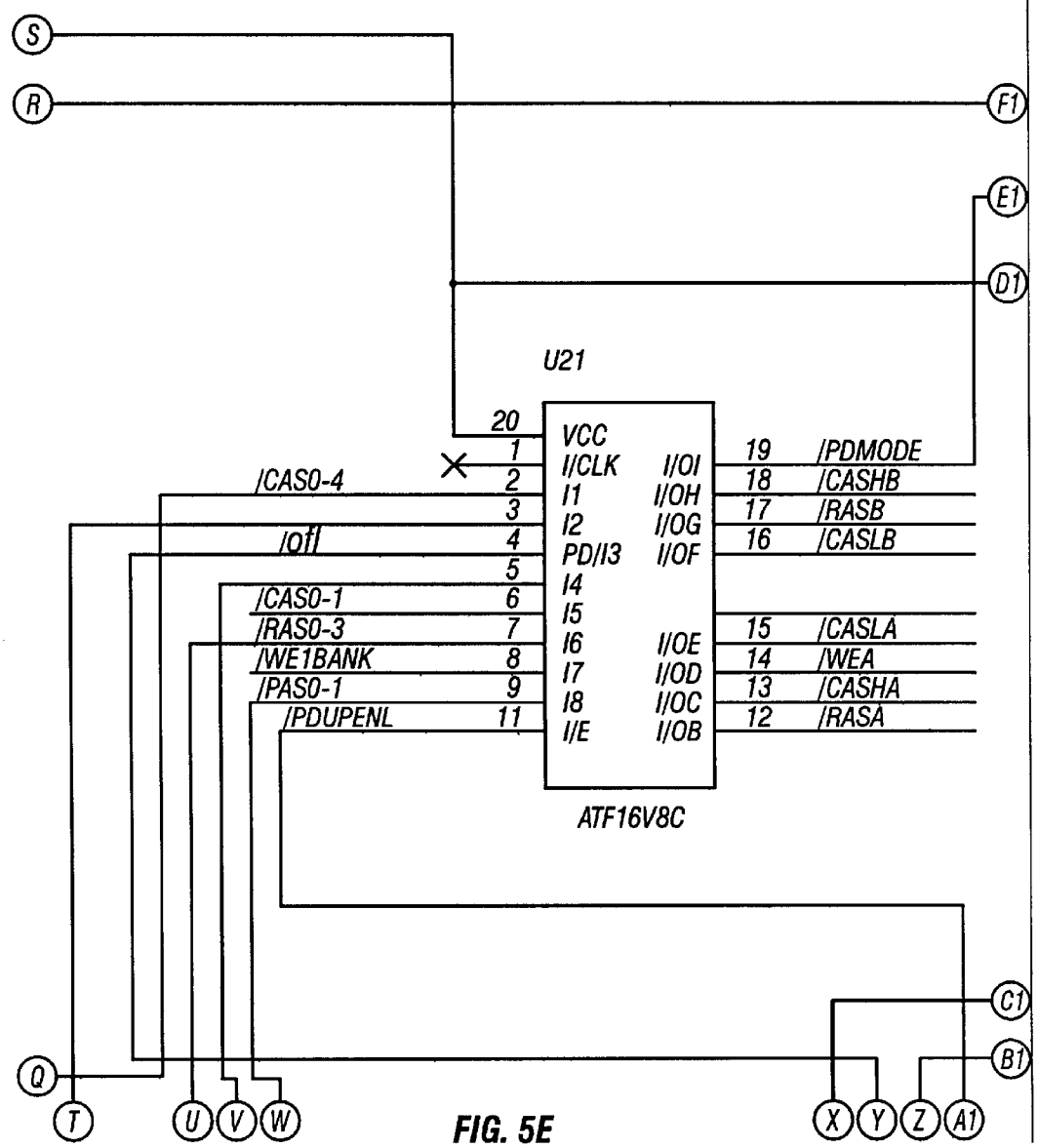
Figure 5F:
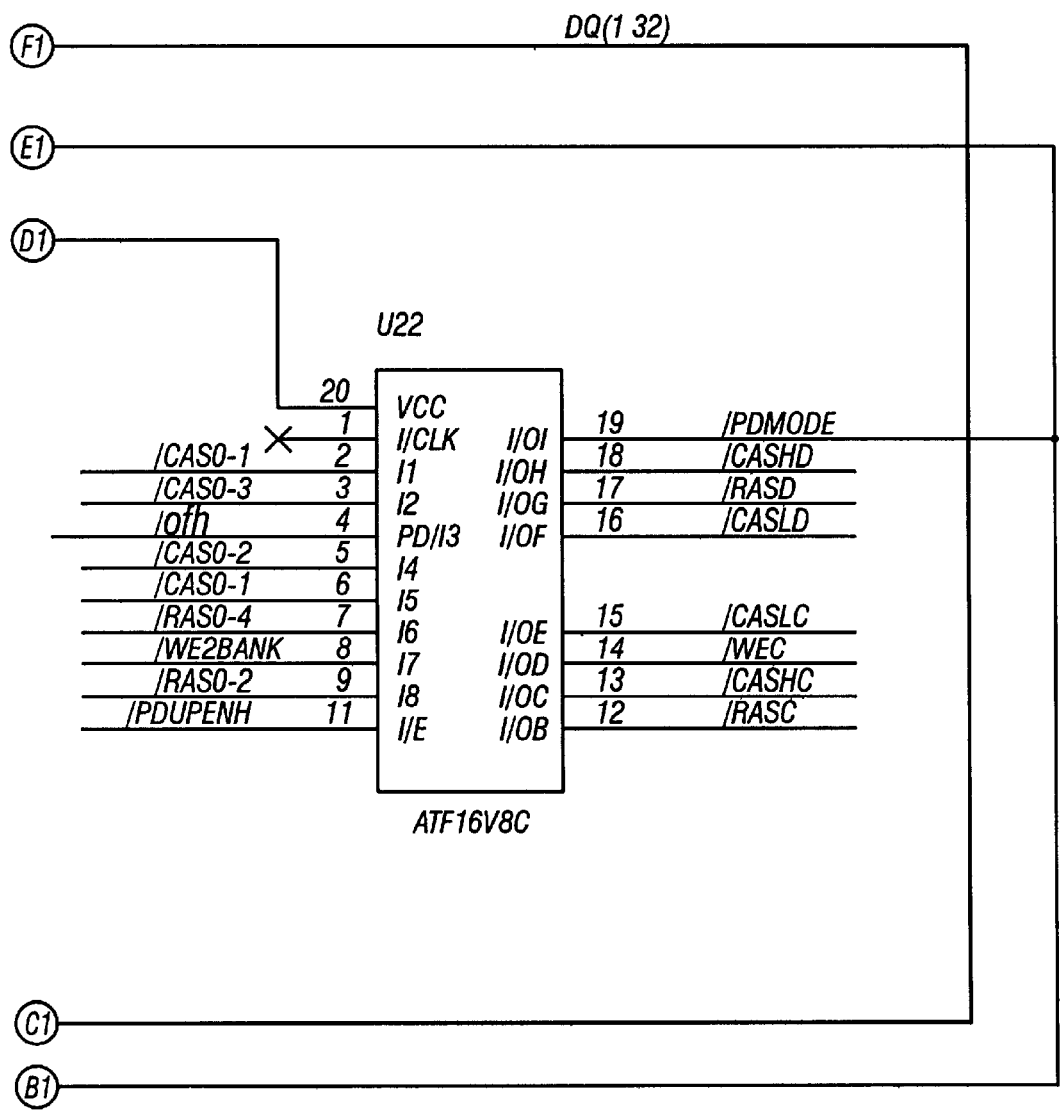
Figure 5G:
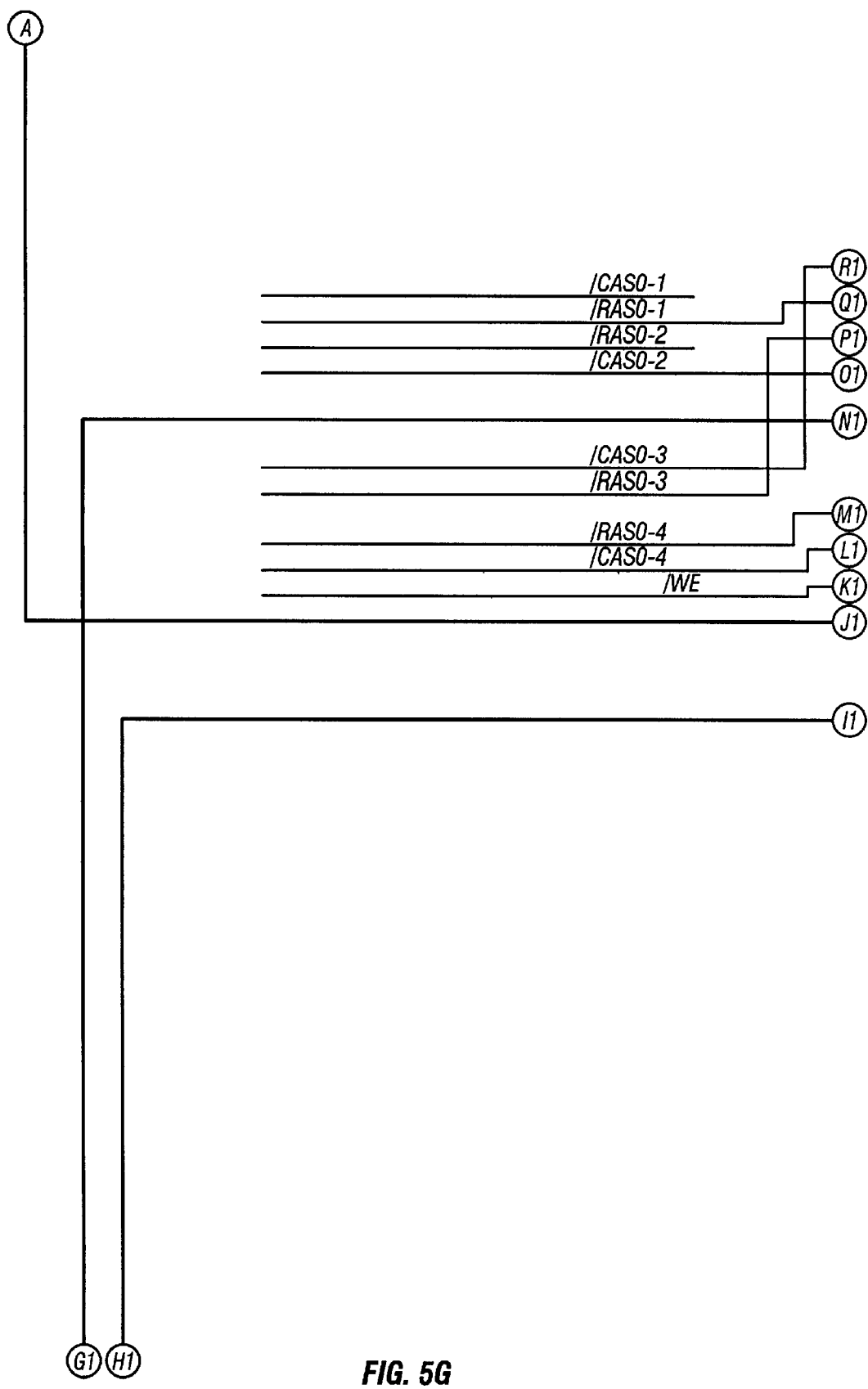
Figure 5H:
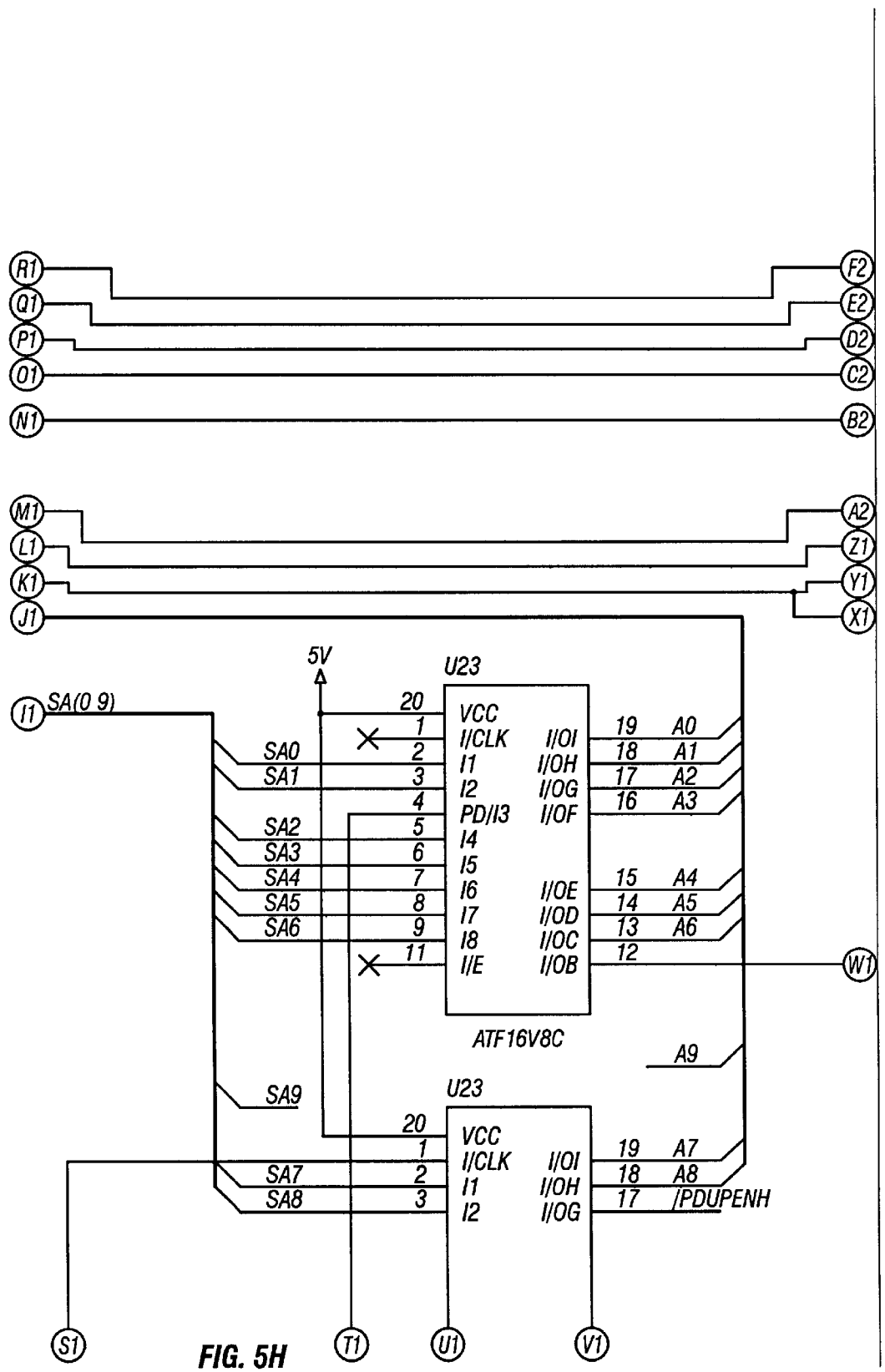
Figure 5I:
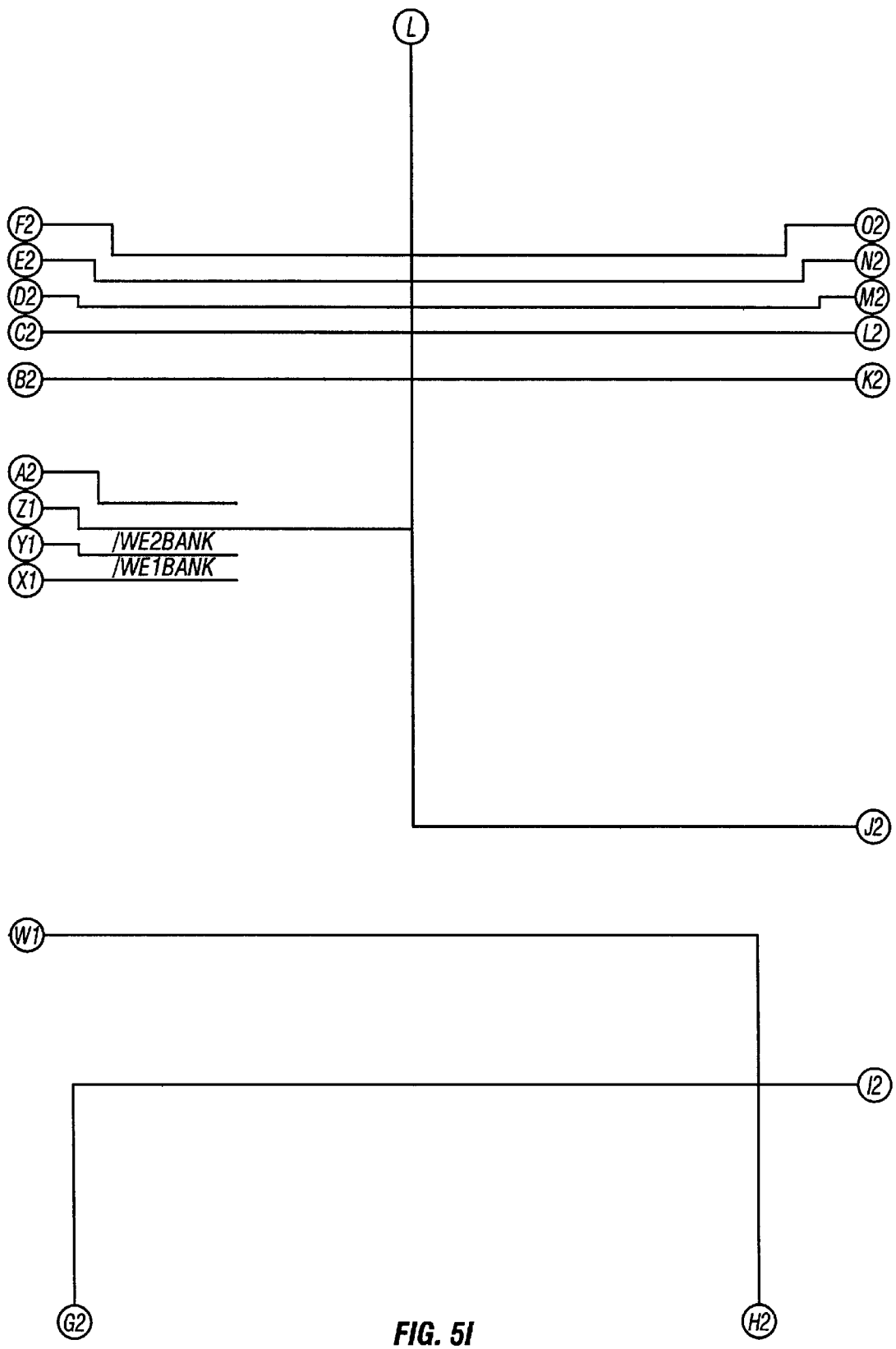
Figure 5J:
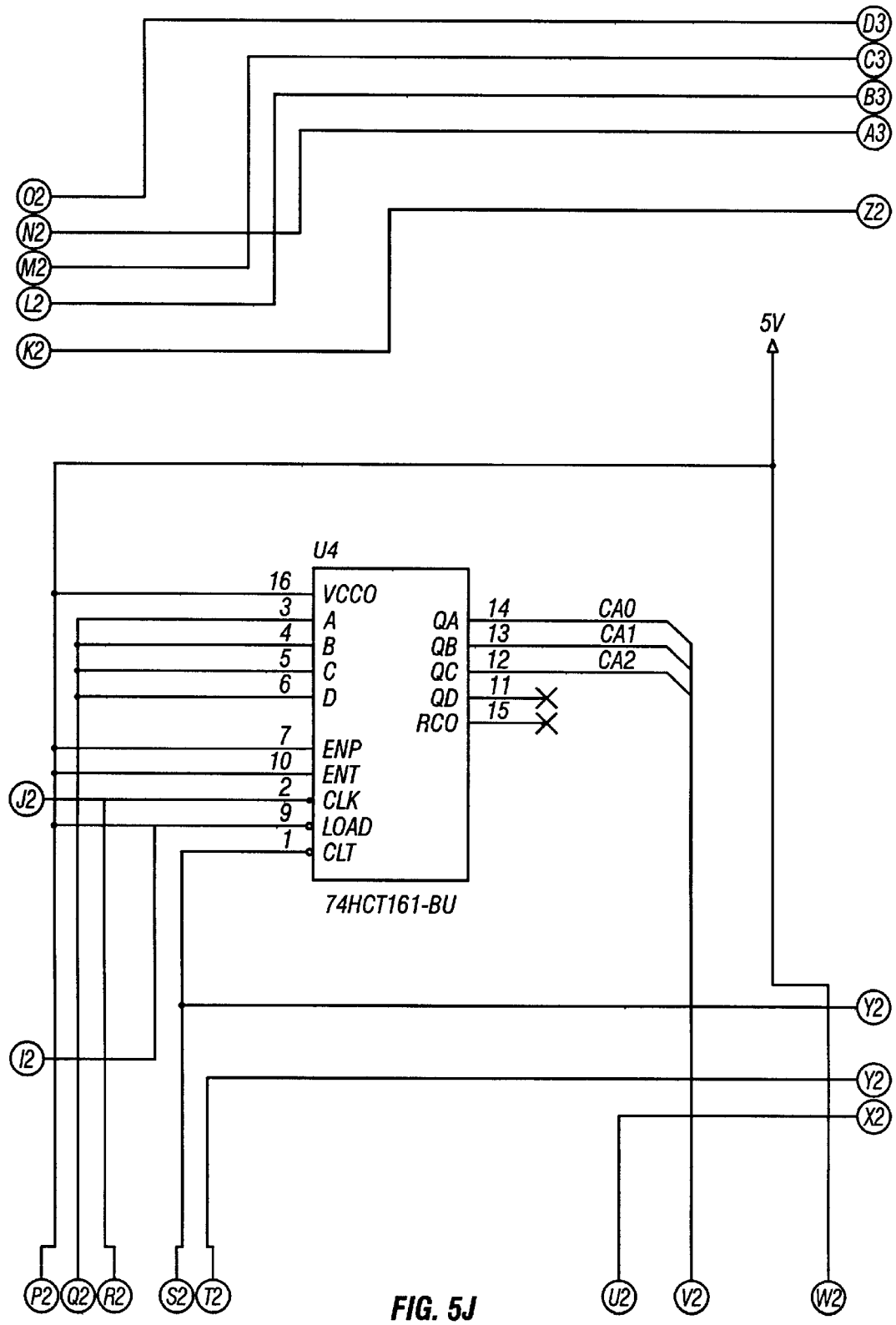
Figure 5K:
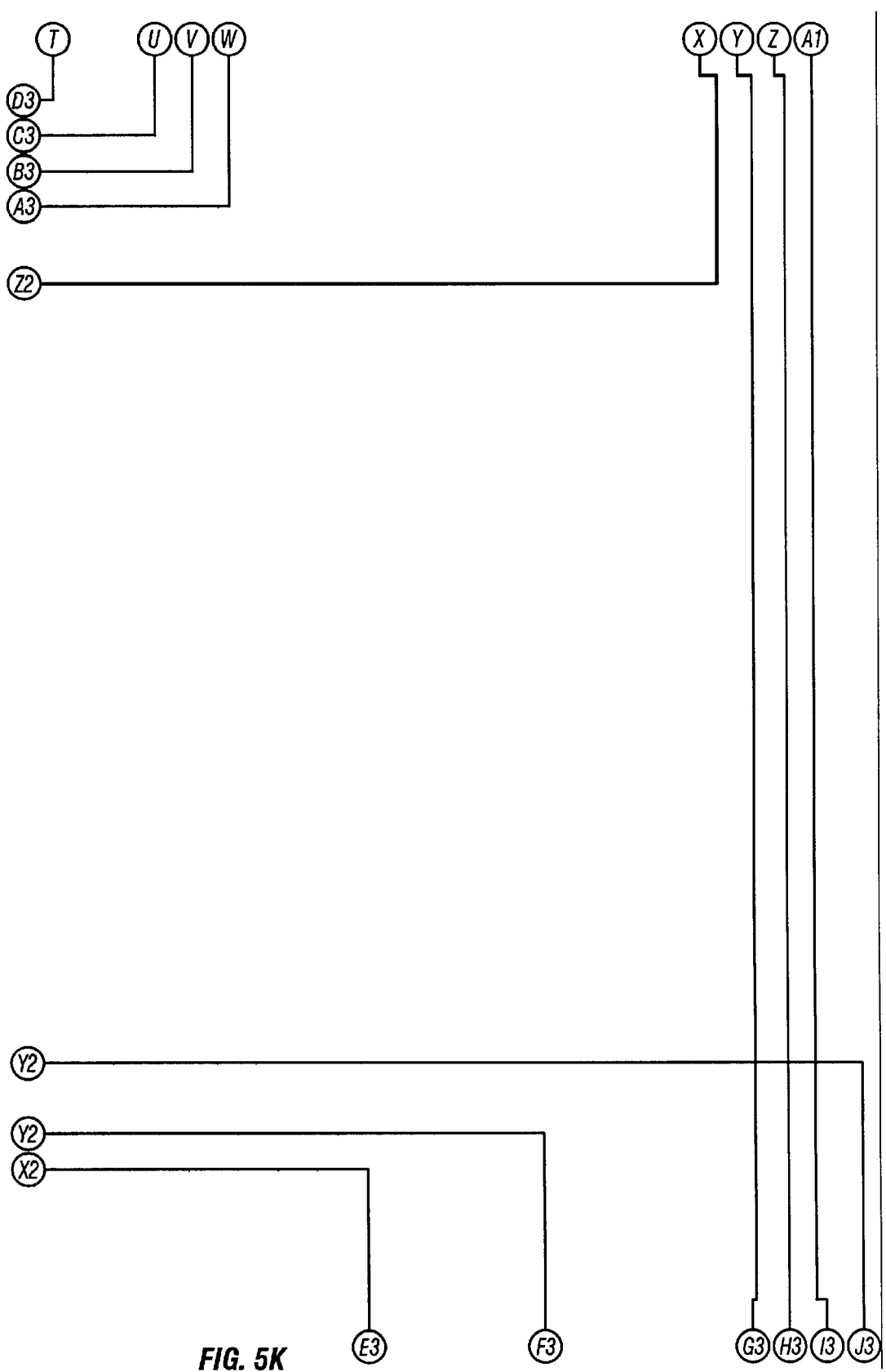
Figure 5M:
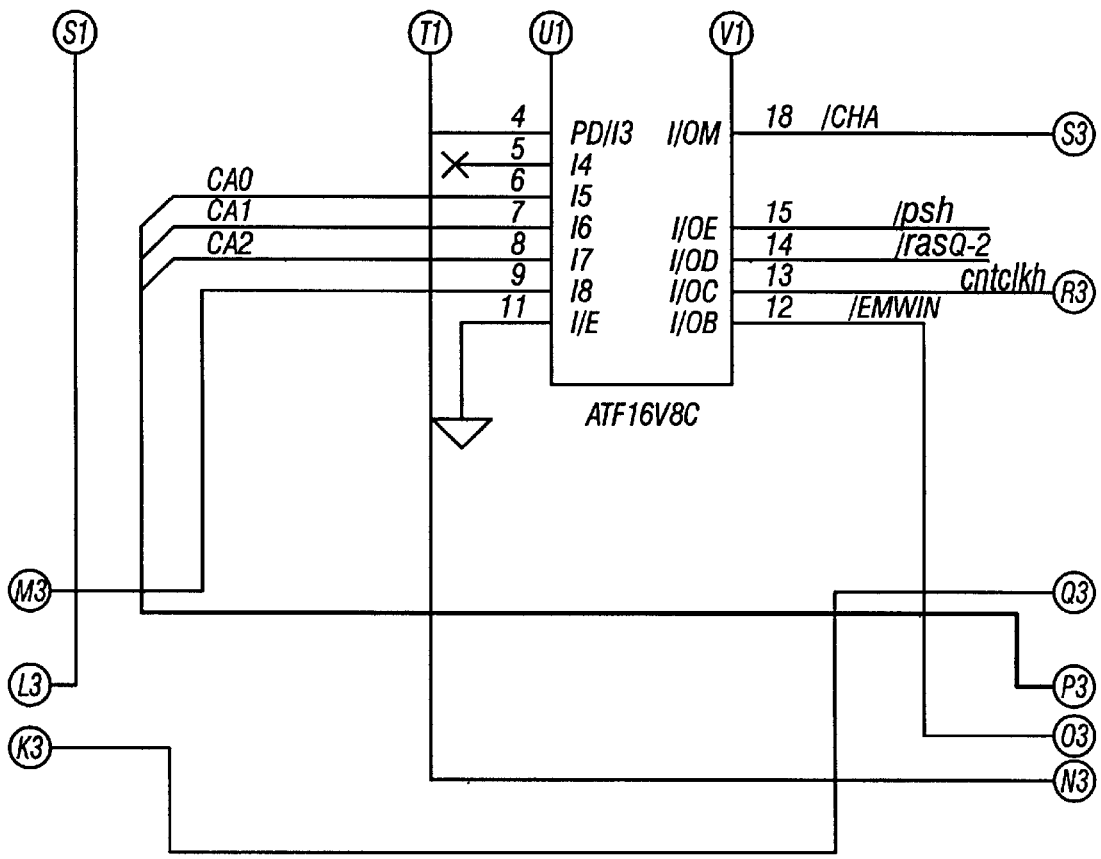
Figure 5N:
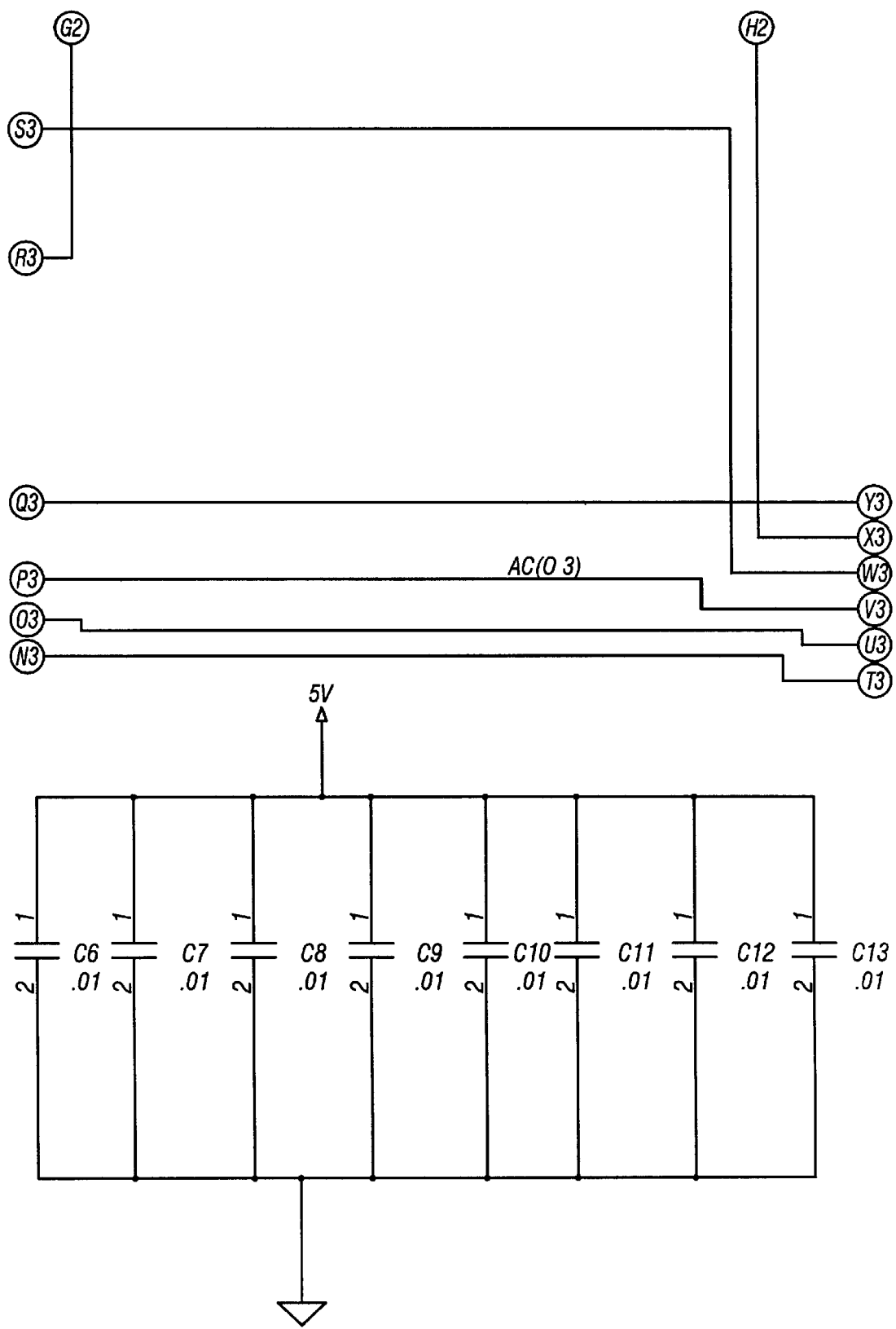
Figure 50:
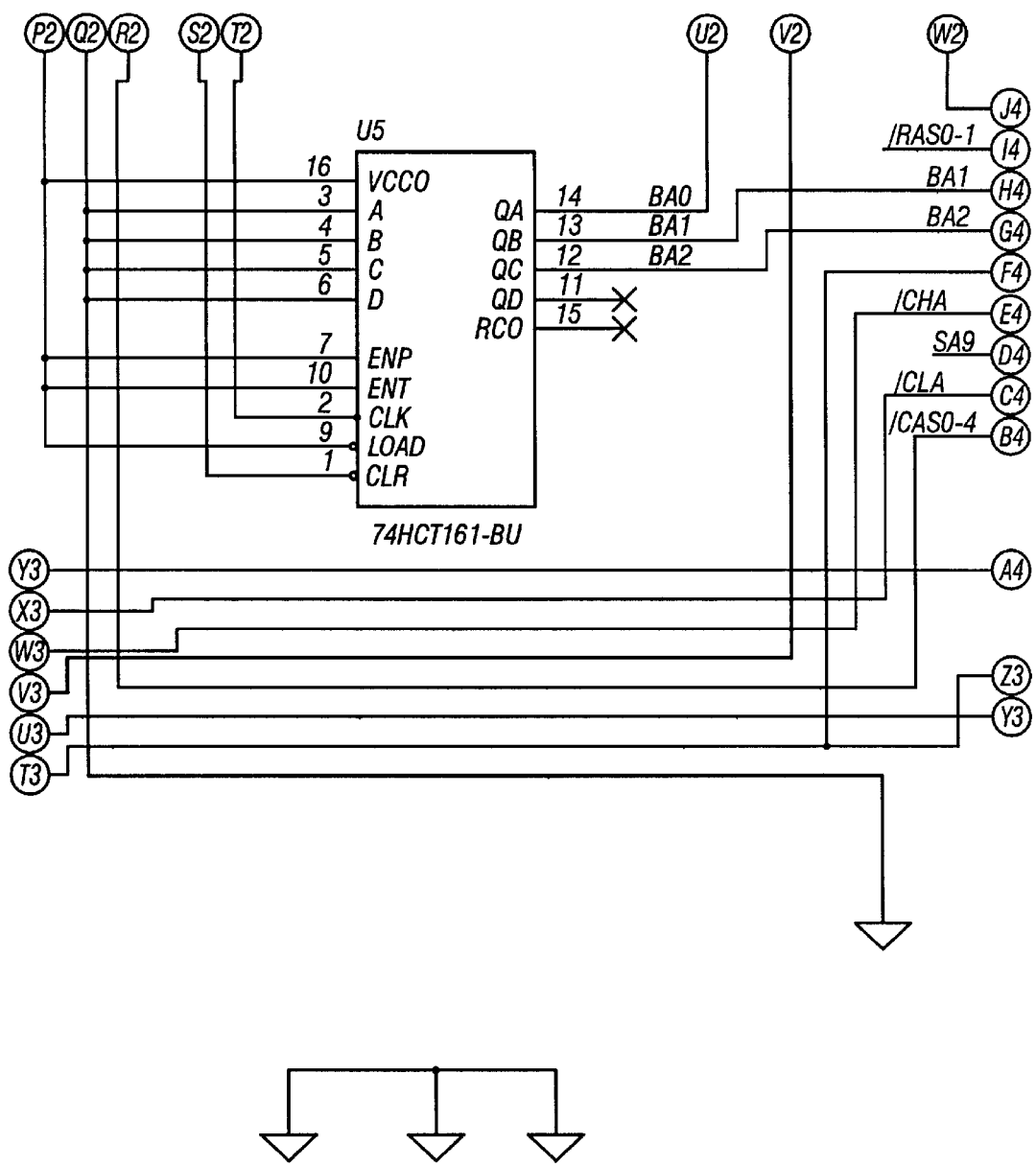
Figure 5P:
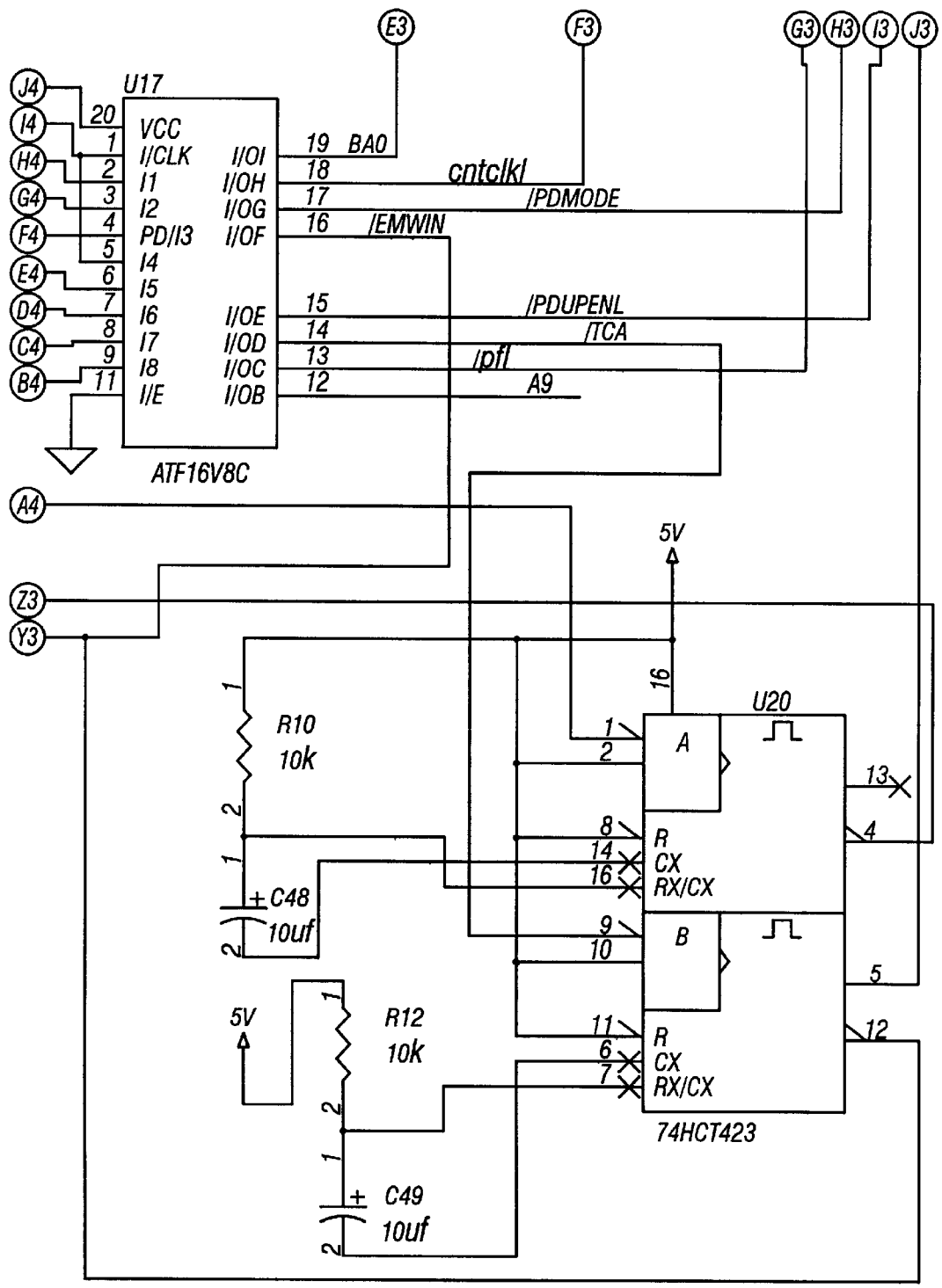

A typical Backup DRAM configuration is shown in the schematic in FIGS. 5A to 5P as drawn in accordance with current industry standards and practices. FIGS. 5a,b,c,d shows 4 DRAM's, organized on a Single In-line Memory Module (SIMM), 72 pin, configuration. In this configuration the use of semiconductor memory chips such as the Micron Technologies MT4C1M16E5, a 1Megx16, yields a 8 Megabyte(MB) SIMM. Each DRAM in the configuration has an input voltage line (VCCI), three control signals, /CAS, /RAS and /WE, and eleven address lines labeled A0–A10. The eleven address lines are used during READ or WRITE cycles, where each address bit is uniquely addressed, eleven bits at time, through the total of twenty two bits . The sequence of addressing is controlled by first setting /RAS to latch the first 11 bits and than setting /CAS to latch the latter 11 bits. A logic HIGH on /WE dictates the READ from memory mode while a logic LOW on /WE dictates the WRITE to memory mode.

Situated between the input voltage source and the 4 DRAMs, are four (4) DRAM Nonvolatizer Chips (DNC); such as the DS1237(S), where the system input voltage (VCC) and control signals (/RAS, /CAS and /WE) are inputs to the DS1237s on pins VCCI and /RASI, /CASI and /WEI respectively. The outputs of the DS1237s are VCCO are /RASO, /CASO and /WEO, which are inputs to the respective DRAM chip. The DNC chip monitors the input voltage level by comparing the input voltage level against a fixed reference voltage on pin TOL. The fixed reference level on pin TOL being established by a charge capacitor bank or zener diode. When the input voltage level is less than the fixed reference level, switch, SW1, changes position so that the backup supply voltage source(s), BT1–BT4, supply voltage to the DNC on pin BKUP and provides this backup voltage on pin VCCO. The DNC further electrically isolates the DRAMs from the system control signals (/RAS and /CAS) by inhibiting any responses on /RASO and /CASO. This backup supply voltage source in the preferred embodiment is a battery but could be other sources of backup supply voltage, such as charged capacitors or photoelectric cells.

The DNCs, during this backup mode of operation, supplies the timing signals necessary to provide the backup voltage to the DRAM at a fixed rate (the refresh rate) to maintain the contents of the DRAM memory. When the external voltage supply(VCC) is detected as having a level that exceeds the pre-determined level on pin TOL, the DNC initiates a highly structured serial sequence on Address lines A0,A1 and A2. The pre-determined voltage level used to determine when the external voltage supply has returned is maintained on a charged capacitor backup and is always present on the TOL Pin of the DNC. The highly structured command sequence is stored in a non-volatile memory (EPROM); such as ATMEL ATF 16V8C, and is clocked into the DNC through Binary counters; such as Philips 74HCT 161, when the DNC enables the address counters supplying the correct address to the EPROM. The EPROM address is incremented on the true edge of each /CAS cycle. After the 24th cycle is correctly entered, the DNC issues a final refresh burst and causes switch SW1 to return to is original position, removing the backup voltage from pin BKUP, restoring the supply voltage, VCC, to pin VCCI and enabling the memory control lines, /RASO, /CASO and /WEO.

FIGS. 6A-1 to 6A-11 are a schematic drawn to current industry standards and practices of another embodiment of a 32 MB low power down 144 PIN SIMM according to the invention. A typical configuration of an embodiment according to the invention is shown in the schematic in FIGS. 6A-1 to 6A-11, where a control device is interposed between the CPU and the volatile solid state memory devices. The logic for the Xilinx XC9572XL-7-VQ64 is shown in FIGS. 6B-1 to 6B-5. The schematics are drawn to current industry standards and practices. The memory system shown in FIGS. 6A and 6B-1 to 6B-5 use, but are not limited to, four 64M EDO (Extended Data Out) DRAM (Dynamic Random Access Memory). Typical memory chips used are the Hitachi HM5165165, 64M EDO DRAM (4-Mwordx16-bit) 4k refresh 3.6 V 50 ns access time self-refresh mode (L-version) memory devices. See the HM5165165 specification which is hereby incorporated by reference.

Page 33 of the Hitachi HM5165165 specification shows the required timing constraints for self-refresh cycle (L-version). At tRASS>100 us, self-refresh mode is activated, and not activated at tRASS<10 us. It is undefined within the range of 10 us<=tRASS<=100 us. For tRASS>=10 us, it is necessary to satisfy tRPS. The timing diagram is reproduced as FIG. 2.

Non memory access to U5 (Xilinx XC9572XL-7-VQ64) allows deep sleep mode to occur automatically. To power up the SODIMM from a deep sleep mode Pin 33 (/WE) and Pin 50 (/Ras01) of U5 must be driven active low. Signals /we and /ras0–1 are ORed together U5-u1 to create WINSTART (U5 Pin 15) that is used to trigger U20 Pin 1.

U20 (retriggerable one shot) uses C48 (22 uf) and R11 (10k) for defining the output pulse width on pin 4. This will cause the output pulse on pin 4 to be wider than the output pulse on U20 pin 12 (/EMWIN). U20 (retriggerable one shot) uses C49 (10 uf) and R12 (10k)) for defining the output pulse width on pin 12. /EMWIN can be triggered while /pf is active low true. The negative edge of the FIRST window is used for bringing the memory to a state of operation mode and a SECOND window within the FIRST window is used for accessing DRAM memory locations.

U5 pin 50- /Ras01, U5 pin 33- /WE and U5 pin 60-/PF are use to create U5 pin 19-TCA. /TCA is connected to U20 pin 8 and causes the retrigerable one shot to fire that creates /EMWIN (The memory access window).

The memory access and power up and power down features are as follows: U5 sa0, sa1, sa2, sa3, sa4, sa5, sa6, sa7, sa8, sa9, sa10, sa11, /Ras01, /Cas0, /Cas1, /Cas2, /Cas3, /Cas4, /Cas5, /Cas6, /Cas7, /WE are provided by J1 connector pin 29, pin 30, pin 31, pin 32, pin 33, pin 34, pin 103, pin 104, pin 105, pin109, pin 111, pin 106, pin 69, pin23, pin 25, pin 115, pin 117, pin 24, pin 26, pin 116, pin 118, and pin 67 respectively. U5 provides buffering for 12 address lines, 8 cas lines, 1 ras line and 1 write enable line. The lines are a0, sa1, sa2, sa3, sa4, sa5, sa6, sa7, sa8, sa9, sa10, sa11, /Cas0, /Cas1, /Cas2, /Cas3, /Cas4, /Cas5, /Cas6, /Cas7, /Ras01 and /WE. U5 a11, a10, a9, a8, a7, a6, a5, a4, a3, a2, a1 and a0 are buffer out of U5 pins 4, 1, 32, 38, 42, 35, 50, 39, 25, 34, 22., and 63 respectively and go to memory devices U10, U11, U12 and U13 as shown in FIG. 6a.

The following sequence causes the memory devices to come out of self refresh mode: Emwin is provided by U20 Pin 12 and goes to U5 Pin 64. /Ras01 is provided by J1 connector pin 69, and is provided as an input to U5 pin 50. Pwupenh is generated by a counter that provides the required TRPS coming out of self refresh mode see FIG. 2. The counter increments and creates the output signals ca and /ca1 and ca and /ca1 for two memory cycles. Cntclkh is generated by cycling /WE, /Ras01, /EMWIN being true and ca0 and ca1 being true for three cycles. After the third cycle cntclkh will stop counting. Pwupenh goes to US-u16, U5-u18, U5-u19, U5-u15.

Pwupenh will stay true for two memory access before going not true (see U5-u39-ca0). Counter U5-u34 output ca0 is low and ca1 is low for the first memory access, U5-u41- ca0 is high and ca1 is low for second memory access. U5-u40 allows active true low gating for two memory accesses. Thus allowing U5-Pin 7 /CASBO4, U5-Pin 58 /CASBO5, U5-Pin 59 /CASBO6, U5-Pin 62 /CASBO7, and U5-Pin 10 /RASHBO to be driven high not true high (1)) allowing the memory device to come out of self refresh mode. If /pdmode is true and /pwupenh is not true, /CASBO4, /CASBO5, /CASBO6, /CASBO7, /RASHBO and /WE are driven individually low when driven by the bus allowing memory accesses to occur while /EMWIN is true.

/Pwupenl is generated by U5-u29 counter that provides the required TRPS coming out of self refresh mode. See FIG. 2. The counter increments and creates the output signals /ba and /ba1 and /ba and /ba1 for two memory cycles U5-u26, U5-u27 and U5-u28. Cntclkl is generated by cycling /we, /ras01, emwin being true and ba0 and ba1 being true for three cycles. After the third cycle cntclkl will stop counting. Pwupenl goes to U5-u6, U5-u7, U5-u10, U5-u11, U5-u2.

Pwupenl will stay true for two memory accesses before going not true, see U5-u26-ba0. Counter U5-u29 output ba0 is low and ba1 is low for the first memory access, U5-u27-ba0 is high and ba1 is low for second memory access and U5-u40 allows active true low gating for two memory accesses. Thus allowing U5 Pin 20 /CASBO0, U5 Pin 8 /CASBO1, U5 Pin 12 /CASBO2, U5 Pin 13 /CASBO3, and U5 Pin 11 /RASLBO to be driven high (not true high (1)) allowing the memory device to come out of self refresh mode. If pdmode is true and /pwupenl is not true, /CASBO0, /CASBO1, /CASBO2, /CASBO3, /Ras01, and /WE are driven individually low when driven by the bus allowing memory accesses to occur while /EMWIN is true.

The following causes the memory devices to go into self refresh mode: After memory accesses have ceased, the /EMWIN will go false high which is used by U5 to create cas__ras__ref__del signal.

If /EMWIN is not true then /CASBO0, /CASBO1, /CASBO2, /CASBO3, /CASBO4, /CASBO5, /CASBO6, /CASBO7 are driven low and /EMWIN is driven out of U5 pin 17 as cas__ras__ref__del and through U6A (OR gate) to U5 pin 61 /PDDEL. The OR gate adds delay prior to RASLBO and RASHBO being driven low. /CASBO0, /CASBO1, /CASBO2, /CASBO3, /CASBO4, /CASBO5, /CASBO6, /CASBO7, RASLBO, RASHBO will remain low until a valid memory cycle is created.

U25 provides the serial presence detect as describe in section 4.1.2.3-Appendix C: JEDEC Standard No. 21-C. Page 4.1.2.3-1

If the module is to be used as regular direct memory without power down feature, U5 can he programmed to allow addresses to be fed through to their respective locations.

FIGS. 6B-1 to 6B-5 is a schematic for the logic programming for the Xilinx XC9572XL-7-VQ64 as used in FIGS. 6A-1 to 6A-11. It is drawn to current industry standards and practices. The schematic details the programming logic that is used to program the Xilinx XC9572XL-7-VQ64.

FIG. 7a shows the dimensions and tolerances of the PCB of the schematic shown in FIGS. 6A-1 to 6A-11. Dimensioning and tolerancing conform to ASME y14.5M-1994. Tolerances on all dimensions +/−0.003. The card thickness applies across tabs and includes plating and/or metalization. The recommended plating for contact pads shall be electrolytic gold plating 0.78 micrometer min. over nickel plating 2 micrometer min.

Figure 7B:
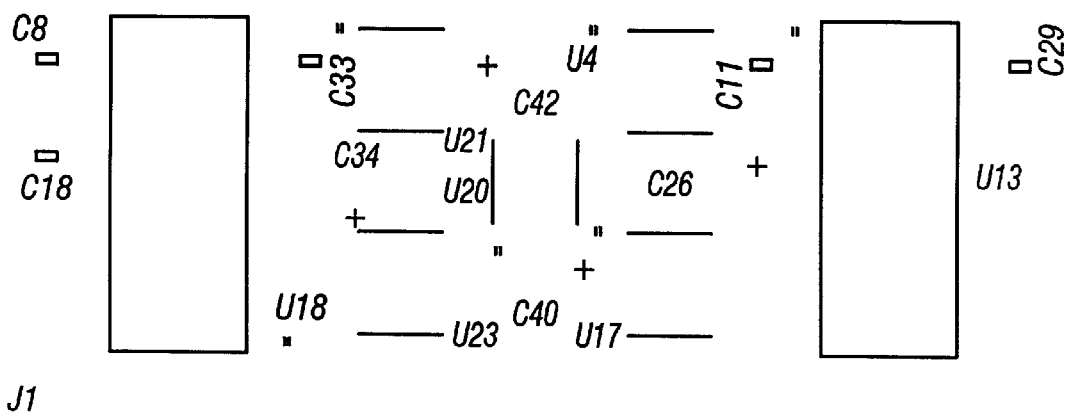
Figure 7C:
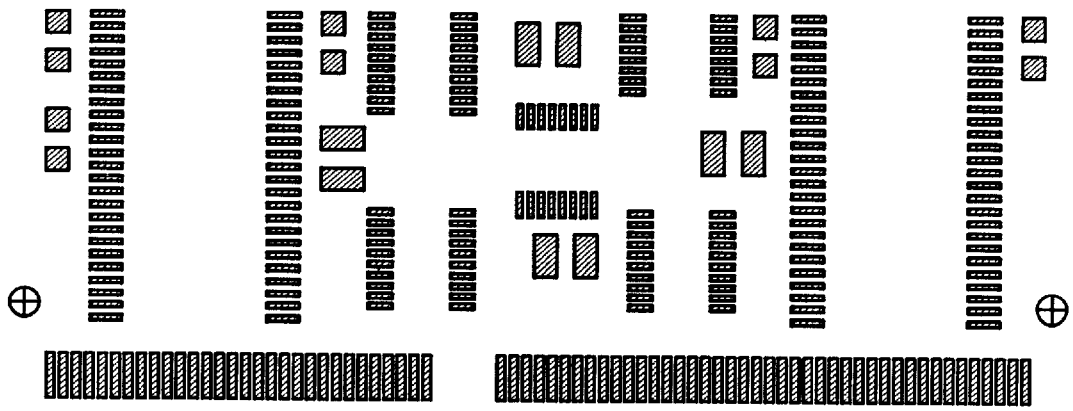
Figure 7D:
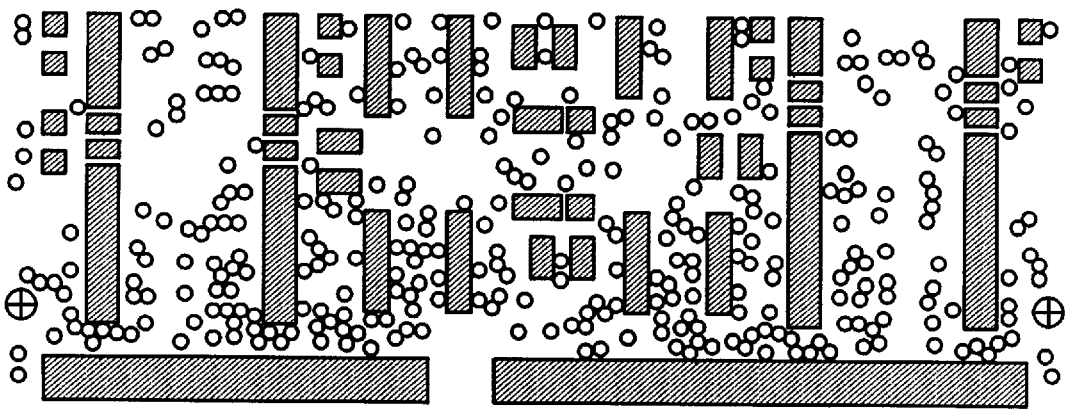
Figure 7E:
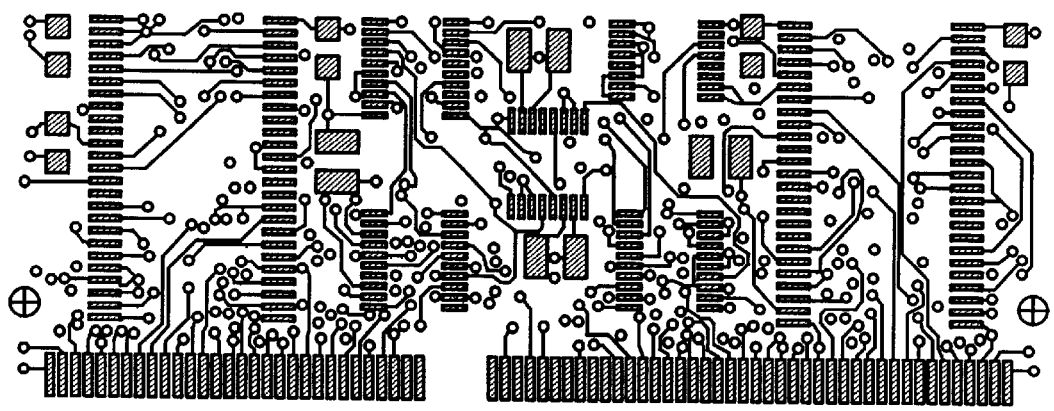
Figure 7F:
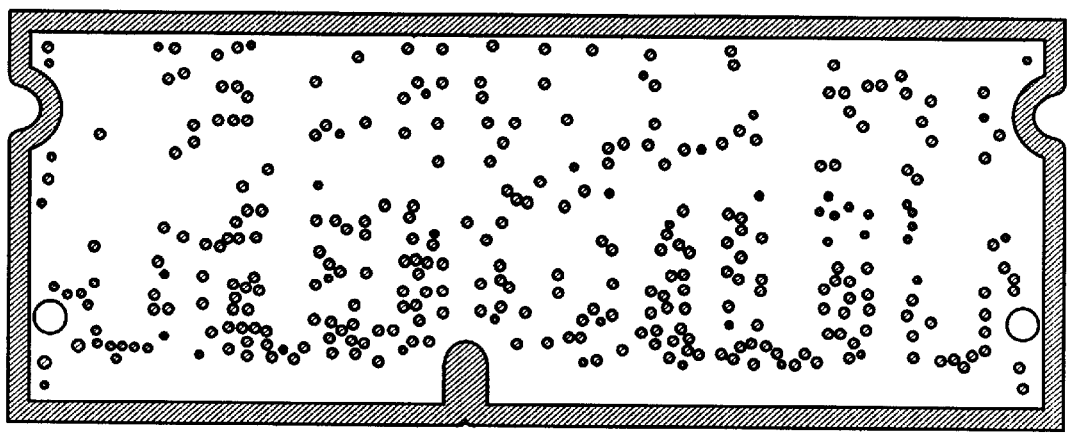
Figure 7G:
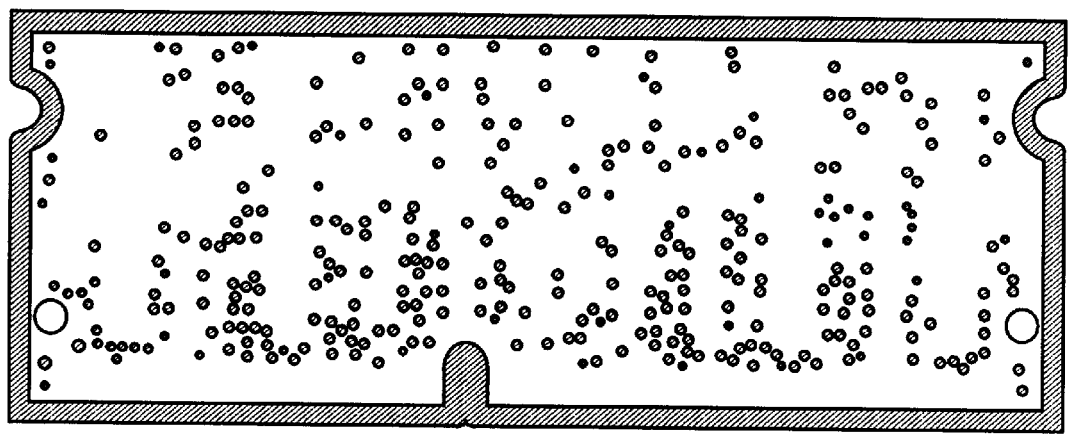
Figure 7H:
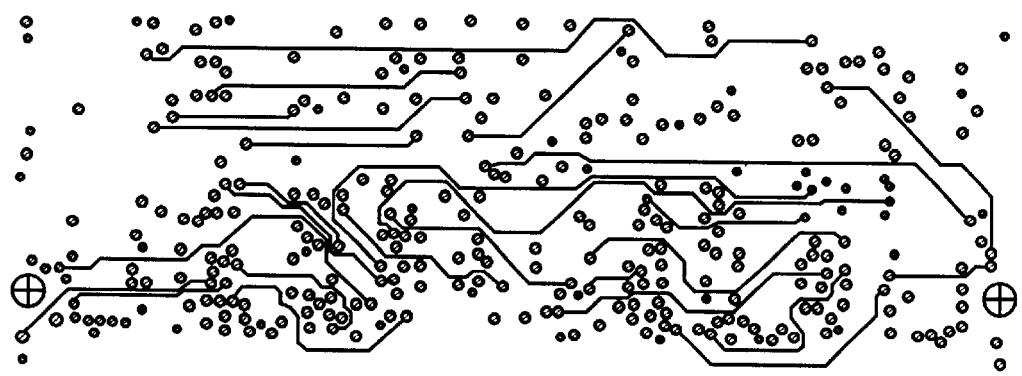
Figure 7I:
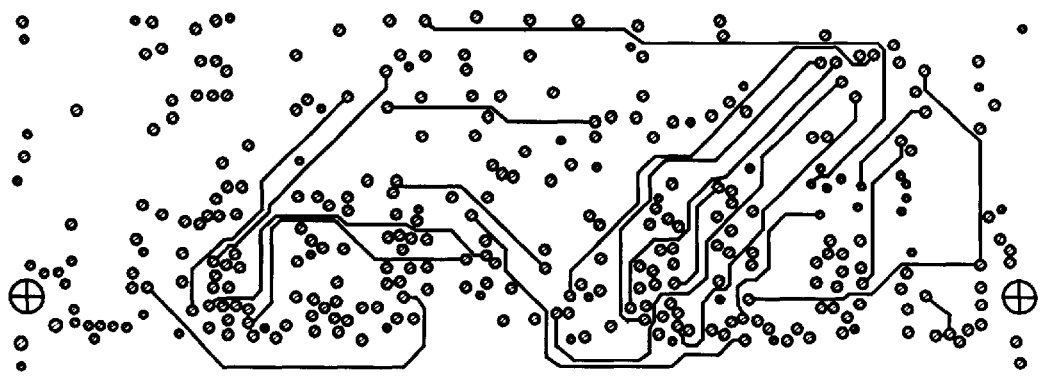
Figure 7J:
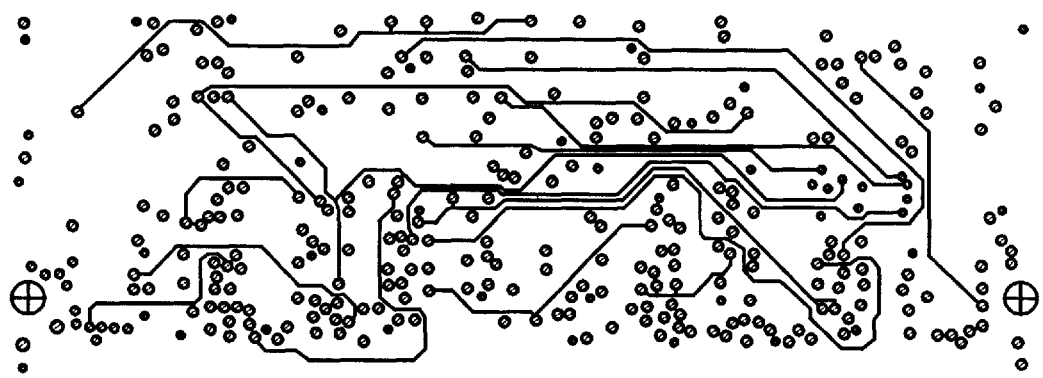
Figure 7K:
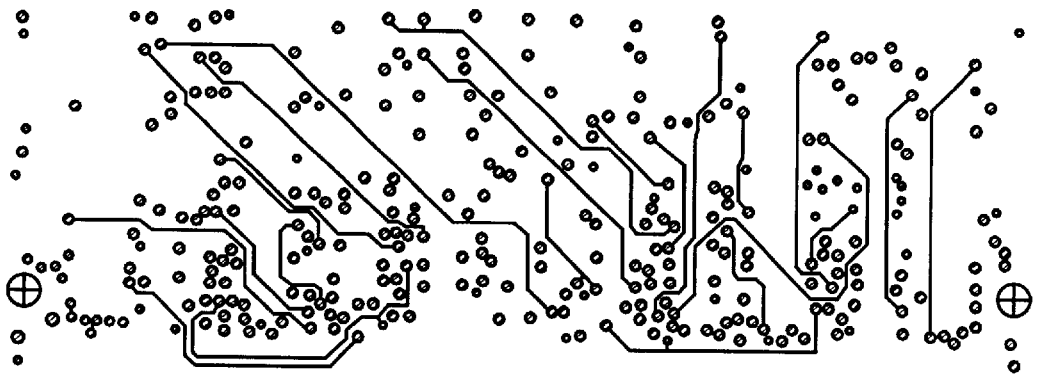
Figure 7L:
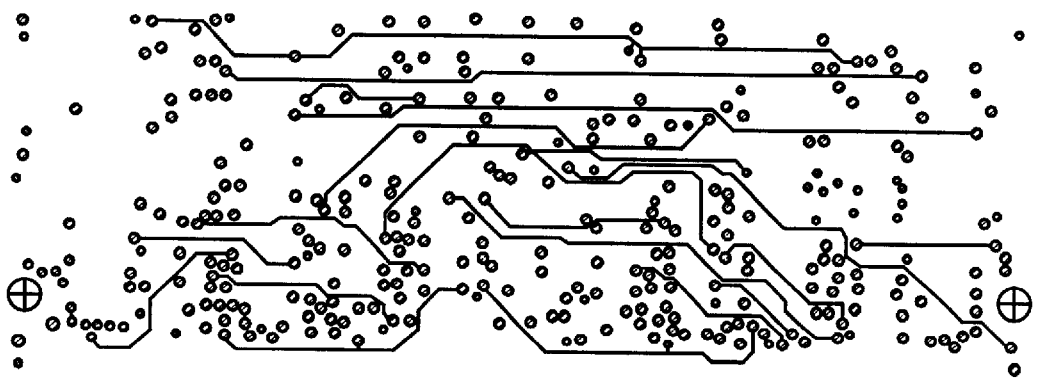
Figure 7M:
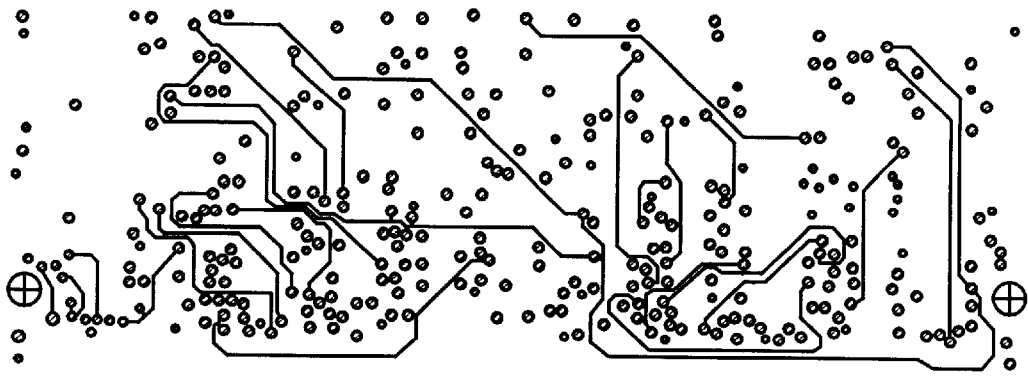
Figure 7N:
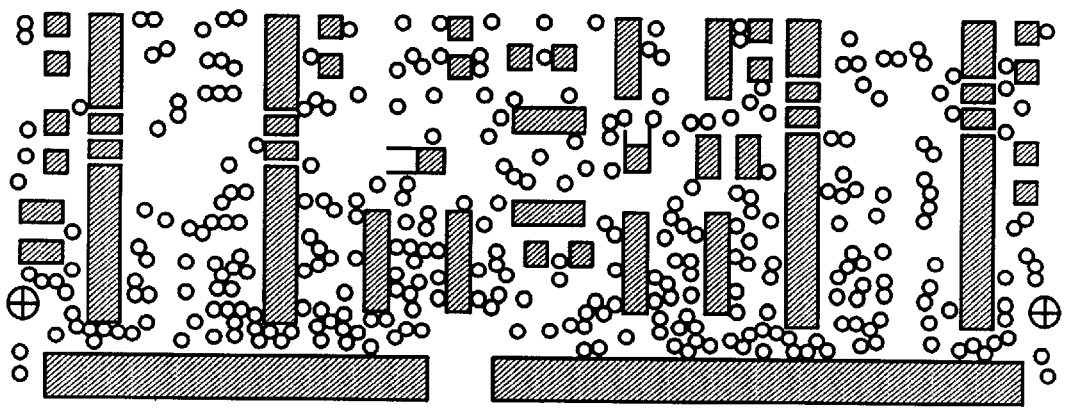
Figure 7O:
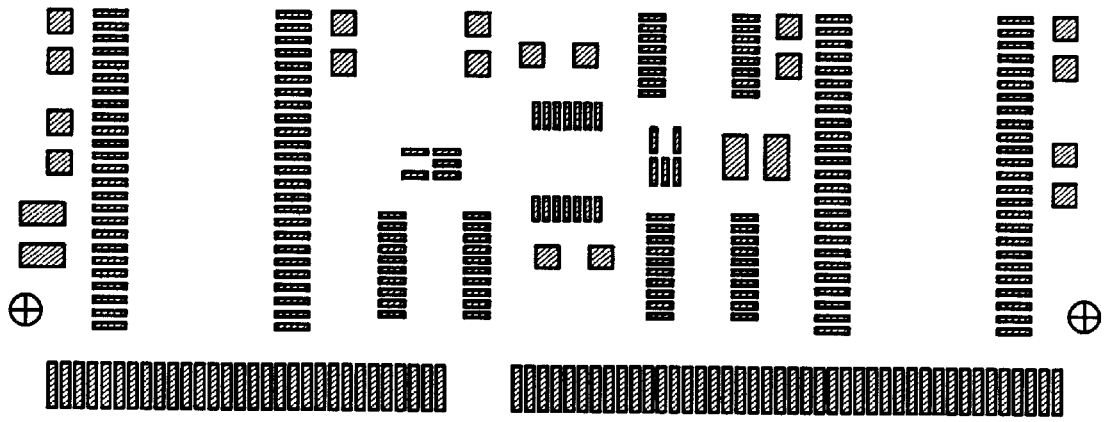
Figure 7P:
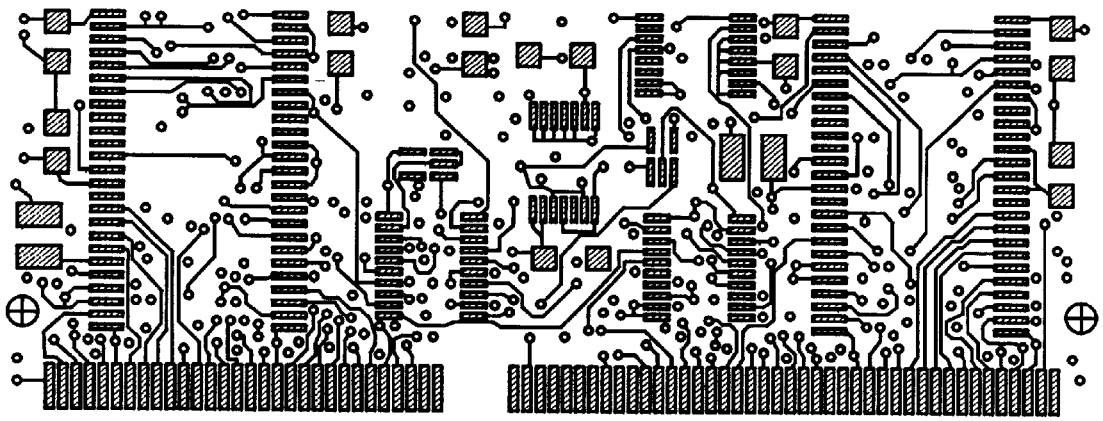
Figure 7Q:
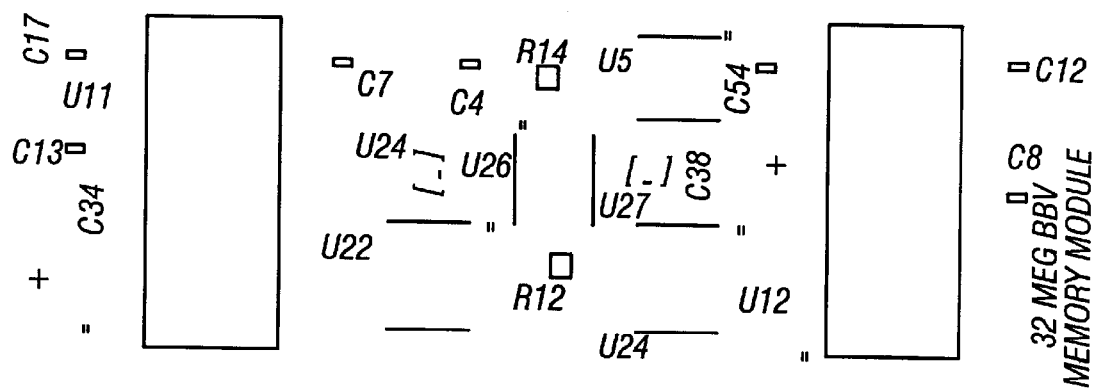

FIG. 7b shows artwork of the top silk of the PCB in accordance with the schematic shown in FIG. 3. FIG. 7c. shows artwork of the top paste of the PCB. FIG. 7d shows art work of the top mask of the PCB. FIG. 7e shows art work of the top layer of the PCB. FIG. 7f shows art work of the ground layer of the PCB. FIG. 7g shows art work of the power layer of the PCB. FIG. 7h shows art work of the mid1 layer of the PCB. FIG. 7i shows art work of the mid 2 layer of the PCB. FIG. 7j shows art work of the mid3 layer of the PCB. FIG. 7k shows art work of the mid 4 layer of the PCB. FIG. 7l shows art work of the mid 5 layer of the PCB. FIG. 7m shows art work of the mid 6 layer of the PCB. FIG. 7n shows art work of the bottom mask of the PCB. FIG. 7o shows art work of the bottom paste of the PCB. FIG. 7p shows art work of the bottom layer of the PCB. FIG. 7q shows art work of the bottom silk of the PCB.

There has been described a novel device and method. It is evident that those skilled in the art may now make numerous uses and modifications of and departures from the specific embodiments described herein without departing from the inventive concepts. Consequently, the invention is to be construed as embracing each and every feature and novel combination of features present or possessed by devices and methods herein described and limited solely by the spirit and scope of the appended claims.

What is claimed is:

1. A memory system for use in a computer system, said memory system comprising:
    a plurality of volatile solid state memory devices that retain information when an electrical power source is applied to said memory devices within a predetermined voltage range and capable of being placed in a self refresh mode; said memory devices having address lines and control lines;
    a control device for selectively electrically isolating said memory devices from respective address lines and respective control lines so that when said memory devices are electrically isolated, any signals received on said respective address lines and respective control lines do not reach said memory devices; and
    a memory access enable control device coupled to said control device and to said control lines for determining when said memory system is not being accessed and for initiating a low power mode for said memory system wherein said control device electrically isolates said memory devices and places said memory devices in said self refresh mode, thereby reducing the amount of electrical energy being drawn from an electrical power supply for said computer system.

2. The memory system as claimed in claim 1, wherein said system is compatible with the dimensions and pin assignments an JEDEC industry standard 144 PIN SODIMM connector.

3. The memory system as claimed in claim 1, wherein said system is compatible with the dimensions and pin assignments in accordance with JEDEC industry standard 168 PIN DIMM connector.

4. The memory system as claimed in claim 3, said memory system further comprising serial presence detect circuitry in accordance with the JEDEC industry standard.

5. The memory system as claimed in claim 1, wherein the memory devices are DRAM semiconductor microchips.

6. The memory system as claimed in claim 5, wherein said system is compatible with the dimensions and pin assignments in accordance with JEDEC industry standard 144 PIN SODIMM connector.

7. The memory system as claimed in claim 6, said memory system further comprising serial presence detect circuitry in accordance with the JEDEC industry standard.

8. The memory system as claimed in claim 5, wherein said system is compatible with the dimensions and pin assignments in accordance with JEDEC industry standard 168 PIN DIMM connector.

9. The memory system as claimed in claim 8, said memory system further comprising serial presence detect circuitry in accordance with the JEDEC industry standard.

10. A memory system for use in a computer system, said memory system comprising:
    a plurality of volatile solid state memory devices that retain information when an electrical power source having a voltage greater than a predetermined voltage is applied to said devices; said memory devices having address lines and control lines;
    said computer system including a first electrical power source for operating said computer and being capable of producing a first voltage applied to said memory devices;
    a control device for monitoring said first voltage to determine when said first voltage is less than said predetermined voltage and for selectively electrically isolating said memory devices from respective address lines and respective control lines so that when said memory devices are electrically isolated, any signals received on said respective address lines and respective control lines do not reach said memory devices; and
    a second electrical power source operable for supplying a second voltage to said memory devices greater than said predetermined voltage;
    said control device being operable for disconnecting said first electrical power source from said memory devices and connecting said second electrical power source to said memory devices when said first voltage is less than said predetermined voltage;
    whereby, data in said memory devices is preserved by said second electrical power source when said first electrical power source fails to maintain at least said predetermined voltage on said memory devices, and said memory devices are isolated from errant signals.

11. The memory system as claimed in claim 10, wherein said system is compatible with the dimensions and pin assignments in accordance with JEDEC industry standard 72 PIN SIMM connector.

12. The memory system as claimed in claim 10, wherein said system is compatible with the dimensions and pin assignments an JEDEC industry standard 144 PIN SODIMM connector.

13. The memory system as claimed in claim 12, said memory system further comprising serial presence detect circuitry in accordance with the JEDEC industry standard.

14. The memory system as claimed in claim 10, wherein said system is compatible with the dimensions and pin assignments an JEDEC industry standard 168 PIN DIMM connector.

15. The memory system as claimed in claim 14, said memory system further comprising serial presence detect circuitry in accordance with the JEDEC industry standard.

16. The memory system as claimed in claim 10, wherein said memory devices are DRAM semiconductor microchips.

17. The memory system as claimed in claim 16, wherein said system is compatible with the dimensions and pin assignments in accordance with JEDEC industry standard 144 PIN SODIMM connector.

18. The memory system as claimed in claim 16, wherein said system is compatible with the dimensions and pin assignments in accordance with JEDEC industry standard 72 PIN SIMM connector.

19. The memory system as claimed in claim 16, wherein said system is compatible with the dimensions and pin assignments in accordance with JEDEC industry standard 168 PIN DIMM connector.

20. The memory system as claimed in claim 19, said memory system further comprising serial presence detect circuitry in accordance with the JEDEC industry standard.

* * * * *

UNITED STATES PATENT AND TRADEMARK OFFICE
CERTIFICATE OF CORRECTION

PATENT NO.    : 6,243,315 B1
DATED         : June 5, 2001
INVENTOR(S)   : James B. Goodman It is certified that error appears in the above-identified patent and that said Letters Patent is hereby corrected as shown below:

Column 7,
Line 33, change "k)w" to -- low --;

Column 8,
Line 11, change "slay" to -- stay --.

Signed and Sealed this

Twenty-fourth Day of August, 2004

JON W. DUDAS
*Director of the United States Patent and Trademark Office*